United States Patent
Ishibashi et al.

(10) Patent No.: US 7,212,027 B2
(45) Date of Patent: May 1, 2007

(54) DISCONNECTION AND SHORT DETECTING CIRCUIT THAT CAN DETECT DISCONNECTION AND SHORT OF A SIGNAL LINE TRANSMITTING A DIFFERENTIAL CLOCK SIGNAL

(75) Inventors: Atsuhiko Ishibashi, Tokyo (JP); Yasuhiro Fujino, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 454 days.

(21) Appl. No.: 10/900,312

(22) Filed: Jul. 28, 2004

(65) Prior Publication Data
US 2005/0110526 A1    May 26, 2005

(30) Foreign Application Priority Data
Aug. 7, 2003    (JP)    ............................. 2003-289118

(51) Int. Cl.
*H03K 19/007*    (2006.01)
(52) U.S. Cl. .............................. 326/14; 326/9; 326/15; 326/16
(58) Field of Classification Search .................... 326/9, 326/14–16, 21, 30, 86, 90; 327/14, 18, 50, 327/65
See application file for complete search history.

(56) References Cited
U.S. PATENT DOCUMENTS
6,650,149 B1 *    11/2003    Wong ........................ 327/65

FOREIGN PATENT DOCUMENTS
| JP | 3-222552 | 10/1991 |
| JP | 6-85717 | 3/1994 |
| JP | 2003-143239 | 5/2000 |

* cited by examiner

*Primary Examiner*—Anh Q. Tran
(74) *Attorney, Agent, or Firm*—McDermott Will & Emery LLP

(57) ABSTRACT

Provided is a disconnection and short detecting circuit capable of detecting disconnection and short of a signal line transmitting a differential clock signal. A differential buffer part DB1 has a first comparator to compare a non-inverting clock signal inputted from a PADI and an inverting clock signal inputted from a PADR; a second comparator to compare a non-inverting clock signal and a reference potential Vref; and a third comparator to compare an inverting clock signal and the reference potential Vref. Their respective outputs are defined as Y, YI and YR, respectively. If the signal line of either a non-inverting clock signal or an inverting clock signal is disconnected, or short-circuited to a grounding potential VSS of a logical value Low, the logical values outputted from the second and the third comparators are equal for a long period of time in one cycle of the non-inverting clock signal or the inverting clock signal. Thereby, if a second D-flip-flop circuit F2a negates an output signal [CD], it is able to judge that disconnection or short occurs.

16 Claims, 43 Drawing Sheets

F I G. 5 0
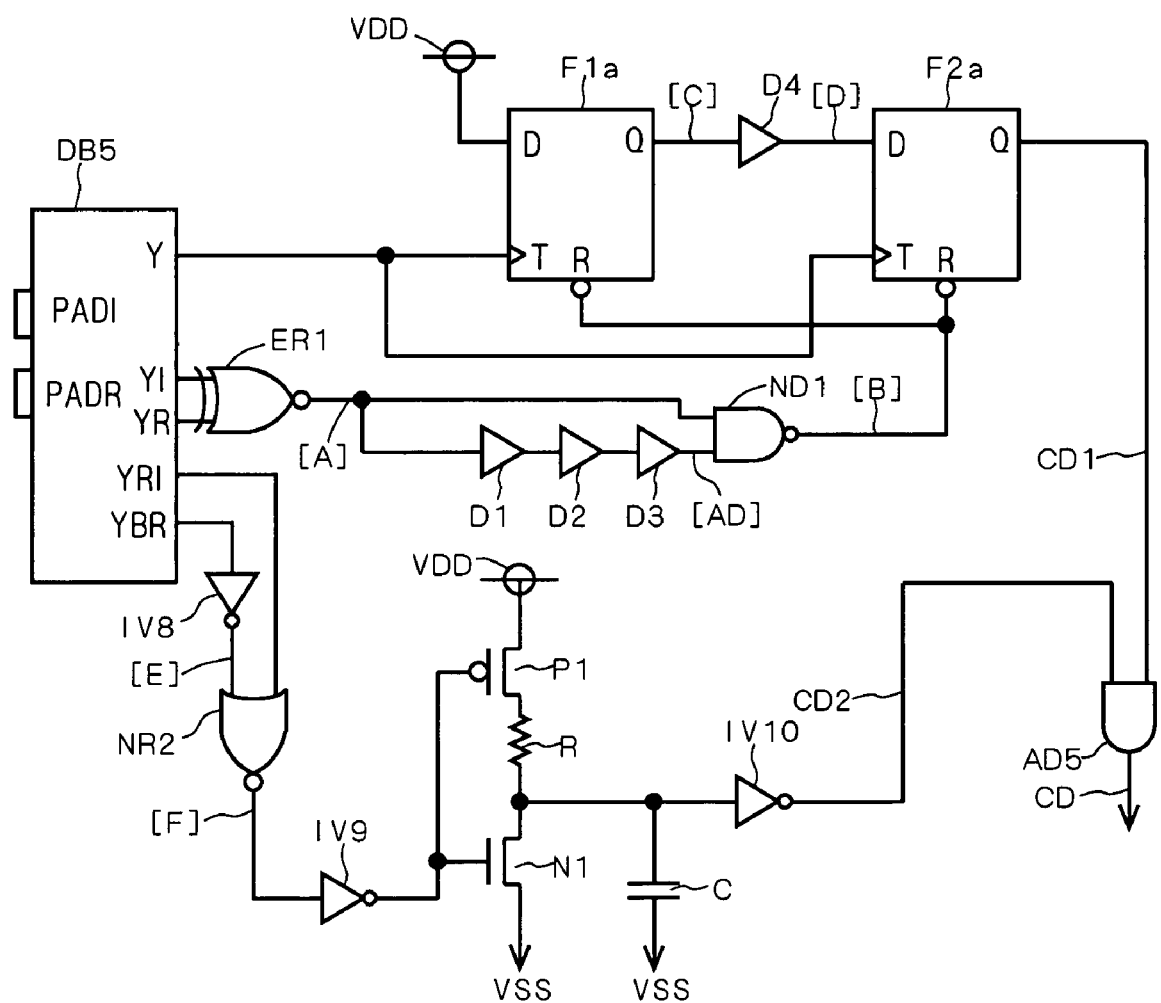

DISCONNECTION AND SHORT DETECTING CIRCUIT THAT CAN DETECT DISCONNECTION AND SHORT OF A SIGNAL LINE TRANSMITTING A DIFFERENTIAL CLOCK SIGNAL

BACKGROUND OF THE INVENTION

1. Field of the Invention

The present invention relates to a disconnection and short detecting circuit included in a semiconductor integrated circuit device.

2. Description of the Background Art

For example, in FIG. 1 of Japanese Patent Laid-Open Publication No. 2003-143239, a non-inverting clock signal and an inverting clock signal, which are in opposite phases, are inputted via a terminating resistor 21 to a non-inverting input terminal 24 and an inverting input terminal 25, respectively. The non-inverting and the inverting clock signals are then inputted to a positive (+) terminal and a negative (−) terminal of a comparator 23. Here, the comparator 23 functions as a receiver of a differential clock signal composed of a non-inverting clock signal and an inverting clock signal. The output of the comparator 23 is used for operating clocks within a semiconductor device, for example.

Besides the aforesaid Publication No. 2003-143239, Japanese Patent Laid-Open Publication No. 6-85717 discloses information related to the receiving of a differential clock signal.

The recent semiconductor integrated circuit devices often employ surface mount type packages such as quad flat package (QFP) and small outline package (SOP). Therefore, the pin pitch is narrowed to make it difficult to perform inspection with use of a conventional probe.

Hence, there has been employed boundary scan function based on the standard of joint test action group (JTAG), and the like. The term "boundary scan function" denotes the following test function. That is, a register, being called "cell," which performs operation equivalent to a test probe, is disposed between each pin and a core circuit in a semiconductor integrated circuit device, and respective cells are coupled to configure a shift register. This shift register is then controlled to detect the input of a test code to the core circuit and the corresponding response from the core circuit, thereby implementing the test function.

The boundary scan function, however, failed to detect disconnection and short of a signal line transmitting a differential clock signal.

SUMMARY OF THE INVENTION

Accordingly there is a need for providing a disconnection and short detecting circuit that can detect disconnection and short of a signal line transmitting a differential clock signal.

According to an aspect of the present invention, a disconnection and short detecting circuit includes a first clock input end, a second clock input end, a first terminating resistor, a second terminating resistor, a first comparator, a second comparator, a third comparator, a first signal output circuit, and a first flip-flop circuit. A non-inverting clock signal is inputted to the first clock input end. An inverting clock signal, the phase of which is the reverse of that of the non-inverting clock signal, is inputted to the second clock input end. The first terminating resistor has one end connected to the first clock input end, and the other end to which a first potential is applied. The second terminating resistor has one end connected to the second clock input end, and the other end to which the first potential is applied. The first comparator has a first signal input end connected to the first clock input end, and a second signal input end connected to the second clock input end. The first comparator compares the potentials at the first and the second signal input ends and, based on the comparison result, outputs a first logical value or a second logical value different from the first logical value. The second comparator has a first signal input end connected to the first clock input end, and a second signal input end to which a second potential is applied. The second comparators compares the potentials at the first and the second signal input ends and, based on the comparison result, outputs the first or the second logical value. The third comparator has a first signal input end connected to the second clock input end, and a second signal input end to which a third potential is applied. The third comparators compares the potentials at the first and the second signal input ends and, based on the comparison result, outputs the first or the second logical value. The first signal output circuit outputs a first signal if the logical values outputted from the second and the third comparators are equal for a predetermined period of time or more. The first flip-flop circuit has a clock input end for receiving the output of the first comparator, an input end to which a voltage signal corresponding to either the first or the second logical value is applied, another input end for receiving the first signal, and an output end for outputting an output signal. The first flip-flop circuit outputs, as the output signal, a signal corresponding to the voltage signal if transition in a predetermined direction occurs in the output of the first comparator received at the clock input end, and nullifies the output signal if received the first signal.

The first signal output circuit outputs a first signal if the logical values outputted from the second and the third comparators are equal for a predetermined period of time or more. If received the first signal, the first flip-flop circuit nullifies an output signal. If either of the signal line of a non-inverting clock signal or the signal line of an inverting clock signal is disconnected or short-circuited to the potential of a first or second logical value, the logical values outputted from the second and the third comparators are equal for a long period of time in one cycle of a non-inverting clock signal or an inverting clock signal. Therefore, when the first flip-flop circuit nullifies an output signal, it can be judged that disconnection or short occurs. This permits more reliable detection of disconnection and short of the signal line of a differential clock signal, which could not be achieved only by comparing the potentials of a non-inverting clock signal and an inverting clock signal.

These and other objects, features, aspects and advantages of the present invention will become more apparent from the following detailed description of the present invention when taken in conjunction with the accompanying drawings.

BRIEF DESCRIPTION OF THE DRAWINGS

FIG. 50 is a diagram showing a disconnection and short detecting circuit according to a fourteenth preferred embodiment of the present invention;

DESCRIPTION OF THE PREFERRED EMBODIMENTS

First Preferred Embodiment

A first preferred embodiment is directed to a disconnection and short detecting circuit that more reliably detects disconnection and short of a signal line transmitting a differential clock signal by disposing a plurality of comparators and so as to compare a non-inverting clock signal and an inverting clock signal with a potential unaffected by a terminating resistor.

Figure 1:
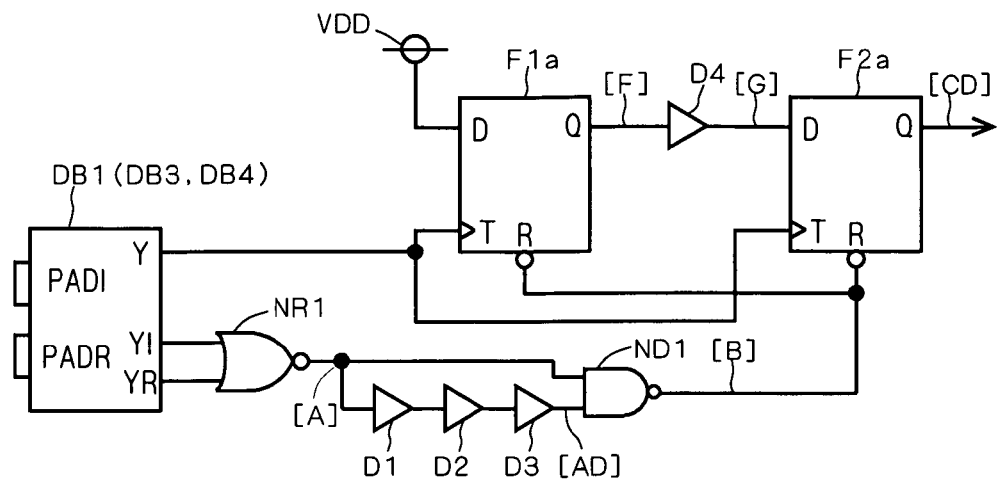
FIG. 1 is a diagram showing a disconnection and short detecting circuit according to a first preferred embodiment of the present invention.

FIG. 1 is a diagram showing a disconnection and short detecting circuit of the first preferred embodiment. This circuit has a differential buffer part DB1, as shown in FIG. 1.

Figure 2:
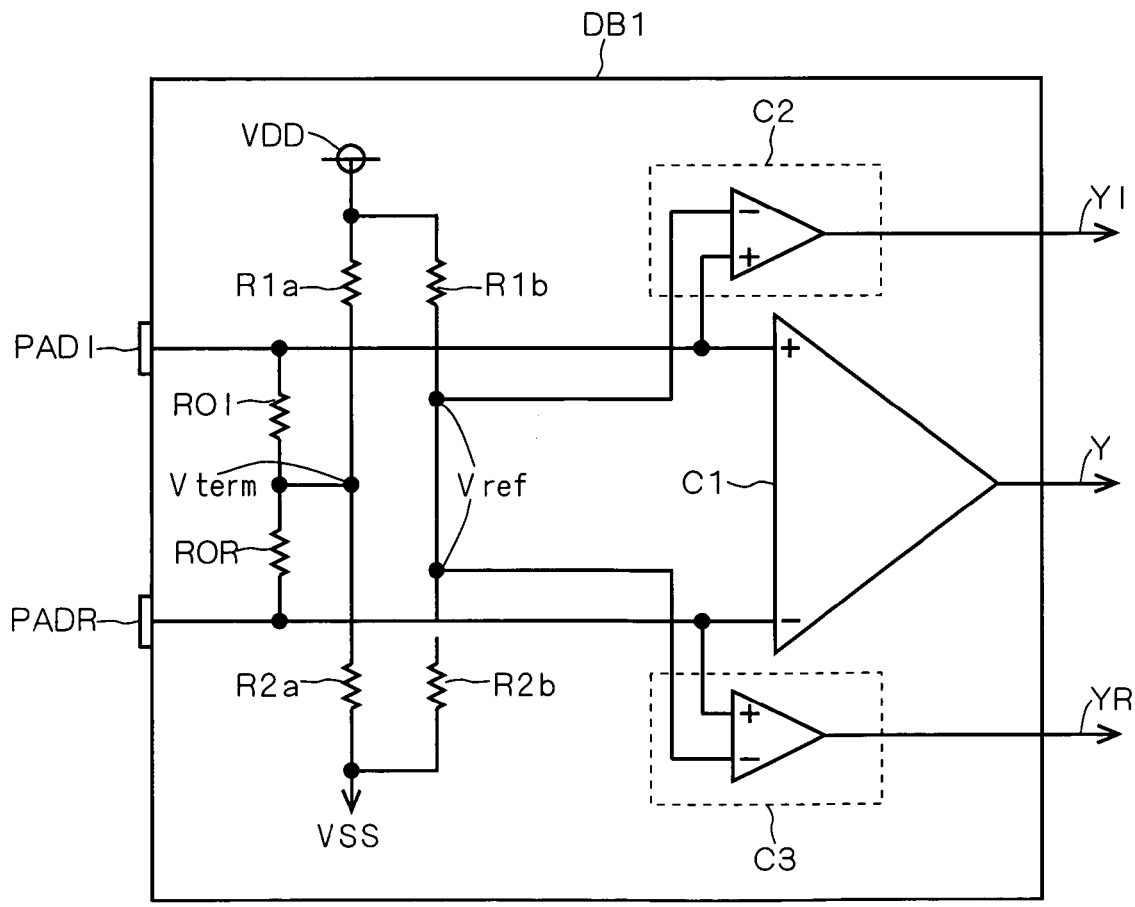
FIG. 2 is a diagram showing a detailed configuration of a differential buffer part DB1 in FIG. 1.

FIG. 2 is a diagram showing a detailed configuration of the differential buffer part DB1. As shown in FIG. 2, the differential buffer part DB1 has a first clock input end PADI to which a non-inverting clock signal is inputted, and a second clock input end PADR to which inputted is an inverting clock signal, the phase of which is the reverse of that of the non-inverting clock.

One end of a first terminating resistor R0I is connected to the first clock input end PADI. One end of a second terminating resistor R0R is connected to the second clock input end PADR. A potential Vterm, which is generated by dividing resistance by resistors R1a and R2a between a power supply potential VDD and a grounding potential VSS, is applied in common to the other end of the first terminating resistor R0I and the other end of the second terminating resistor R0R.

The values of the resistors R1a and R2a may be set suitably based on such a voltage value that a non-inverting clock signal and an inverting clock signal are able to adopt. For instance, the potential Vterm may be an intermediate value between the power supply potential VDD and the grounding potential VSS by setting the resistors R1a and R2a at the same value, if both of a non-inverting clock signal and an inverting clock signal transit between the power supply potential VDD and the grounding potential VSS, and the rises and the falls of both clock signals have substantially the same inclines.

The differential buffer part DB1 further has a first comparator C1, which has a positive (+) input end connected to the first clock input end PADI, and a negative (−) input end connected to the second clock input end PADR, and which compares the potentials at the positive (+) and the negative (−) input ends and, based on the comparison result, outputs, as a signal Y, "Hi" that is a first logical value, or "Low" that is a second logical value. The signal Y is used for operating clock and the like within a semiconductor device.

The differential buffer part DB1 further has a second comparator C2, which has a positive (+) input end connected to the first clock input end PADI, and a negative (−) input end to be provided with a potential Vref, which is generated by diving resistance by resistors R1b and R2b between a power supply potential VDD and a grounding potential VSS, and which compares the potentials at the positive (+) and the negative (−) input ends and, based on the comparison result, outputs Hi or Low, as a signal YI; and has a third comparator C3, which has a positive (+) input end connected to the second clock input end PADR, and a negative (−) input end to be provided with a potential Vref, and which compares the potentials at the positive (+) and the negative (−) input ends and, based on the comparison result, outputs Hi or Low, as a signal YR.

Here, the values of the resistors R1b and R2b may be set suitably based on such a voltage value that a non-inverting clock signal and an inverting clock signal are able to adopt. For instance, the values of the resistors R1b and R2b may be set so as to be the same as the value of the potential Vterm when neither disconnection nor short occurs.

Returning to FIG. 1, both of the signal YI that is the output of the second comparator C2, and the signal YR that is the output of the third comparator C3 are inputted to the two-input NOR circuit NR1 that is one type of logical gate circuits. An output [A] of the two-input NOR circuit NR1 is delayed for a predetermined period of time by a delay circuit composed of a plurality of delay stages D1 to D3 connected in series. An output [AD] from the delay stage D3 and the output [A] of the two-input NOR circuit NR1 are inputted to a two-input NAND circuit ND1. A signal [B] is outputted from the two-input NAND circuit ND1.

The two-input NOR circuit NR1, the plurality of delay stages D1 to D3, and the two-input NAND circuit ND1 function as a first signal output circuit that asserts (activates) and outputs a signal [B], if the logical value outputted from the second and the third comparators C2 and C3 are equal for a predetermined period of time or more.

The signal Y that is the output of the first comparator C1 is inputted to respective clock input ends T of the first and the second D-flip-flop circuits F1a and F2a. A power supply potential VDD corresponding to Hi that is the first logical value is applied to an input end D of the first D-flip-flop circuit F1a.

A signal [F] is outputted from an output end Q of the first D-flip-flop circuit F1a, and the signal [F] is delayed via the delay circuit D4 and then inputted, as a signal [G], to an input end D of the second D-flip-flop circuit F2a. A signal [CD] is outputted from an output end Q of the second D-flip-flop circuit F2a, and this signal [CD] functions as a detecting signal to detect whether disconnection and short occur on a signal line.

Both of the first and the second D-flip-flop circuits F1a and F2a are D-flip-flop circuits with reset function, and have a Low active reset terminal R. A signal [B] from the two-input NAND circuit ND1 is applied to respective reset terminals R of the first and the second D-flip-flop circuits F1a and F2a.

Figure 3:
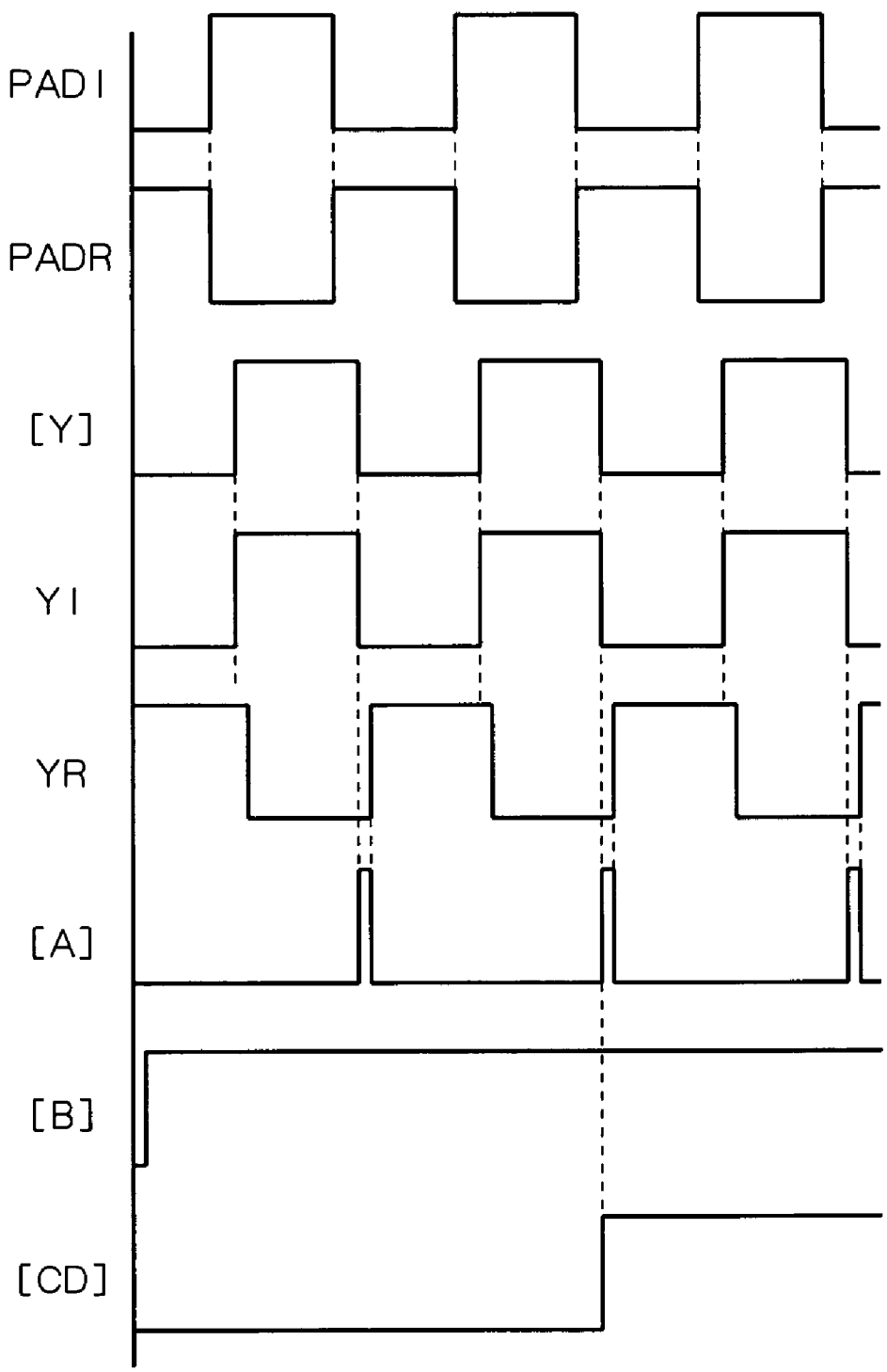
FIG. 3 is a timing chart showing changes in the signals of respective parts during normal operation in the disconnection and short detecting circuit of the first preferred embodiment.
Figure 4:
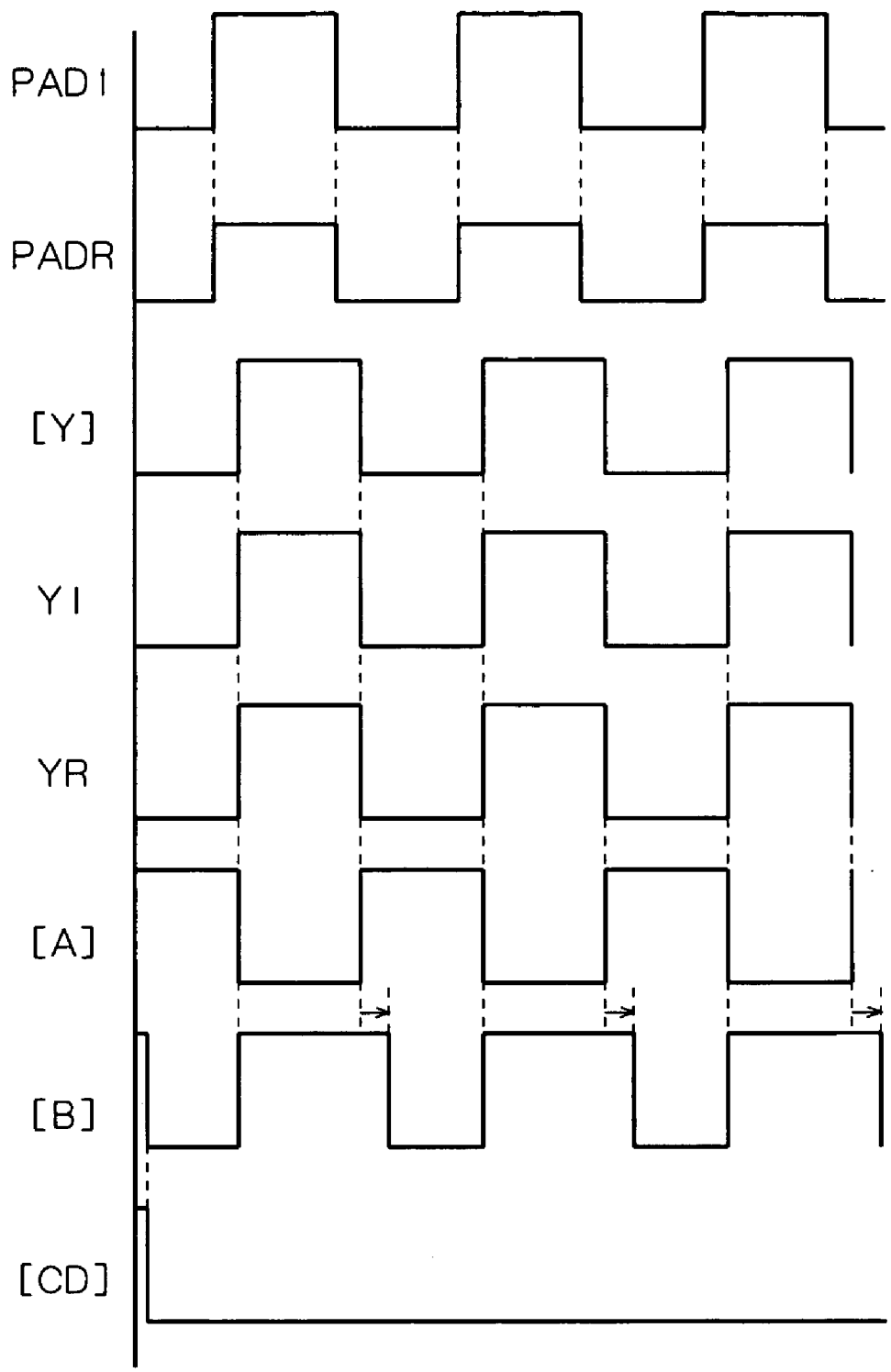
FIG. 4 is a timing chart showing changes in the signals of the respective parts when an inverting clock signal line is disconnected in the disconnection and short detecting circuit of the first preferred embodiment.
Figure 5:
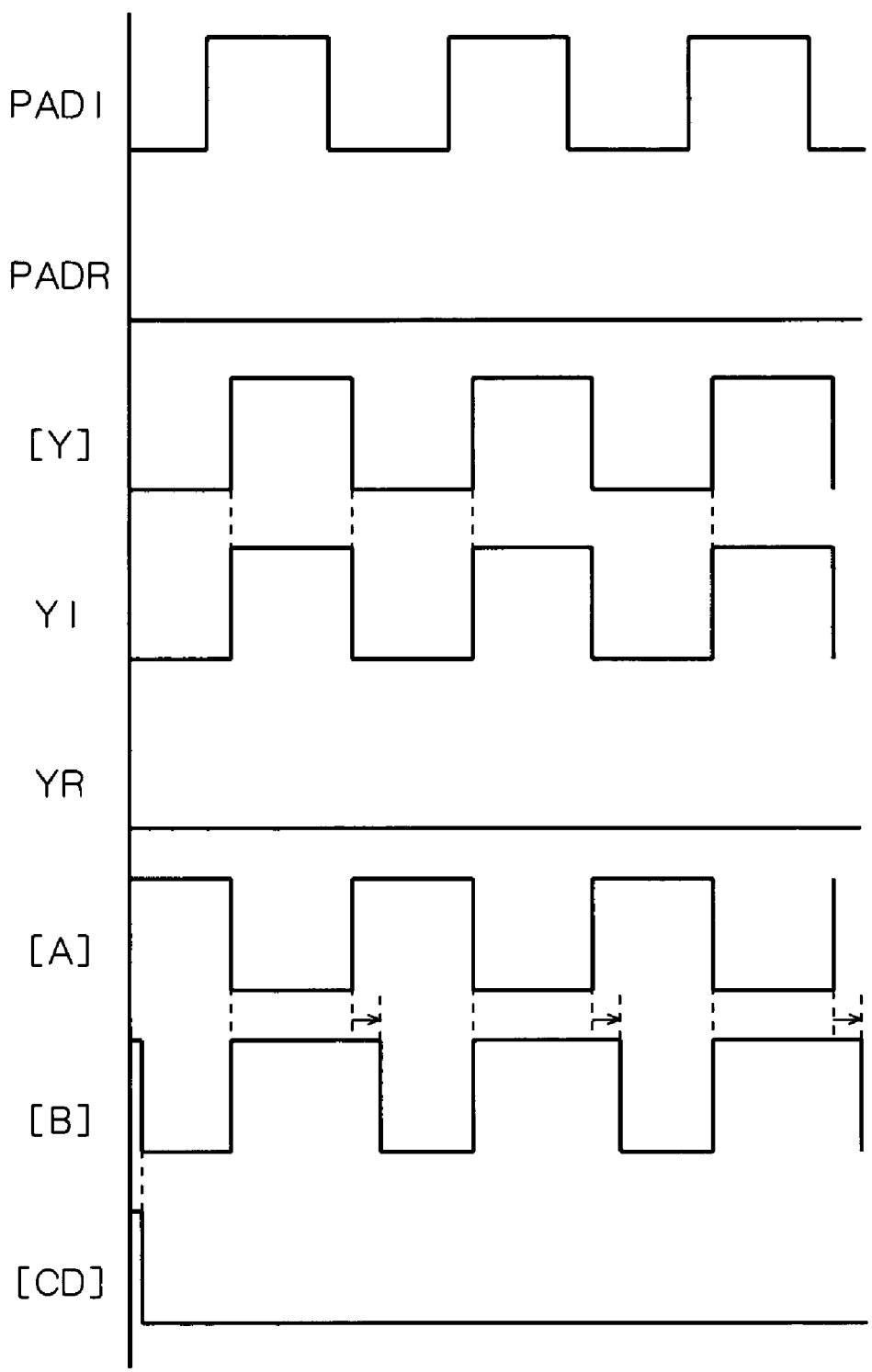
FIG. 5 is a timing chart showing changes in the signals of the respective parts when an inverting clock signal line is short-circuited to a grounding potential VSS in the disconnection and short detecting circuit of the first preferred embodiment.

The operation of the disconnection and short detecting circuit will next be described by using the timing charts of FIGS. 3 to 5. The timing chart of FIG. 3 shows changes in the signals of respective parts during normal operation, during which neither disconnection nor short occurs on respective signal lines of a non-inverting clock signal and an inverting clock signal. The timing chart of FIG. 4 shows changes in the signals of the respective parts when disconnection occurs on the signal line of the inverting clock signal. The timing chart of FIG. 5 shows changes in the signals of the respective parts when short to a grounding potential VSS occurs on the signal line of the inverting clock signal.

Referring now to FIG. 3, during normal operation, the non-inverting clock signal at the first clock input end PADI and the inverting clock signal at the second clock input end PADR, which are in opposite phases, repeat transition between states of Hi and Low.

The first comparator C1 compares, with a slight delay, the potential of a non-inverting clock signal and the potential of an inverting clock signal, and outputs the comparison result as a signal Y. When the potential of the non-inverting clock signal is higher than the potential of the inverting clock signal, the signal Y becomes Hi. When the potential of the non-inverting clock signal is lower than the potential of the inverting clock signal, the signal Y becomes Low.

Likewise, the second comparator C2 also compares, with a slight delay, the potential of the non-inverting clock signal and a potential Vref, and outputs the comparison result as a signal YI. When the potential of the non-inverting clock signal is higher than the potential Vref, the signal YI becomes Hi. When the potential of the non-inverting clock signal is lower than the potential Vref, the signal YI becomes Low.

Likewise, the third comparator C3 also compares, with a slight delay, the potential of the inverting clock signal and the potential Vref, and outputs the comparison result as a signal YR. When the potential of the inverting clock signal is higher than the potential Vref, the signal YR becomes Hi. When the potential of the inverting clock signal is lower than the potential Vref, the signal YR becomes Low.

The signal [A] outputted from the two-input NOR circuit NR1 becomes Hi when both of the signals YI and YR are Low, and becomes Low in other instances. FIG. 3 shows the case where there is a slight difference in phase between the change of the signal YI and the change of the signal YR. Therefore, when both of the signals YI and YR become Low, a brief pulse shape Hi appears in the signal [A].

The signal [A] is inputted to one input end of the two-input NAND circuit ND1, and it is delayed for a predetermined period of time, via the plurality of delay stages D1 to D3, and then inputted to the other input end of the two-input NAND circuit ND1. The signal [B] outputted from the two-input NAND circuit ND1 becomes Low when both of the signal [A] and the signal [AD] are Hi, and becomes Hi in other instances. Therefore, the signal [A] of FIG. 3, in which only the brief pulse shape Hi appears, does not become Hi at the same time as the signal [AD] after passing through the plurality of delay stages D1 to D3 (wherein the delay amount at the delay stages D1 to D3 is greater than the period of time that the signal [A] is in the pulse shape Hi). In other words, during normal operation, the signal [B] continues to output Hi, as shown in FIG. 3.

Here, the first D-flip-flop circuit F1a asserts and outputs the inputted power supply potential VDD, as a signal [F], by the fall transition from Hi to Low of the signal Y received at its clock input end T, for example. The second D-flip-flop circuit F2a asserts and outputs a signal [G] inputted from the first D-flip-flop circuit F1a via the delay circuit D4, as a signal [CD], by the fall transition from Hi to Low of the signal Y received at its clock input end T, for example.

The signal change of the signal Y is transmitted to the first and the second D-flip-flop circuits F1a and F2a at the same time. Therefore, if the fall transition of the signal Y occurs at the clock input end T, both of the first and the second D-flip-flop circuits F1a and F2a output the signal at their respective input ends D to their respective output ends Q. However, because the delay circuit D4 is present between the two, even if a certain fall transition of the signal Y occurs, Hi corresponding to the power supply potential VDD at the input end D appears at the output end Q of the first D-flip-flop circuit F1a, the Hi from the first D-flip-flop circuit F1a does not appear at the output end Q of the second D-flip-flop circuit F2a, until the next fall transition of the signal Y occurs, for example.

Here, the signal [B] from the two-input NAND circuit ND1 is being applied to the respective reset terminals R of the first and the second D-flip-flop circuits F1a and F2a. However, the signal [B] continues to output Hi during normal operation, as described above. Since both of these reset terminals R are Low active, no reset is performed at the first and the second D-flip-flop circuits F1a and F2a. In other words, the asserted signals from the respective output ends Q of the first and the second D-flip-flop circuits F1a and F2a are not be negated (nullified).

In the case of FIG. 3, although the signal [CD] is low immediately after the power is applied, if the first fall transition of the signal Y occurs, Hi corresponding to the power supply potential VDD at the input end D appears at the output end Q of the first D-flip-flop circuit F1a, and the signal [CD] of the output end Q of the second D-flop-flop circuit F2a becomes Hi when the second fall transition of the signal Y occurs. When this signal [CD] is Hi, neither disconnection nor short occurs on the signal line and it is judged to be normal.

On the other hand, as shown in FIG. 4, if disconnection occurs on the signal line of the inverting clock signal, the non-inverting clock signal at the first clock input end PADI is transmitted to the second clock input end PADR via the terminating resistors R0I and R0R, and a signal, which changes in the same phase as the non-inverting clock signal, appears at the second clock input end PADR. Such a signal that appears at the second clock input end PADR is subject to the influence of the potential Vterm and to the voltage drops at the terminating resistors R0I and R0R. Therefore, the non-inverting clock signal and this signal do not necessarily have the same strength. For the reason for this, the amplitude of the signal appearing at the second clock input end PADR is small in FIG. 4.

The first comparator C1 compares, with a slight delay, the potential of a non-inverting clock signal and the potential of an inverting clock signal, and outputs the comparison result as a signal Y. For example, below is a comparison of a non-inverting clock signal that appears at the first clock input end PADI, with a signal that appears at the second clock input end PADR. If the potential of the former is lower, the signal Y becomes Low. If the amplitude of the latter is smaller and its Hi level is lower than the Hi level of the former, the signal Y becomes Hi. The non-inverting clock signal repeats transition between states of Hi and Low. In response to this, in the signal Y repeats transition between states of Hi and Low, as shown in FIG. 4.

The second comparator C2 compares, with a slight delay, the potential of the non-inverting clock signal and the potential Vref, and outputs the comparison result as a signal YI. This case is the same as in FIG. 3.

The third comparator C3 compares, with a slight delay, the potential of a signal that appears at the second clock input end PADR and the potential Vref, and outputs the comparison result as a signal YR. Although in this case the amplitude of the signal at the second clock input end PADR is decreased, due to comparison with the potential Vref, the same signal change as in the signal YI appears in the signal YR.

Here, the signal [A] outputted from the two-input NOR circuit NR1 becomes Hi when both of the signals YI and YR are Low, and becomes Low in other instances. In the case of FIG. 4, the signal changes of the signals YI and YR are almost the same. Accordingly, when both of the signals YI and YR are Low, a longer pulse shape Hi than the case of FIG. 3 appears in the signal [A].

The signal [A] is inputted to one input end of the two-input NAND circuit ND1, and it is also delayed for a predetermined period of time, via the plurality of delay circuits D1 to D3, and then inputted to the other input end of the two-input NAND circuit ND1. The signal [B] outputted from the two-input NAND circuit ND1 becomes Low when the both of the signals [A] and [AD] are Hi, and becomes Hi in other instances.

Unlike the case of FIG. 3 in which only the brief pulse shape Hi appears, in the case of FIG. 4, a longer pulse shape Hi appears in the signal [A] (wherein the delay amount at the delay stages D1 to D3 is smaller than the period of time that the signal [A] is in the pulse shape Hi). Therefore, in the signal [A], there can be the period of time that the signal [A] becomes Hi at the same time as the signal [AD] after passing through the plurality of delay stages D1 to D3. Accordingly a pulse shape Low appears in the signal [B] outputted from the two-input NAND circuit ND1, so that the signal [B] repeats transition between states of Hi and Low.

The first D-flip-flop circuit F1a asserts and outputs, as a signal [F], the inputted power supply potential VDD, by the fall transition from Hi to Low of the signal Y received at its clock input end T, for example. The second D-flip-flop circuit F2a also asserts and outputs, as a signal [CD], a signal [G] inputted from the first D-flip-flop circuit F1a via the delay circuit D4, by the fall transition from Hi to Low of the signal Y received at the clock input end T, for example.

The signal change of the signal Y is transmitted to the first and the second D-flip-flop circuits F1a and F2a at the same time. Therefore, if the fall transition of the signal Y occurs at the clock input end T, both of the first and the second D-flip-flop circuits F1a and F2a output the signals at their respective input ends D to their respective output ends Q.

In the case of FIG. 4, however, a pulse shape Low appears in the signal [B] from the two-input NAND circuit ND1. Since both of their respective reset terminals R are Low active, reset is performed at the first and the second D-flip-flop circuits F1a and F2a. In other words, the asserted signals from the output ends Q of the first and the second D-flip-flop circuits F1a and F2a are negated.

If a certain fall transition of the signal Y occurs in the case of FIG. 4, Hi corresponding to the power supply potential VDD at the input end D appears at the output end Q of the first D-flip-flop circuit Fla. Immediately thereafter, however, a pulse shape Low appears in the signal [B], so that reset is performed at the first and the second D-flip-flop circuits F1a and F2a. Since this operation is repeated, a signal [CD] of the output end Q of the second D-flip-flop circuit F2a remains Low. If this signal [CD] is Low, disconnection or short occurs on the signal line and it is judged to be abnormal.

Referring to FIG. 5, if the signal line of an inverting clock signal is short-circuited to a grounding potential VSS, Low corresponding to the grounding potential VSS appears at the second clock input end PADR.

The first comparator C1 compares, with a slight delay, the potential of a non-inverting clock signal and the potential of an inverting clock signal, and outputs the comparison result as a signal Y. For example, when the Low level of a non-inverting clock signal at the first clock input end PADI has approximately the same value as the Low level of the grounding potential VSS, and there is little difference between the two, the signal Y becomes Low. Since the Hi level of a non-inverting clock signal at the first clock input end PADI is higher than the Low that appears at the second clock input end PADR, the signal Y becomes Hi. The non-inverting clock signal repeats transition between states of Hi and Low. In response to this, the signal Y repeats transition between states of Hi and Low, as shown in FIG. 5.

The second comparator C2 compares, with a slight delay, the potential of a non-inverting clock signal and the potential Vref, and outputs the comparison result as a signal YI. This case is the same as in FIG. 3.

The third comparator C3 compares, with a slight delay, Low that appears at the second clock input end PADR and the potential Vref, and outputs the comparison result as a signal YR. In this case, the potential Vref is higher than the Low at the second clock input end PADR (i.e., the grounding potential VSS), so that Low appears in the signal YR.

Here, the signal [A] outputted from the two-input NOR circuit NR1 becomes Hi when both of the signals YI and YR are Low, and becomes Low in other instances. In the case of FIG. 5, the signal YR remains Low, so that a pulse shape Hi appears when the signal YI becomes Low. This results in the same signal change as in the case of FIG. 4.

Since the change of the signal [A] is the same as in the case of FIG. 4, the signal [B] and the signal [CD] are also similar to the case of FIG. 4, and Low is outputted to the signal [CD]. Therefore, disconnection or short occurs on the signal line and it is judged to be abnormal.

Although FIG. 3 to FIG. 5 illustrate the case where disconnection or short occurs on the signal line of the inverting clock signal, the foregoing is true for the case where disconnection or short occurs on the signal line of a non-inverting clock signal, except for the signal changes in the signals YI and YR. Therefore, the signals [A], [B] and [CD] change similarly, thereby enabling detection of abnormal.

In the first preferred embodiment the two-input NOR circuit NR1, the delay stages D1 to D3, and the two-input NAND circuit ND1 operate closely together to function as a signal output circuit. This signal output circuit has the function of asserting and outputting the signal [B], if both of the logical values of the signals YI and YR outputted from the second and the third comparator C2 and C3, respectively, become Low and are equal for a predetermined period of time (i.e. the delay amount of the delay stages D1 to D3) or more.

Additionally, in the first preferred embodiment the first and the second D-flip-flop circuits F1a and F2a, and the delay circuit D4 operate closely together to function as a flip-flop circuit. This flip-flop circuit has a clock input end for receiving the signal Y outputted from the first comparator C1, an input end to which applied is a voltage signal corresponding to a logical value Hi (i.e., the power supply potential VDD), and an output end for outputting an output signal (i.e, the output end Q of the second D-flip-flop circuit F2a). This flip-flop circuit has the function of outputting the voltage signal as an asserted output signal [CD] if transition in a predetermined direction occurs in the signal Y received at the clock input end, and the function of negating the output signal [CD] if received the asserted signal [B] from the aforesaid signal outputting circuit.

In accordance with the disconnection and short detecting circuit of the first preferred embodiment, if the signal line of a non-inverting clock signal or an inverting clock signal is disconnected, or short-circuited to the grounding potential VSS of a logical value Low, the logical values outputted from the second and the third comparators C2 and C3 are equal in one cycle of the non-inverting clock signal or the inverting clock signal for a long period of time.

Thereby, it can be judged that disconnection or short occurs if the second D-flip-flop circuit F2a negates an output signal. This enables more reliable detection of disconnection and short of the signal line of a differential clock signal, which could not be achieved only by comparing the potential of a non-inverting clock signal and the potential of an inverting clock signal.

Additionally, the disconnection and short detecting circuit of the first preferred embodiment includes, as a logical gate circuit, the two-input NOR circuit NR1 for receiving the outputs of the second and the third comparators C2 and C3. This enables to assert the signal [A] if both of the logical values outputted from the second and the third comparator C2 and C3 are Low.

Additionally, the disconnection and short detecting circuit of the first preferred embodiment includes the delay circuit composed of the plurality of delay stages D1 to D3, and the two-input NAND circuit ND1. If the signal lines of a non-inverting clock signal and an inverting clock signal are normal, without causing disconnection or the like, the logical values outputted from the second and the third comparators C2 and C3 should be different from each other. However, due to the influence of signal delay and the like between the second and the third comparators C2 and C3, the logical values of the two outputs are equal in some cases, although it is a short period of time. In such a case, the two-input NOR circuit NR1, of course, asserts the signal [A], as shown in FIG. 3.

Even in this case, it is able to nullify a brief pulse shape signal outputted from the two-input NOR circuit NR1 because the delay stages D1 to D3 delay the output of the two-input NOR circuit NR1, and the two-input NAND circuit ND1 outputs an inverted AND of the output of the two-input NOR circuit NR1, and the output of the delay stages D1 to D3. Accordingly, the flip-flop circuit does not erroneously assert an output signal, although it is normal, as if either of the signal line of a non-inverting clock signal or an inverting clock signal were disconnected or short-circuited.

Additionally, the disconnection and short detecting circuit of the first preferred embodiment includes the first and the second D-flip-flop circuits F1a and F2a, and the delay circuit D4. Upon receipt of the asserted signal [B], both of the first and the second D-flip-flop circuits F1a and F2a negate their respective outputs. Therefore, even if after the second D-flip-flop circuit F2a receives the asserted signal [B] and negates its output, transition in a predetermined direction occurs temporarily in the signal Y received at the clock input end T, the second D-flip-flop circuit F2a does not erroneously assert the output signal because the output of the first D-flip-flop circuit F1a is negated.

If transition in a predetermined direction occurs in the signal Y received at the clock input end after the first and the second D-flip-flop circuits F1a and F2a receive the asserted signal [B] and negate the output thereof, the presence of the delay circuit D4 avoids that the output of the first D-flip-flop circuit F1a is immediately transmitted to the second D-flip-flop circuit F2a, thereby to reliably prevent the second D-flip-flop circuit F2a from erroneously asserting.

Second Preferred Embodiment

A second preferred embodiment is a modification of the disconnection and short detecting circuit of the first preferred embodiment. Specifically, first and second D-flip-flop circuits with set function are employed in place of the first and the second D-flip-flop circuit F1a and F2a with reset function in the first preferred embodiment.

Figure 6:
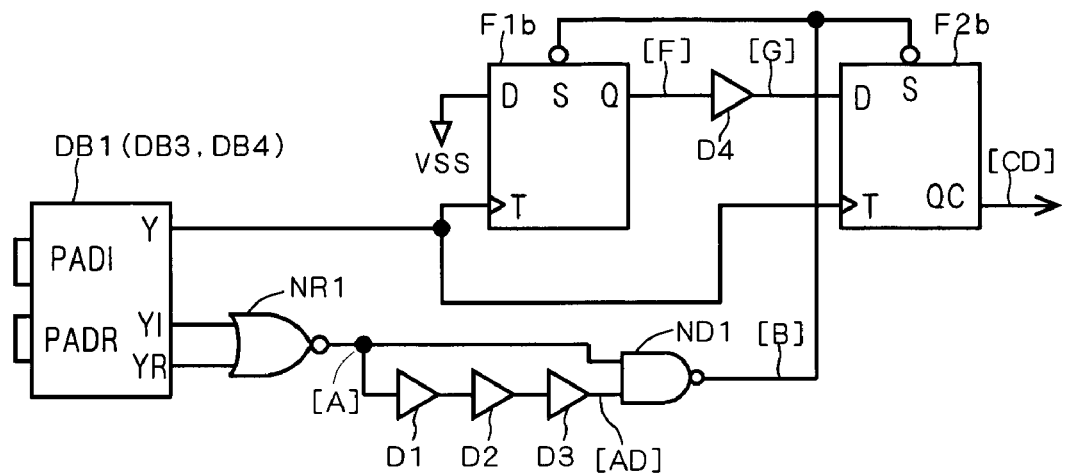
FIG. 6 is a diagram showing a disconnection and short detecting circuit according to a second preferred embodiment of the present invention.

FIG. 6 is a diagram showing a disconnection and short detecting circuit in accordance with the second preferred embodiment. The device configuration in FIG. 6 is the same as that in FIGS. 1 and 2, except that the first and the second D-flip-flop circuits F1b and F2b with set function are disposed in place of the first and the second D-flip-flop circuits F1a and F2a with reset function in FIG. 1; that the signal [B] from the two-input NAND circuit ND1 is inputted to set terminals S of the first and the second D-flip-flop circuits F1b and F2b; that instead of a power supply potential VDD, a grounding potential VSS is inputted to an input end D of the first D-flip-flop circuit F1b; and that the output not from an output end Q of the second D-flip-flop circuit F2b, but from an inverting output end QC (which outputs a signal of which logical value is the reverse of that of the output terminal Q) is employed as a signal [CD].

In the first and the second D-flip-flop circuits F1b and F2b with set function, the respective set terminals S are Low active. Therefore, if a pulse shape Low appears in a signal [B], set is performed at the first and the second D-flip-flop circuits F1b and F2b. In other words, the asserted signal (Hi) from the inverting output ends QC of the first and the second D-flip-flop circuits F1b and F2b are negated (become Low).

This means that the disconnection and short detecting circuit of the second preferred embodiment performs the completely the same operation as in the timing charts of FIGS. 3 to 5. Accordingly the second preferred embodiment also produces the effect obtained by the disconnection and short detecting circuit of the first preferred embodiment.

Third Preferred Embodiment

A third preferred embodiment is also a modification of the disconnection and short detecting circuit of the first preferred embodiment. Specifically, the delay circuit D4 between the first and the second D-flip-flop circuits F1a and F2a of the first preferred embodiment is eliminated, and it is configured so as to invert and input a signal Y to the second D-flip-flop circuit F2a.

Figure 7:
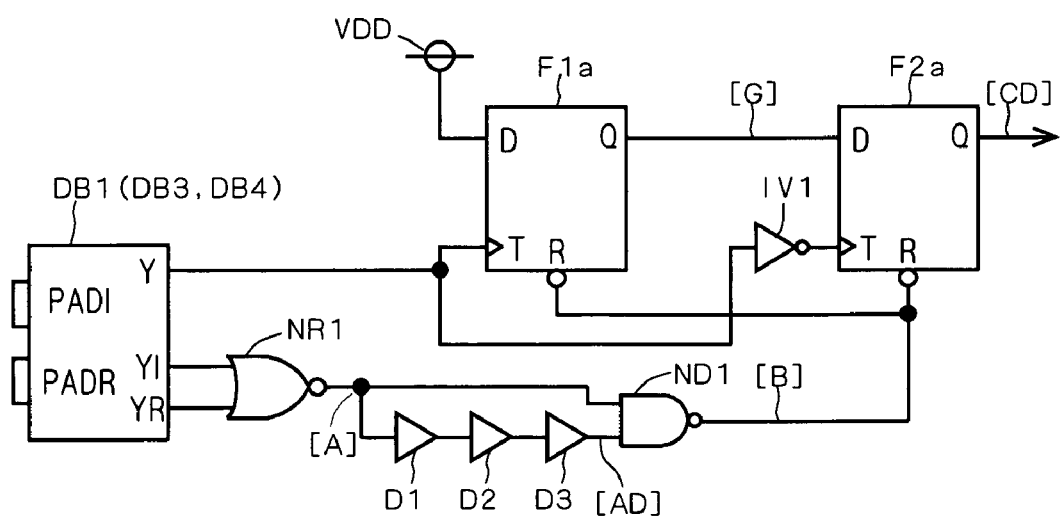
FIG. 7 is a diagram showing a disconnection and short detecting circuit according to a third preferred embodiment of the present invention.

FIG. 7 is a diagram showing a disconnection and short detecting circuit in accordance with the third preferred embodiment. The device configuration is the same as that in FIGS. 1 and 2, except that instead of the delay circuit D4, an inverter IV1 is disposed so as to invert and input the signal Y to the second D-flip-flop F2a.

With this configuration, the first D-flip-flop circuit F1a asserts and outputs, as a signal [G], a power supply voltage VDD by the rise transition from Low to Hi of the signal Y received at a clock input end T, for example.

On the other hand, the second D-flip-flop circuit F2a is provided with the inverter IV1, and therefore outputs, as an asserted output signal [CD], the output [G] from the first D-flip-flop circuit F1a if there occurs the fall transition from Hi to Low of the signal Y, which is the reverse of the rise transition from Low to Hi.

The operation of this disconnection and short detecting circuit will next be described by using the timing chart of FIG. 8. The timing chart of FIG. 8 shows signal changes in respective parts when disconnection occurs on the signal line of an inverting clock signal.

Figure 8:
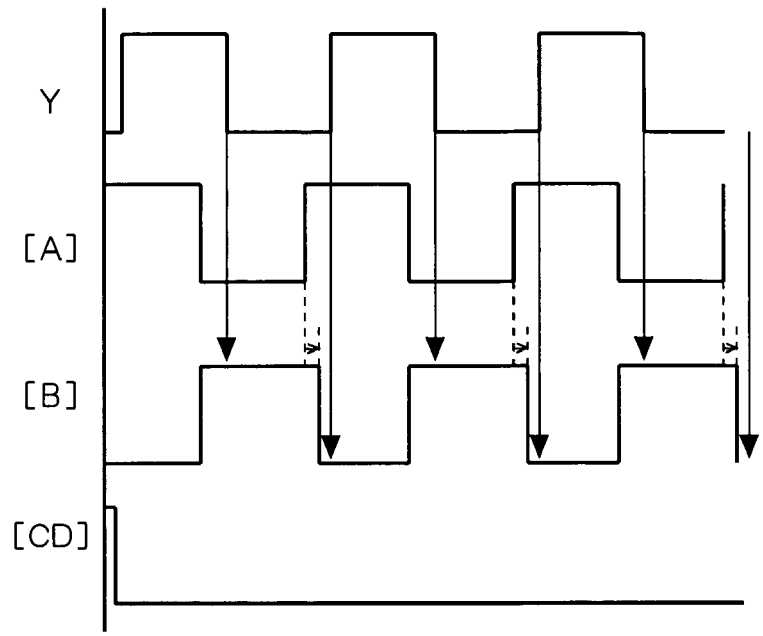
FIG. 8 is a timing chart showing changes in the signals of respective parts when an inverting clock signal line is disconnected in the disconnection and short detecting circuit of the third preferred embodiment.

As shown in FIG. 8, signal Y, signal [A], signal [B] and signal [CD] change similarly to the case of FIG. 4. The first D-flip-flop circuit F1a asserts and outputs, as a signal [G], an inputted power supply potential VDD by the rise transition from Low to Hi of the signal Y received at the clock input end T, for example. However, at this time the signal [B] is Low, and reset is performed at the first D-flip-flop circuit F1a. Accordingly, irrespective of the rise transition of the signal Y, Hi does not appear, but Low appears in the signal [G].

On the other hand, the second D-flip-flop circuit F2a asserts and outputs the signal [G], as a signal [CD], by the fall transition from Hi to Low of the signal Y. In this case, the signal [B] is Hi, and no reset is performed at the second D-flip-flop circuit F2a. Accordingly the second D-flip-flop circuit F2a transmits the signal [G] at its input end D to its output end Q. However, by the rise transition from Low to Hi of the signal Y prior to a half cycle of clock, reset has performed at the first D-flip-flop circuit F1a, and Low has appeared in the signal [G], so that Hi does not appear, but Low appears in the signal [CD]. Since the signal [CD] is Low, disconnection or short occurs on the signal line, and it is judged to be abnormal.

In accordance with the disconnection and short detecting circuit of the third preferred embodiment, the first D-flip-flop circuit F1a asserts at the transition of the signal Y in a predetermined direction, and the second D-flip-flop circuit F2a asserts at the transition of the signal Y in the reverse direction of the predetermined direction. Accordingly, it is able to assert with shifted timing in the cycle of a non-inverting clock signal or the cycle of an inverting clock signal, one time for each of the first and the second D-flip-flop circuits F1a and F2a.

At this time, by setting the delay amount at respective parts so as to cause transition of the signal Y in the predetermined direction during the time that the first D-flip-flop circuit F1a receives the asserted signal [B], the output of the first D-flip-flop circuit F1a is negated. Therefore, the second D-flip-flop circuit F2a does not erroneously assert the output signal [CD] when disconnection or short occurs.

Unlike the first preferred embodiment, there is no need of the delay circuit D4, thereby enabling to reduce the size of the circuit. This is because the delay circuit D4 requires at least two pairs of complementary metal oxide semiconductors (CMOS) transistor configurations, whereas the inverter IV1 requires a pair of CMOS transistor configurations.

Fourth Preferred Embodiment

A fourth preferred embodiment is a modification of the disconnection and short detecting circuit of the first preferred embodiment. Specifically, the first D-flip-flop F1a of the first preferred embodiment is eliminated and a latch circuit composed of two-input NAND circuits is employed.

Figure 9:
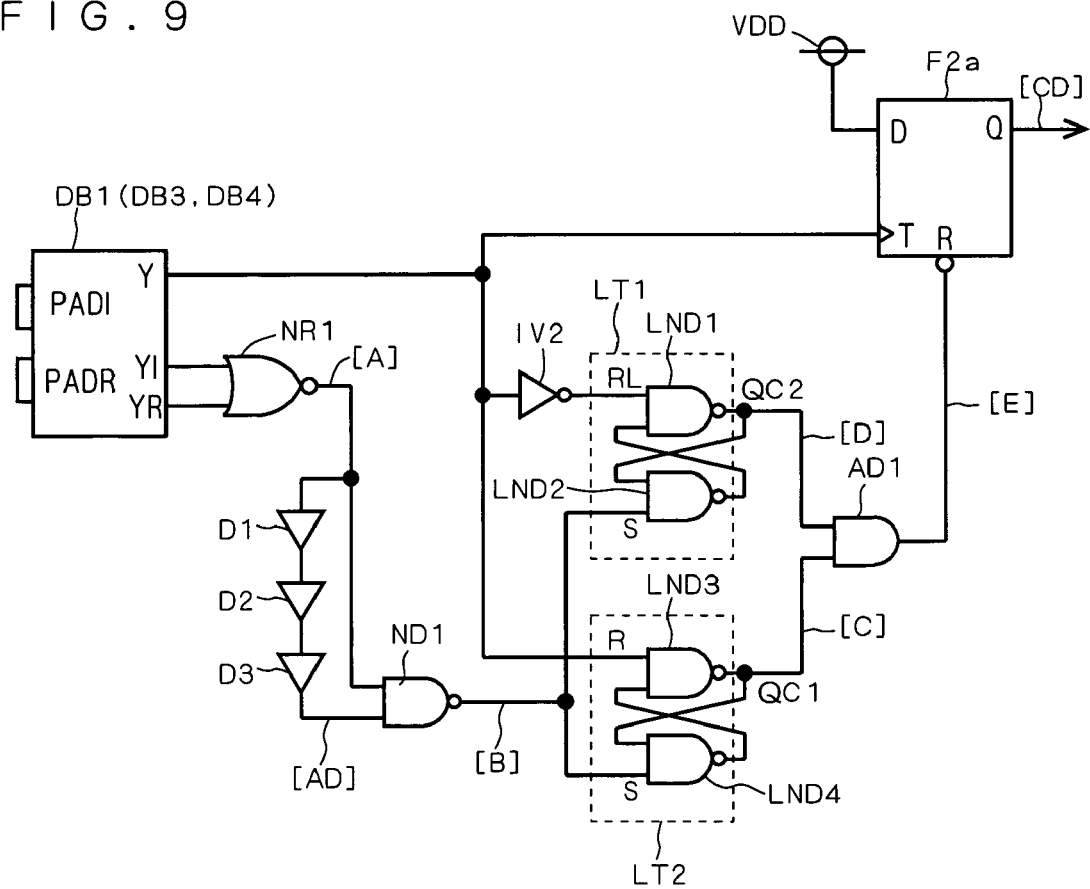
FIG. 9 is a diagram showing a disconnection and short detecting circuit according to a fourth preferred embodiment of the present invention.

FIG. 9 is a diagram showing a disconnection and short detecting circuit in accordance with the fourth preferred embodiment. The device configuration of FIG. 9 is the same as that of the FIGS. 1 and 2, except that instead of the first D-flip-flop circuit F1a, two-input NAND circuits LND1 to LND4 and an inverter IV2 and a two-input AND circuit AD1 are disposed; a power supply potential VDD is directly applied to an input end D of the second D-flip-flop circuit F2a; and instead of the signal [B], a signal [E] outputted by the two-input AND circuit AD1 is applied to a reset terminal R of the second D-flip-flop F2a.

A signal Y is inputted to the inverter IV2, and the output of the inverter IV2 is applied to one input end of the two-input NAND circuit LND1. The output of the two-input NAND circuit LND1 is applied to one input end of the two-input NAND circuit LND2 and to one input end of the two-input AND circuit AD1. The output of the two-input NAND circuit LND2 is applied to the other input end of the two-input NAND circuit LND1.

The signal [B] from the two-input NAND circuit ND1 is applied to the other input end of the two-input NAND circuit LND2, and the signal Y is inputted to one input end of the two-input NAND circuit LND3. The output of the two-input NAND circuit LND3 is applied to one input end of the two-input NAND circuit LND4 and to the other input end of the two-input AND circuit AD1. The output of the two-input NAND circuit LND4 is applied to the other input end of the two-input NAND circuit LND3. The signal [B] is also applied to the other input end of the two-input NAND circuit LND4.

Then, if the two-input AND circuit AD1 asserts by bringing its output [E] into Low, reset is performed at the second D-flip-flop circuit F2a. The two-input NAND circuits LND1 and LND2 configure a latch circuit LT1, and the two-input NAND circuits LND3 and LND4 configure a latch circuit LT2.

The operation of this disconnection and short detecting circuit will next be described by using the logical value table of FIG. 10, and the timing charts of FIGS. 11 to 13.

Figures 10, 11:
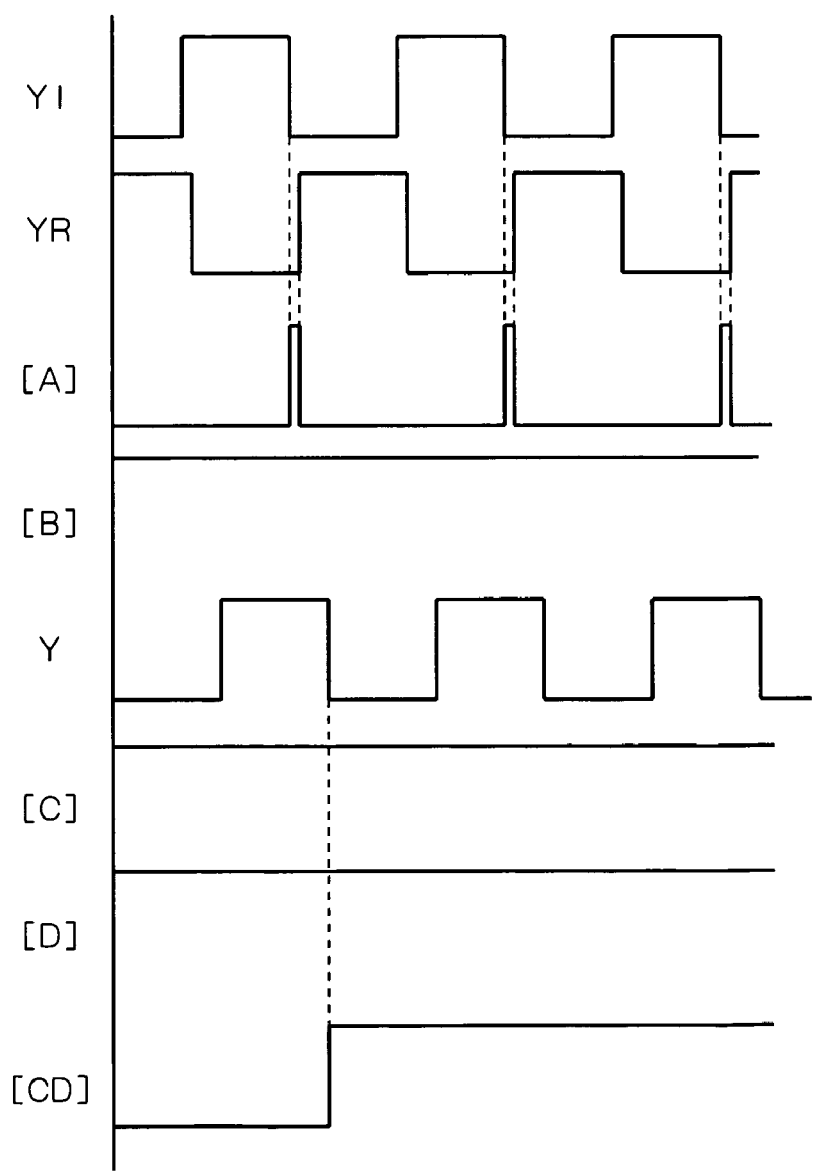
FIG. 10 is a diagram showing a logical value table of a latch circuit composed of two-input NAND circuits LND1 to LND4.
FIG. 11 is a timing chart showing changes in the signals of respective parts during normal operation in the disconnection and short detecting circuit of the fourth preferred embodiment.

The logical value table of FIG. 10 shows signal hold or Hi or Low in an output QC1 of the latch circuit LT2, namely the signal outputted by the two-input NAND circuit LND3, and an output QC2 of the latch circuit LT1, namely the signal [D] outputted by the two-input NAND circuit LND1, with respect to Hi and Low of a set input S on the latch circuits LT1 and LT2, namely the signal [B], and a reset input R (its inverted input RL), namely the signal Y.

The timing chart of FIG. 11 shows signal changes of respective parts during normal operation, during which neither disconnection nor short occurs on the signal lines of a non-inverting clock signal and an inverting clock signal. The timing chart of FIG. 12 shows signal changes of the respective parts when disconnection occurs on the signal line of the inverting clock signal. The timing chart of FIG. 13 shows signal changes of the respective parts when short to a grounding potential VSS occurs on the signal line of the inverting clock signal.

During normal operation, like the case of FIG. 3, the non-inverting clock signal at the first clock input end PADI and the inverting clock signal at the second clock input end PADR, which are in opposite phases, repeat transition between states of Hi and Low. Thereby, the signals YI and YR, which are in opposite phases, repeat transition between states of Hi and Low.

Here, the signal [A] outputted from the two-input NOR circuit NR1 becomes Hi when both of the signals YI and YR are Low, and becomes Low in other instances. Like FIG. 3, FIG. 11 shows the case where there is a slight phase shift between the change of the signal YI and the change of the signal YR. Accordingly, when both of the signals YI and YR are Low, a brief pulse shape Hi appears in the signal [A], so that the signal [B] continues to output Hi, as in FIG. 3.

The signal [B], namely the respective set inputs S on the latch circuits LT1 and LT2, continues to output Hi. Therefore both of the output QC1 of the latch circuit LT2 and the output QC2 of the latch circuit LT1 continue to output Hi or continues to hold signal, as apparent from the logical value table of FIG. 10. Accordingly both of the signals [C] and [D] continue to output Hi, as shown in FIG. 11. As a result, the signal [E] outputted from the two-input AND circuit AD1 does not become Low, and no reset is performed at the second D-flip-flop circuit F2a. Therefore, the second D-flip-flop circuit F2a asserts and outputs an inputted power supply potential VDD, as a signal [CD], by the fall transition from Hi to Low of the signal Y, for example.

Since this signal [CD] continues to output Hi, neither disconnection nor short occurs on the signal line and it is judged to be normal.

On the other hand, if disconnection occurs on the signal line of an inverting clock signal, a signal, which changes in the same phase as a non-inverting clock signal, appears at the second clock input end PADR, as in the case of FIG. 4. Thereby, the same signal change as in the signal YI appears in the signal YR, as shown in FIG. 12.

Here, the signal [A] outputted from the two-input NOR circuit NR1 becomes Hi when both of the signals YI and YR are Low, and becomes Low in other instances. In FIG. 12, as in FIG. 4, a longer pulse shape Hi than that in FIG. 11 appears in the signal [A] when both of the signals YI and YR are Low. Then, as in FIG. 4, a pulse shape Low appears in the signal [B], and the signal [B] repeats transition between states of Hi and Low.

Figure 12:
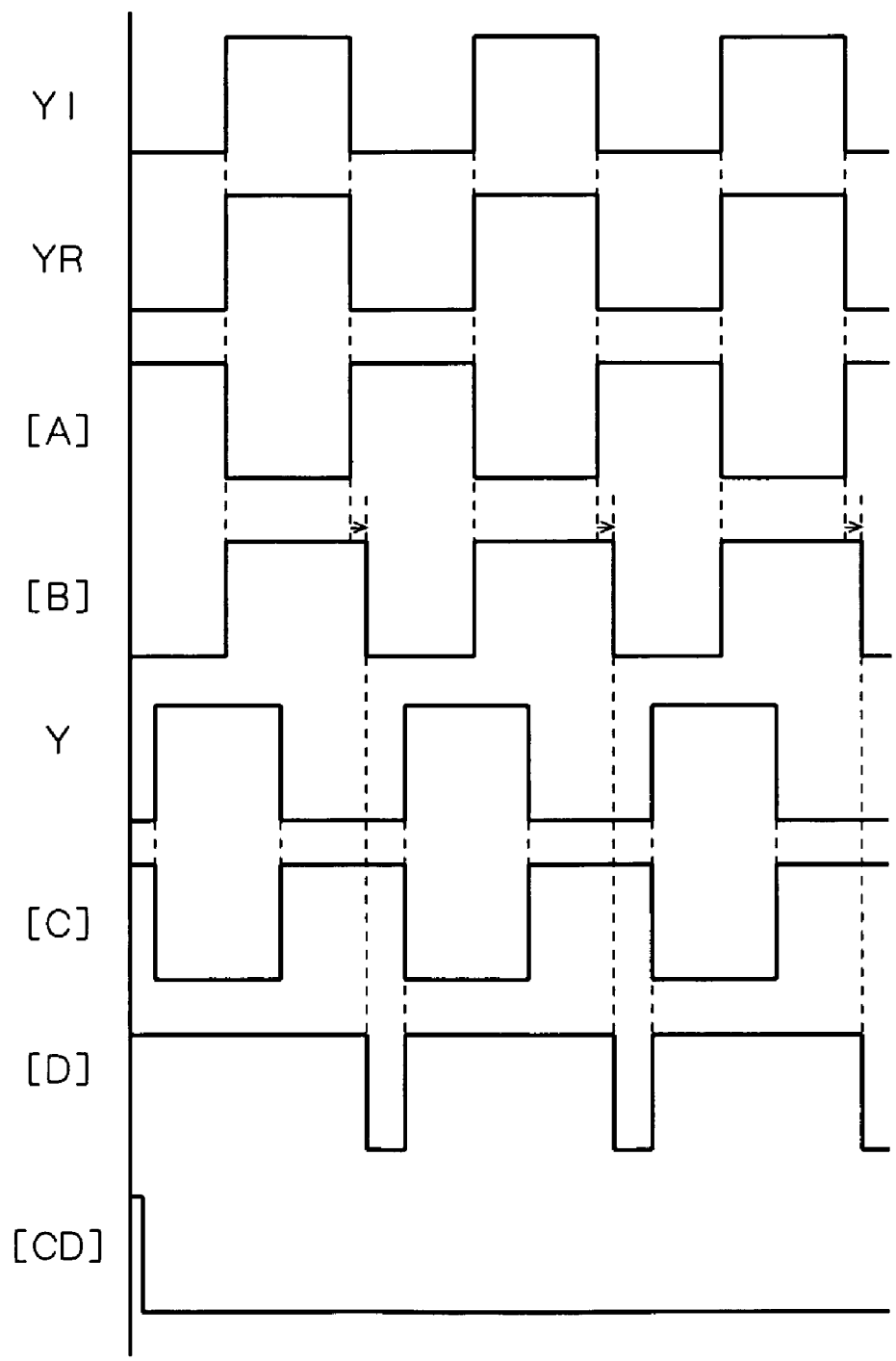
FIG. 12 is a timing chart showing changes in the signals of the respective parts when an inverting clock signal line is disconnected in the disconnection and short detecting circuit of the fourth preferred embodiment.

Since the signal [B], namely the set inputs S on the latch circuits LT1 and LT2, repeats transition between states of Hi and Low, the output QC1 of the latch circuit LT2 has just the phase-inverted waveform of the signal Y, and the output QC2 of the latch circuit LT1 has a waveform in which Hi output partly includes Low output, as shown in FIG. 12. At this time, there can be the period of time that either of the signals [C] and [D] becomes Low. As a result, the signal [E] outputted from the two-input AND circuit AD1 becomes Low, and reset is performed at the second D-flip-flop circuit F2a. Accordingly the second D-flip-flop circuit F2a does not assert the inputted power supply potential VDD, and the signal [CD] continues to output Low.

Since this signal [CD] continues to output Low, disconnection or short occurs on the signal line and it is judged to be abnormal.

If short to the grounding potential VSS occurs on the signal line of an inverting clock signal, Low corresponding to the grounding potential VSS appears at the second clock input end PADR, as in the case of FIG. 5. Thereby, Low appears in the signal YR, as shown in FIG. 13.

Here, the signal [A] outputted from the two-input NOR circuit NR1 becomes Hi when both of the signals YI and YR are Low, and becomes Low in other instances. In FIG. 13, as in FIG. 5, a longer pulse shape Hi than that in FIG. 11 appears when both of the signals YI and YR are Low. Then, as in FIG. 5, a pulse shape Low appears in the signal [B], and the signal [B] repeats transition between states of Hi and Low.

Figure 13:
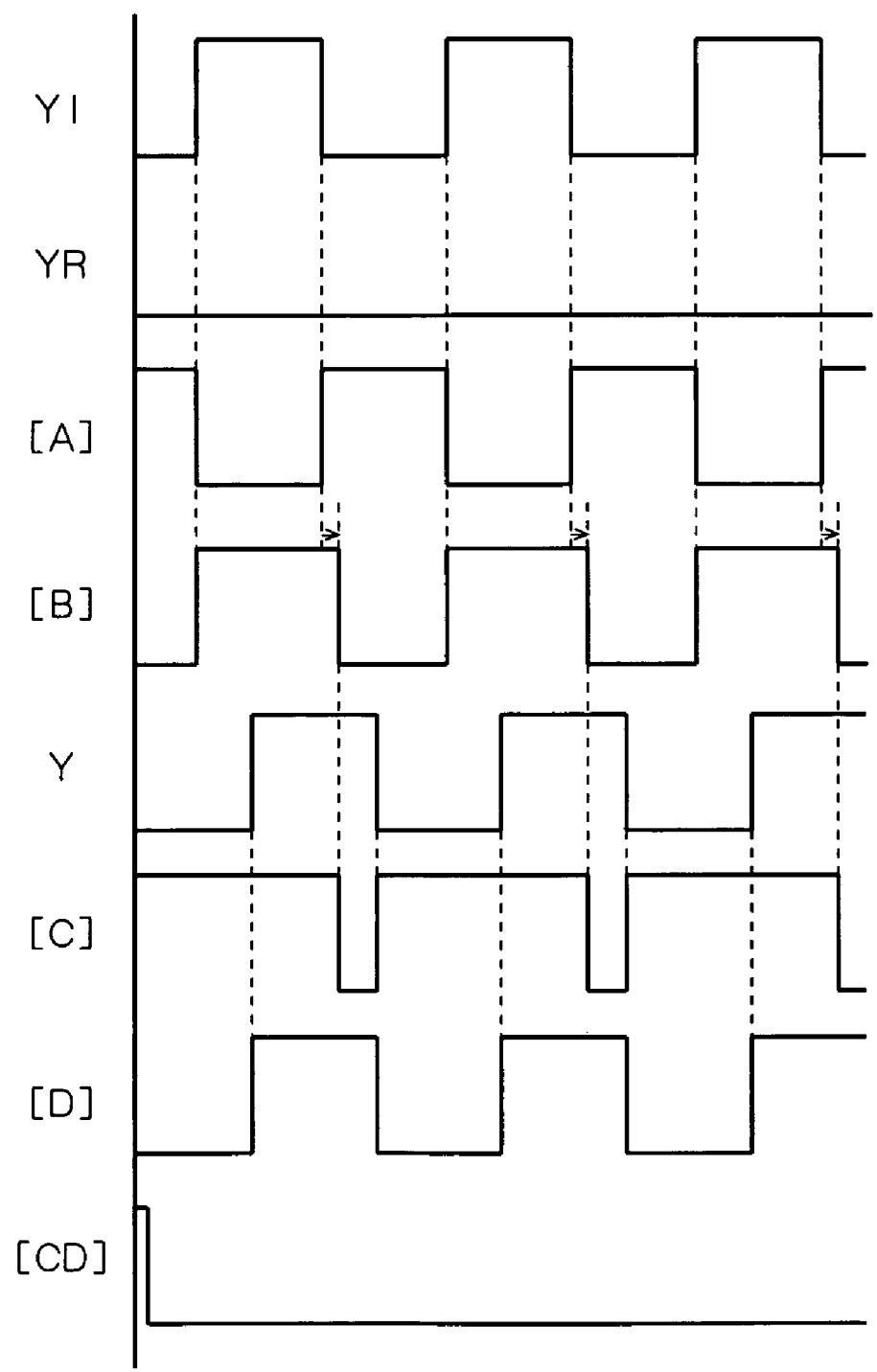
FIG. 13 is a timing chart showing changes in the signals of the respective parts when an inverting clock signal line is short-circuited to a grounding potential VSS in the disconnection and short detecting circuit of the fourth preferred embodiment.

Since the signal [B], namely the set inputs S on the latch circuits LT1 and LT2, repeats transition between states of Hi and Low, the output QC2 of the latch circuit LT1 has just the same waveform as the signal Y, and the output QC1 of the latch circuit LT2 has a waveform in which Hi output partly includes Low output, as shown in FIG. 13. At this time, there can be the period of time that either of the signals [C] and [D] becomes Low. As a result, the signal [E] outputted from the two-input AND circuit AD1 becomes Low, and reset is performed at the second D-flip-flop circuit F2a. Accordingly the second D-flip-flop circuit F2a does not assert the inputted power supply potential VDD, and the signal [CD] continues to output Low.

Since this signal [CD] continues to output Low, disconnection or short occurs on the signal line and it is judged to be abnormal.

Although FIGS. 11 to 13 illustrate the case where disconnection or short occurs on the signal line of an inverting clock signal, the foregoing is true for the case where disconnection or short occurs on the signal line of a non-inverting clock signal, except for the signal changes in the signals YI and YR. Therefore, the signals [A], [B] and [CD] change similarly, thereby enabling detection of abnormal.

In the fourth preferred embodiment, the second D-flip-flop circuit F2a, the inverter IV2, the two-input NAND circuits LN1 to LND4, and the two-input AND circuit AD1 operate closely together to function as a flip-flop circuit. This flip-flop circuit has a clock input end for receiving a signal Y outputted from a first comparator C1, an input end to which applied is a voltage signal corresponding to a logical value Hi, namely the power supply potential VDD (i.e., the input end D of the second D-flip-flop circuit F2a), and an output end for outputting an output signal (i.e., the output end Q of the second D-flip-flop circuit F2a). This flip-flop circuit has the function of outputting its voltage signal as an asserted output signal [CD] if a predetermined transition occurs in the signal Y received at the clock input end, and negating the output signal [CD] if received an asserted signal [B].

Hence, the disconnection and short detecting circuit of the fourth preferred embodiment produces the same effect as the first preferred embodiment. In addition, the size of the circuit can be reduced than the first preferred embodiment, because the fourth preferred embodiment does not require the first D-flip-flop circuit with reset function F1a, but merely requires the inverter IV2, the two-input NAND circuit LND1 to LND4, and the two-input AND circuit AD1.

Figure 14:
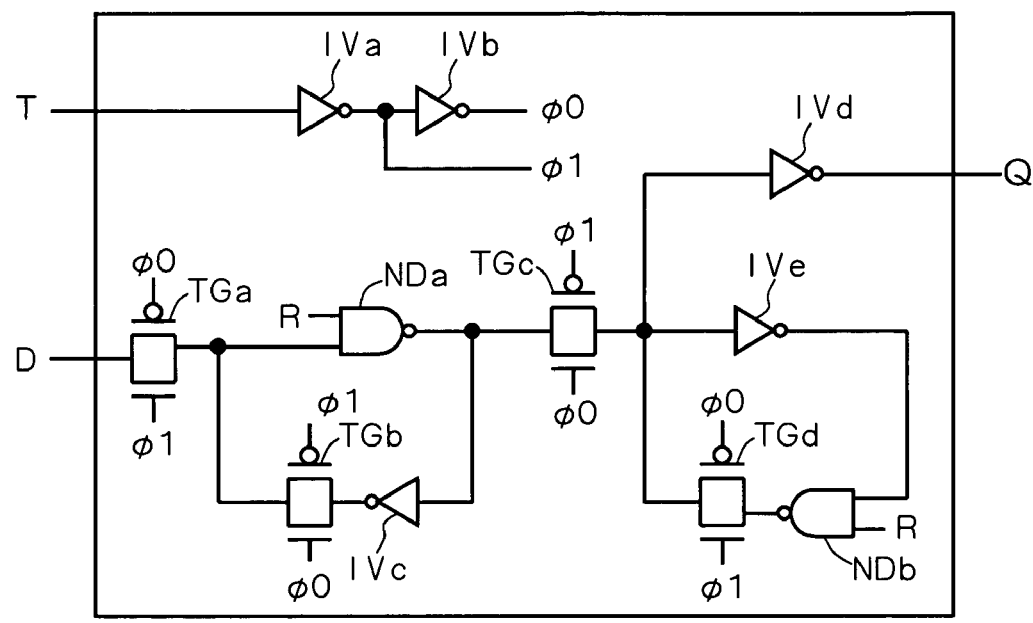
FIG. 14 is a diagram showing the configuration of a D-flip-flop with reset function (the edge trigger from Low to Hi)
Figure 15:
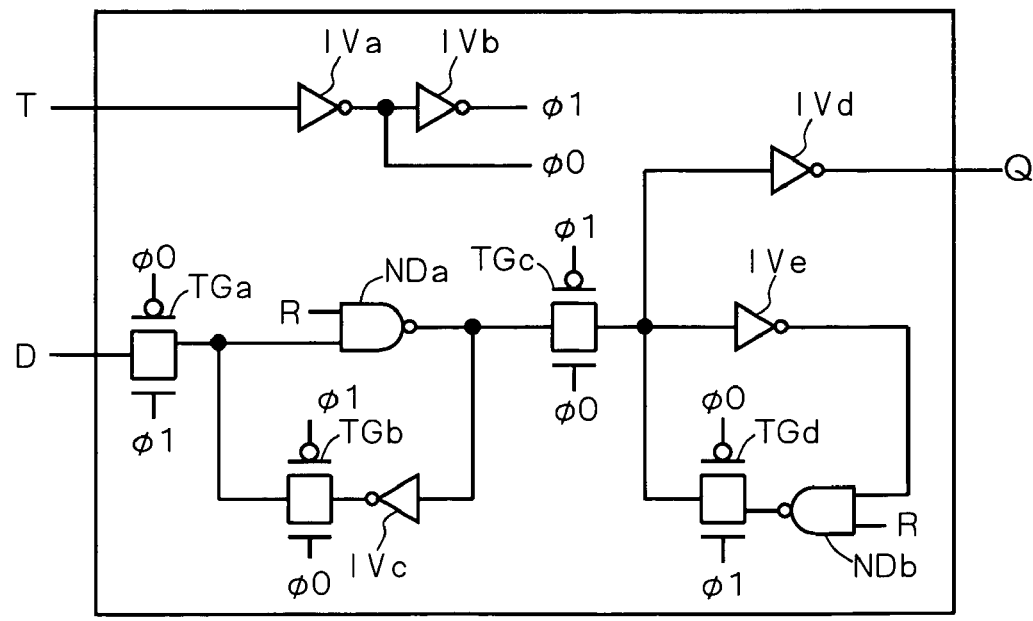
FIG. 15 is a diagram showing the configuration of the D-flip-flop with reset function (the edge trigger from Hi to Low)
Figure 16:
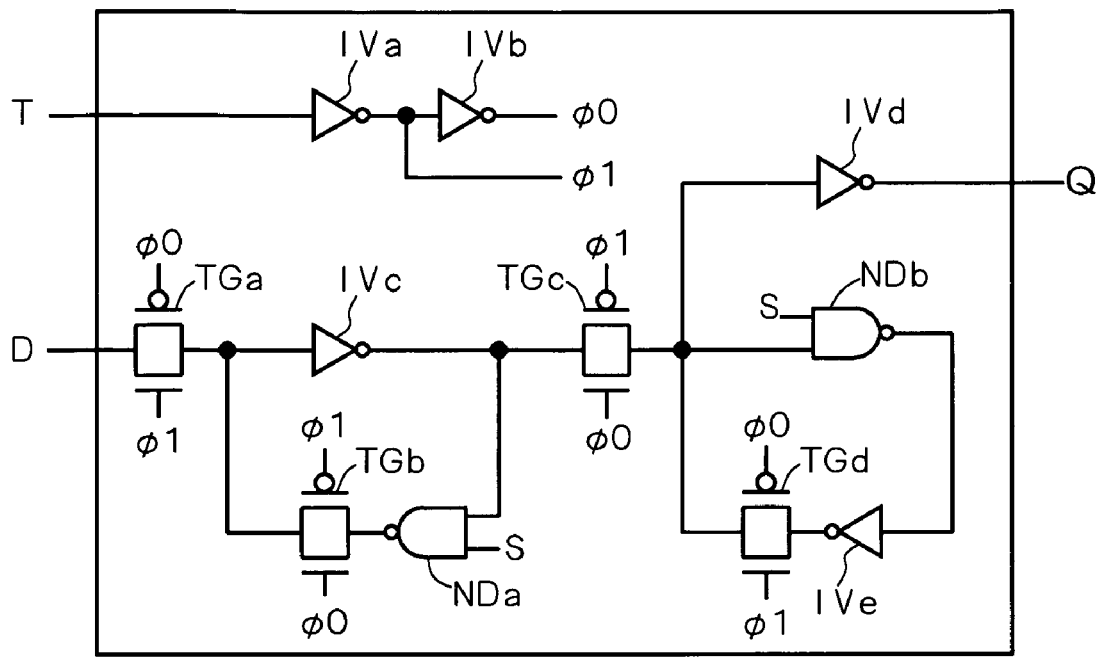
FIG. 16 is a diagram showing the configuration of a D-flip-flop with set function (the edge trigger from Low to Hi)
Figure 17:
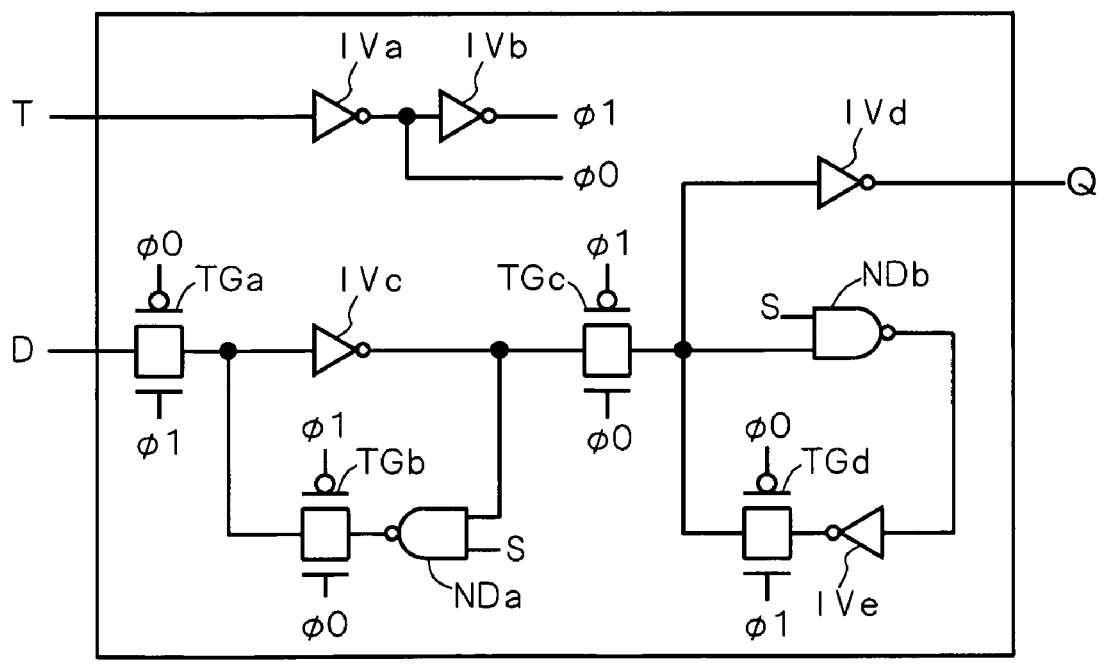
FIG. 17 is a diagram showing the configuration of the D-flip-flop with set function (the edge trigger from Hi to Low)

FIGS. 14 to 17 show examples of the configurations of a D-flip-flop with reset function and a D-flip-flop with set function. FIG. 14 is a diagram showing the configuration of a D-flip-flop with reset function F1a1 (the edge trigger from Low to Hi). FIG. 15 is a diagram showing the configuration of a D-flip-flop with reset function F1a2 (the edge trigger from Hi to Low). FIG. 16 is a diagram showing the configuration of a D-flip-flop with set function F1b1 (the edge trigger from Low to Hi). FIG. 17 is a diagram showing the configuration of a D-flip-flop with set function F1b2 (the edge trigger from Hi to Low).

Any one of the circuits shown in FIGS. 14 to 17 is composed of five inverters IVa to IVe, four transfer gates TGa to TGd, and two two-input NAND circuits NDa and NDb. In these figures, φ0 that is the output of the inverter IVa or IVb, and φ1 that is the output of the inverter IVa or IVb are applied to the characters φ0 and φ1, respectively.

The inverters and the transfer gates can be configured with a pair of CMOSs. The two-input NAND circuit can be configured with two pairs of CMOSs. Accordingly, every circuit shown in FIGS. 14 to 17 can be configured with 13 pairs of CMOSs.

In contrast, the inverter IV2, the two-input NAND circuits LND1 to LND4, and the two-input AND circuit AD1 can be configured with a pair of CMOSs, eight pairs of CMOSs, and three pairs of CMOSs, respectively. Thus, a total of 12 pairs of CMOSs are required, thereby enabling to reduce the size of the circuit.

Fifth Preferred Embodiment

A fifth preferred embodiment is a modification of the disconnection and short detecting circuit of the first preferred embodiment. Specifically, not only the path of a two-input NOR circuit NR1 for detecting the case where signals YI and YR are Low output, but also the path of a two-input AND circuit AD2 for detecting the case where the signals YI and YR are Hi output is disposed as a signal output circuit.

Figure 18:
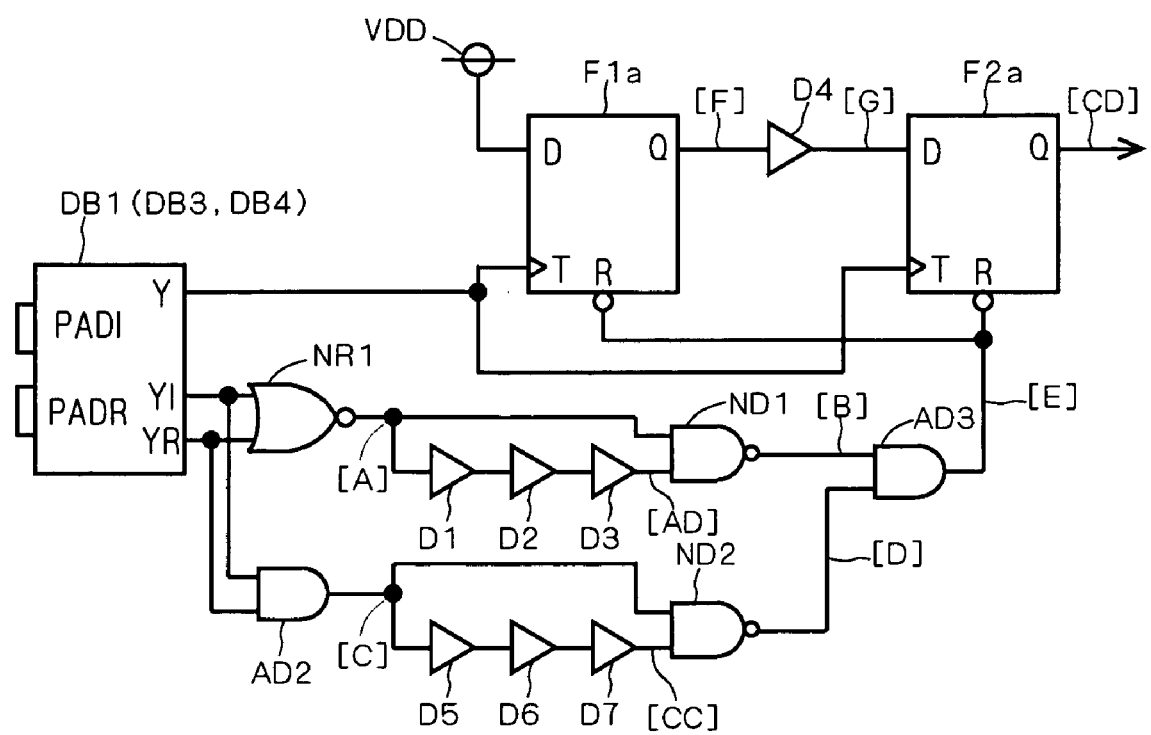
FIG. 18 is a diagram showing a disconnection and short detecting circuit according to a fifth preferred embodiment of the present invention.

FIG. 18 is a diagram showing a disconnection and short detecting circuit in accordance with the fifth preferred embodiment. In this preferred embodiment, both of the signals YI and YR are also inputted to a two-input AND circuit AD2 that is one of logical gate circuits. An output [C] of the two-input AND circuit AD2 is delayed for a predetermined period of time by a delay circuit composed of a plurality of delay stages D5 to D7 connected in series. An output [CC] from the delay stage D7 and the output [C] of the two-input AND circuit AD2 are inputted to a two-input NAND circuit ND2. A signal [D] is outputted from the two-input NAND circuit ND2. A signal [B] from the two-input NAND circuit ND1 and the signal [D] from the two-input NAND circuit ND2 are inputted to a two-input AND circuit AD3. A signal [E] outputted from the two-input AND circuit AD3 is inputted to respective reset terminals R of first and second D-flip-flop circuits F1a and F2a.

In addition to the two-input NOR circuit NR1, the plurality of delay stages D1 to D3, and the two-input NAND circuit ND1, the two-input AND circuit AD2, the plurality of delay stages D5 to D7, and the two-input NAND circuit ND2 function as a first signal output circuit that asserts and outputs the signal [E] if the logical values outputted from second and the third comparators C2 and C3 are equal for a predetermined period of time or more.

The operation of this disconnection and short detecting circuit will next be described by using the timing charts of FIGS. 19 to 22.

Figure 19:
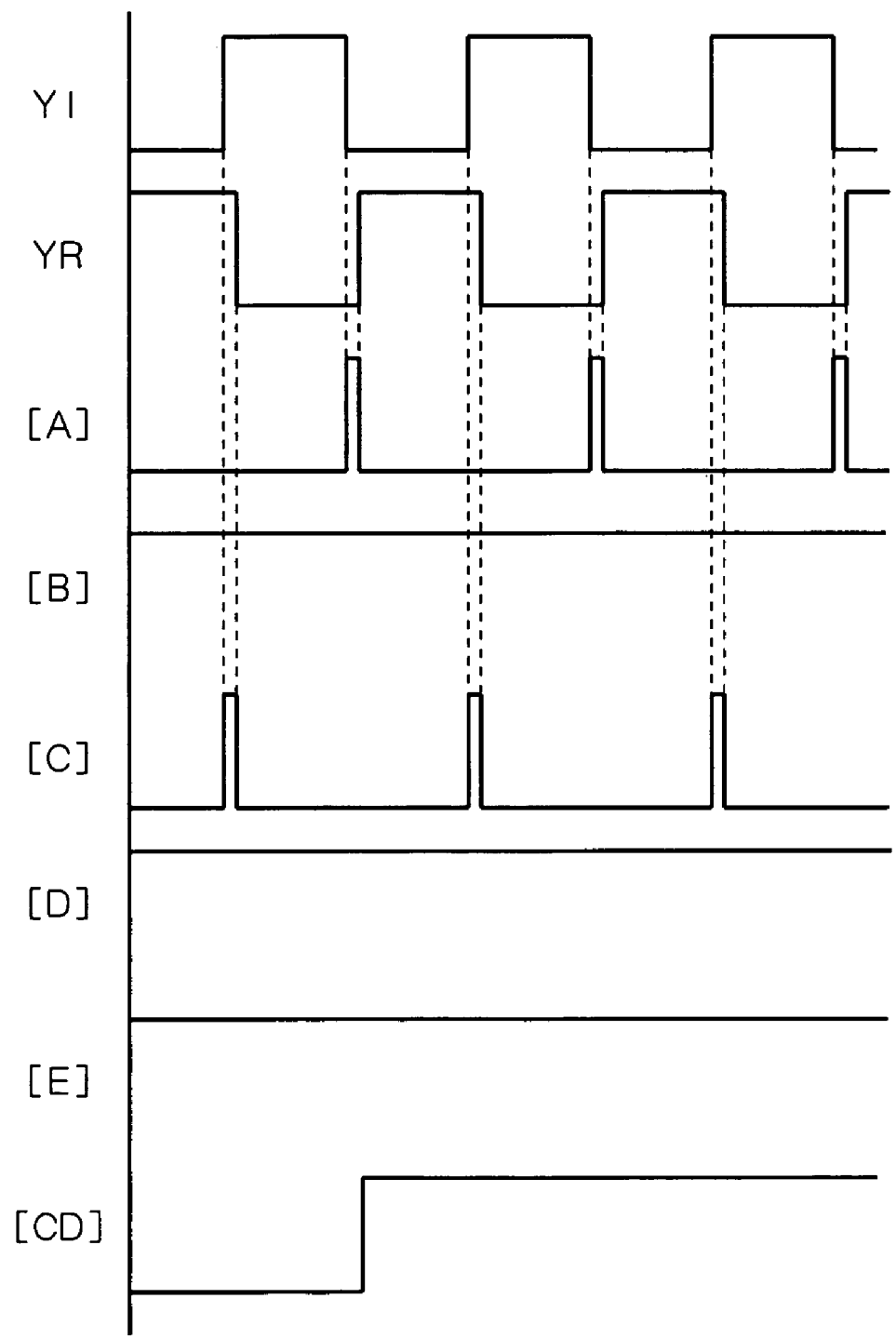
FIG. 19 is a timing chart showing changes in the signals of respective parts during normal operation in the disconnection and short detecting circuit of the fifth preferred embodiment.
Figure 20:
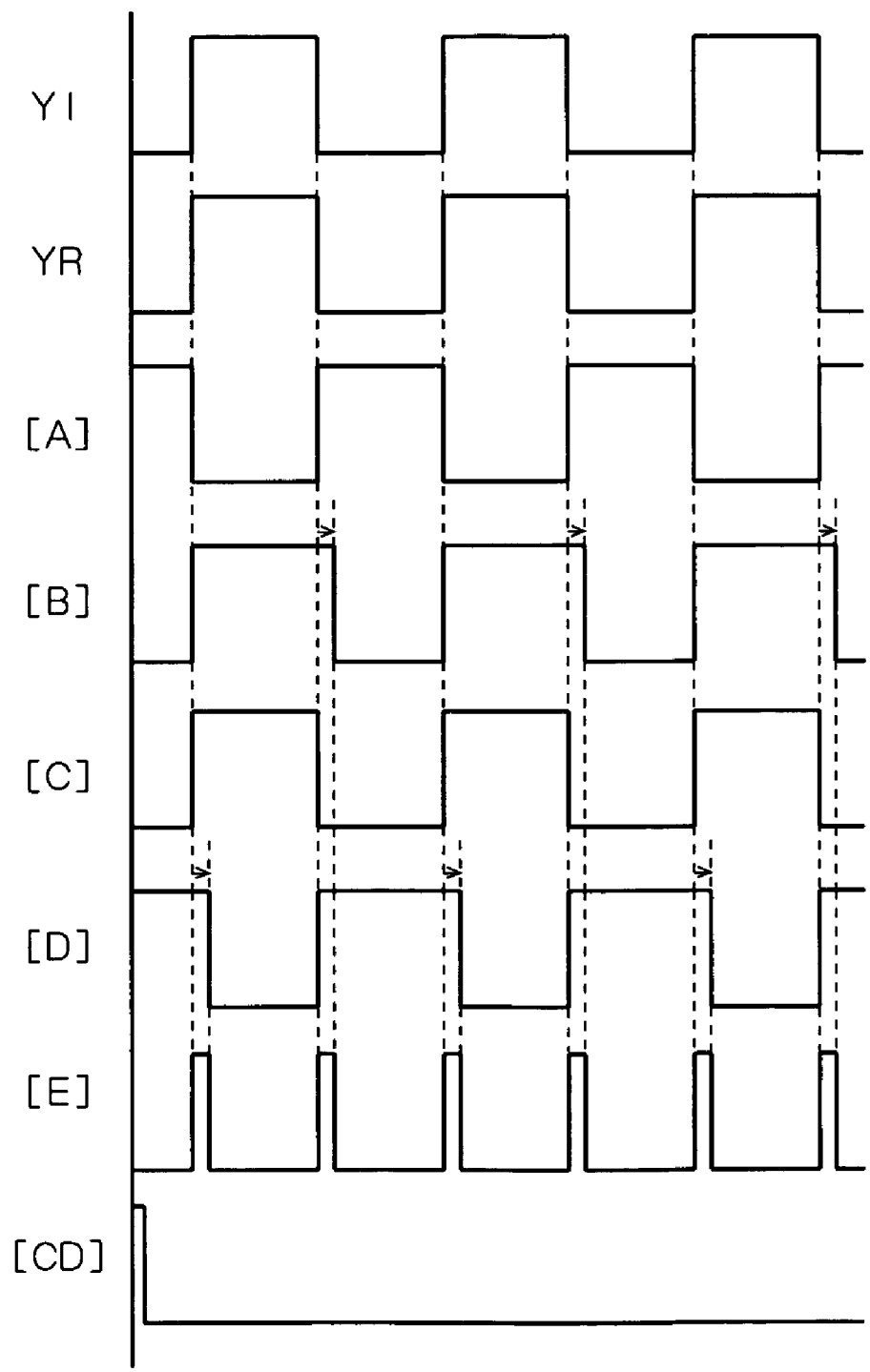
FIG. 20 is a timing chart showing changes in the signals of the respective parts when an inverting clock signal line is disconnected in the disconnection and short detecting circuit of the fifth preferred embodiment.
Figure 21:
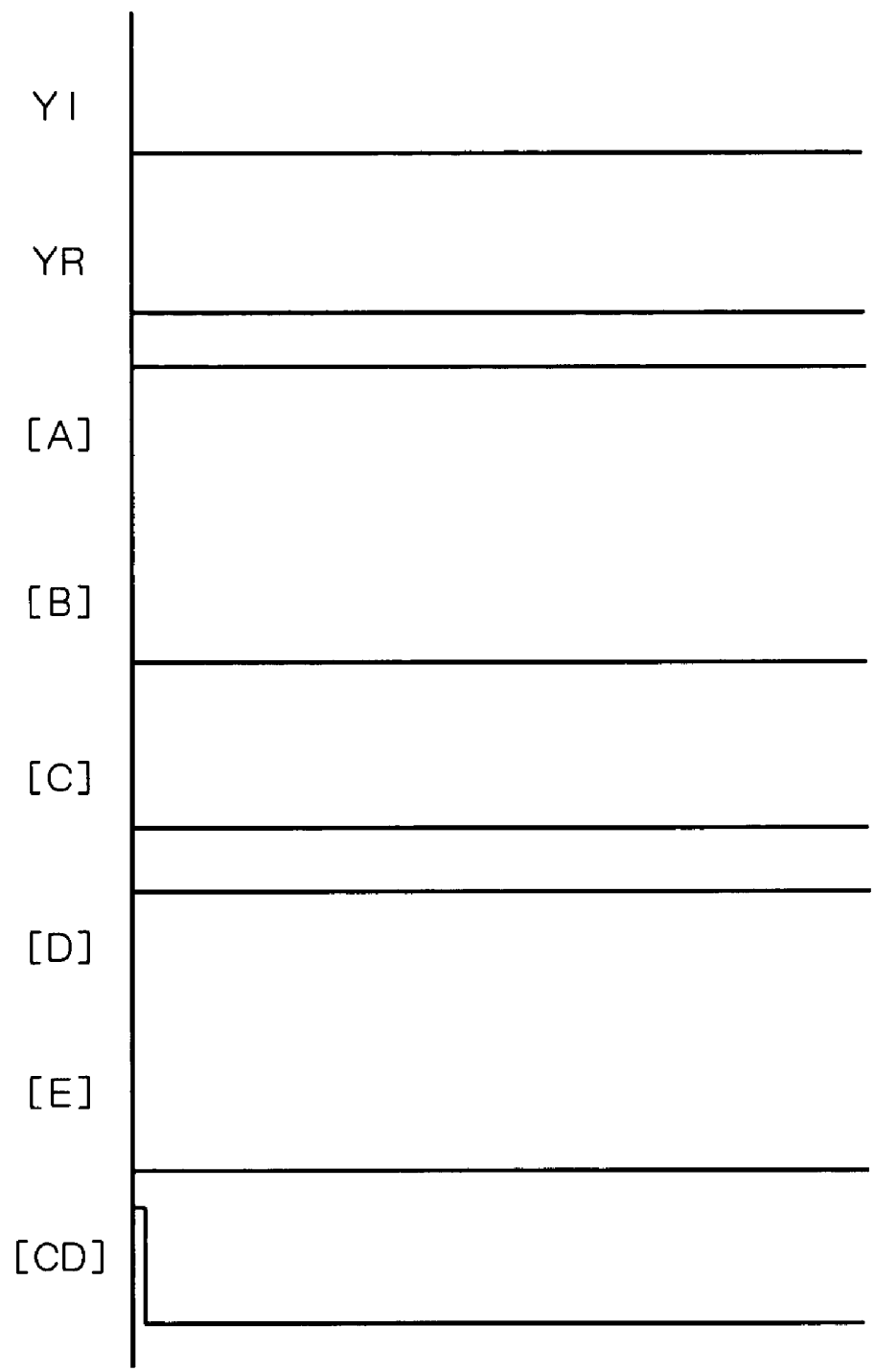
FIG. 21 is a timing chart showing changes in the signals of the respective parts when a non-inverting clock signal line and an inverting clock signal line are short-circuited to a grounding potential VSS in the disconnection and short detecting circuit of the fifth preferred embodiment.
Figure 22:
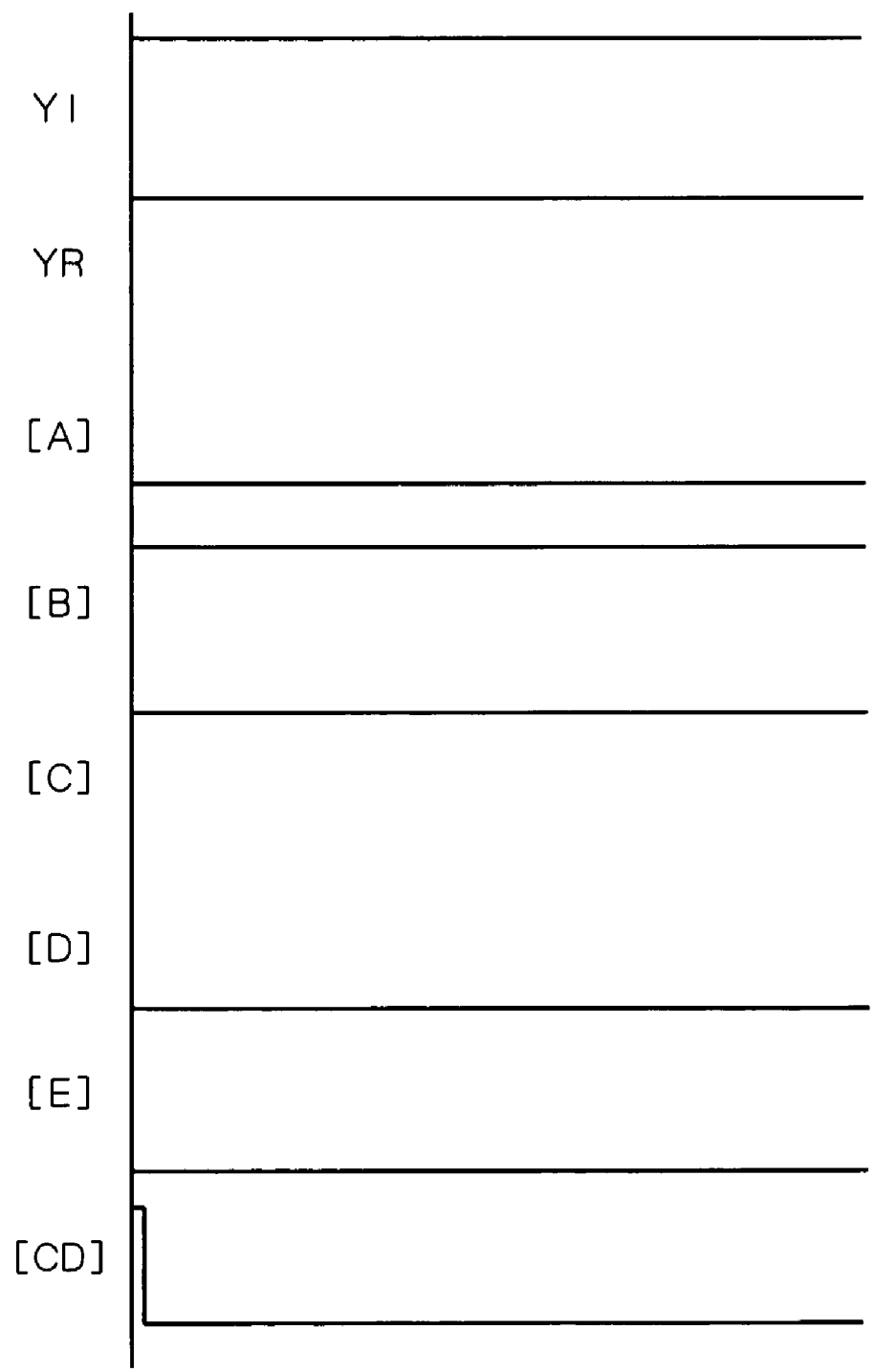
FIG. 22 is a timing chart showing changes in the signals of the respective parts when a non-inverting clock signal line and an inverting clock signal are short-circuited to a power supply potential VDD in the disconnection and short detecting circuit of the fifth preferred embodiment.

The timing chart of FIG. 19 shows signal changes of respective parts during normal operation, during which neither disconnection nor short occurs on the signal lines of a non-inverting clock signal and an inverting clock signal. The timing chart of FIG. 20 shows signal changes of the respective parts when disconnection occurs on the signal line of the inverting clock signal. The timing chart of FIG. 21 shows signal changes of the respective parts when short to a grounding potential VSS occurs on the signal lines of the non-inverting clock signal and the inverting clock signal. The timing chart of FIG. 22 shows signal changes of the respective parts when short to a power supply potential VDD occurs on the signal lines of the non-inverting clock signal and the inverting clock signal.

During normal operation, like the case of FIG. 3, the non-inverting clock signal at the first clock input end PAD1 and the inverting clock signal at the second clock input end PADR, which are in opposite phases, repeat transition between states of Hi and Low. Thereby, the signals YI and YR, which are in opposite phases, repeat transition between states of Hi and Low, as shown in FIG. 19.

Here, the signal [A] outputted from the two-input NOR circuit NR1 becomes Hi when both of the signals YI and YR are Low, and becomes Low in other instances. Like FIG. 3, FIG. 19 shows the case where there is a slight phase shift between the change of the signal YI and the change of the signal YR. Accordingly, when both of the signals YI and YR are Low, a brief pulse shape Hi appears in the signal [A], so that the signal [B] continues to output Hi, as in FIG. 3.

The signal [C] outputted from the two-input AND circuit AD2 becomes Hi when both of the signals YI and YR are Hi, and becomes Low in other instances. Like FIG. 3, FIG. 19 shows the case where there is a slight phase shift between the change of the signal YI and the change of the signal YR. Accordingly, when both of the signals YI and YR are High, a brief pulse shape Hi appears in the signal [C]. Like the signal [B], the signal [D] continues to output Hi.

Thus, the signals [B] and [D] continue to output Hi, as shown in FIG. 19. As a result, the signal [E] outputted from the two-input AND circuit AD3 does not become Low, and no reset is performed at the second D-flip-flop circuit F2a. Accordingly the second D-flip-flop circuit F2a asserts, as a signal [G], the power supply potential VDD which is asserted by the first D-flip-flop circuit F1a, and then outputs it, as a signal [CD], by the fall transition from Hi to Low of a signal Y, for example.

Since this signal [CD] continues to output Hi, neither disconnection nor short occurs on the signal line and it is judged to be normal.

On the other hand, if disconnection occurs on the signal line of an inverting clock signal, a signal, which changes in the same phase as a non-inverting clock signal, appears at the second clock input end PADR, as in the case of FIG. 4. Thereby, the same signal change as in the signal YI appears in the signal YR, as shown in FIG. 20.

Here, the signal [A] outputted from the two-input NOR circuit NR1 becomes Hi when both of the signals YI and YR are Low, and becomes Low in other instances. In FIG. 20, as in FIG. 4, a longer pulse shape Hi than that in FIG. 19 appears in the signal [A] when both of the signals YI and YR are Low. Like FIG. 4, a pulse shape Low appears in the signal [B], and the signal [B] repeats transition between states of Hi and Low.

The signal [C] outputted from the two-input AND circuit AD2 becomes Hi when both of the signals YI and YR are Hi, and becomes Low in other instances. As in the signal [A], a longer pulse shape Hi than that in FIG. 19 appears in the signal [C] when both of the signals YI and YR are Hi. As in the signal [B], a pulse shape Low appears in the signal [D], and the signal [D] repeats transition between states of Hi and Low.

At this time, the period of time that either of the signals [B] and [D] becomes Low is relatively long. As a result, the signal [E] outputted from the two-input AND circuit AD3 becomes Low, and reset is performed at the second D-flip-flop circuit F2a. Accordingly the second D-flip-flop circuit F2a does not assert the signal [G], and the signal [CD] continues to output Low.

Since this signal [CD] continues to output Low, disconnection or short occurs on the signal line and it is judged to be abnormal.

If short to a grounding potential VSS occurs on both of the signal lines of a non-inverting clock signal and an inverting clock signal, Low corresponding to the grounding potential VSS appears at the first and the second clock input ends PADI and PADR. Thereby, Low appears in the signals Y and YR, as shown in FIG. 21.

Here, the signal [A] outputted from the two-input NOR circuit NR1 continues to output Hi because the signals YI and YR are Low. Accordingly the signal [B] continues to output Low.

The signal [C] outputted from the two-input AND circuit AD2 continues to output Low because the signals YI and YR are Low. Accordingly the signal [D] continues to output High.

As a result, the signal [E] outputted from the two-input AND circuit AD3 becomes Low, and reset is performed at the second D-flip-flop circuit F2a. Therefore, the second D-flip-flop circuit F2a does not assert the signal [CD], and the signal [CD] continues to output Low.

Since this signal [CD] continues to output Low, disconnection or short occurs on the signal line and it is judged to be abnormal.

If short to a power supply potential VDD occurs on both of the signal lines of a non-inverting clock signal and an inverting clock signal, Hi corresponding to the power supply potential VDD appears at the first and the second clock input ends PADI and PADR. Thereby, Hi appears in the signals YI and YR, as shown in FIG. 22.

Here, the signal [A] outputted from the two-input NOR circuit NR1 continues to output Low because the signals YI and YR are Hi. Accordingly the signal [B] continues to output Hi.

The signal [C] outputted from the two-input AND circuit AD2 continues to output Hi because the signals YI and YR are Hi. Accordingly the signal [D] continues to output Low.

As a result, the signal [E] outputted from the two-input AND circuit AD3 becomes Low, and reset is performed at the second D-flip-flop circuit F2a. Therefore, the second D-flip-flop circuit F2a does not assert the signal [CD], and the signal [CD] continues to output Low.

Since this signal [CD] continues to output Low, disconnection or short occurs on the signal line and it is judged to be abnormal.

The disconnection and short detecting circuit of the fifth preferred embodiment includes, as a logical gate circuit, the two-input AND circuit AD2 that receives the outputs of the second and the third comparators C2 and C3. It is therefore able to assert the signals [A] and [C] if the logical values outputted from the second and the third comparators C2 and C3 are Hi.

Sixth Preferred Embodiment

A sixth preferred embodiment is also a modification of the disconnection and short detecting circuit of the first preferred embodiment. Specifically, a two-input EXNOR circuit is employed in place of the two-input NOR circuit NR1 in the first preferred embodiment.

Figure 23:
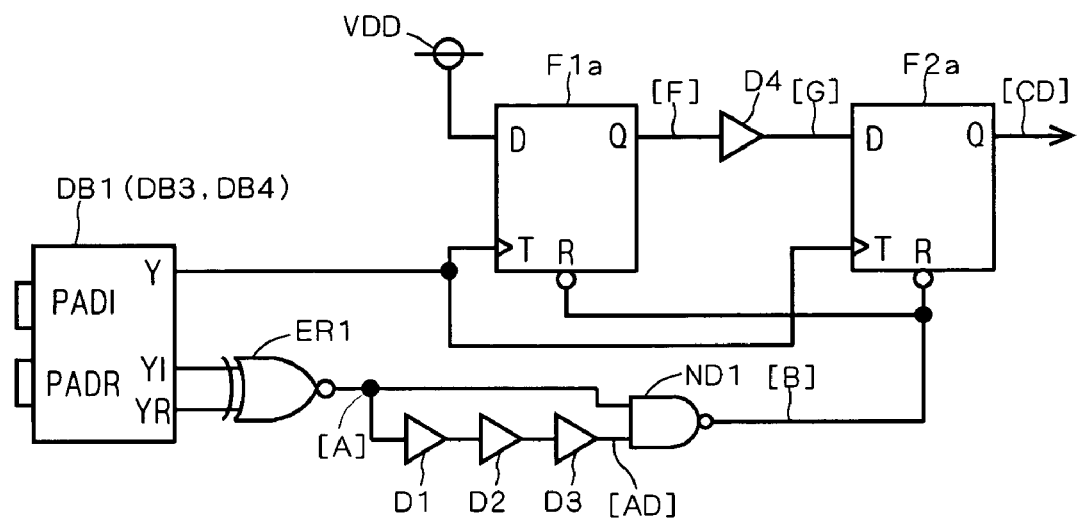
FIG. 23 is a diagram showing a disconnection and short detecting circuit according to a sixth preferred embodiment of the present invention.

FIG. 23 is a diagram showing a disconnection and short detecting circuit in accordance with the sixth preferred embodiment. The device configuration is the same as in FIG. 1, except that the two-input NOR circuit NR1 is replaced with the two-input EXNOR circuit ER1.

The EXNOR circuit ER1, a plurality of delay stages D1 to D3, and a two-input NAND circuit ND1 function as a first signal output circuit that asserts and outputs a signal [B] if the logical values outputted from second and third comparators C2 and C3 are equal for a predetermined period of time or more.

The operation of this disconnection and short detecting circuit will next be described by using the timing charts of FIGS. 24 to 27.

Figure 24:
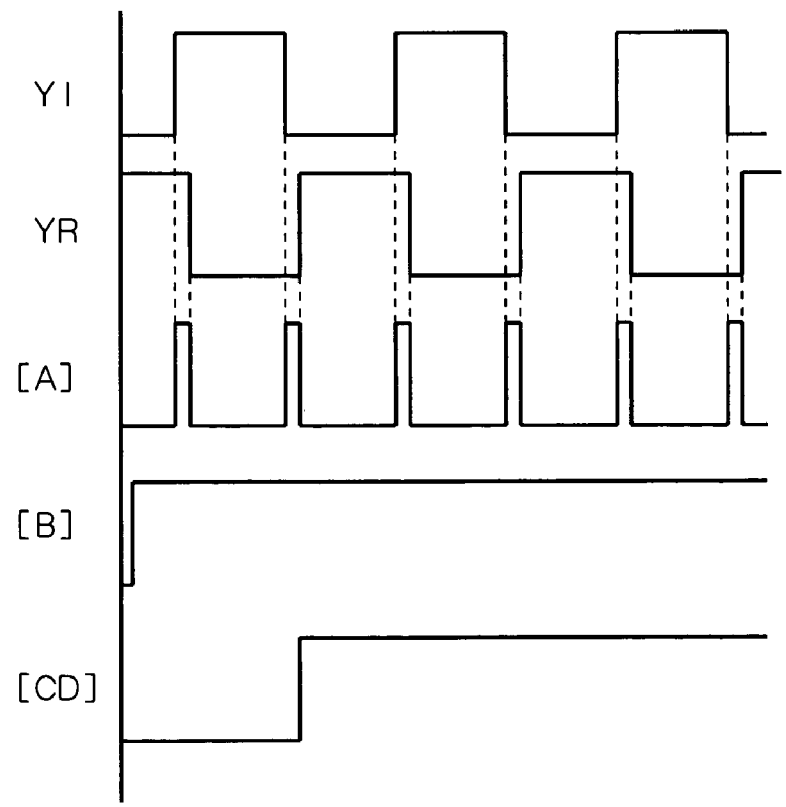
FIG. 24 is a timing chart showing changes in the signals of respective parts during normal operation in the disconnection and short detecting circuit of the sixth preferred embodiment.
Figure 25:
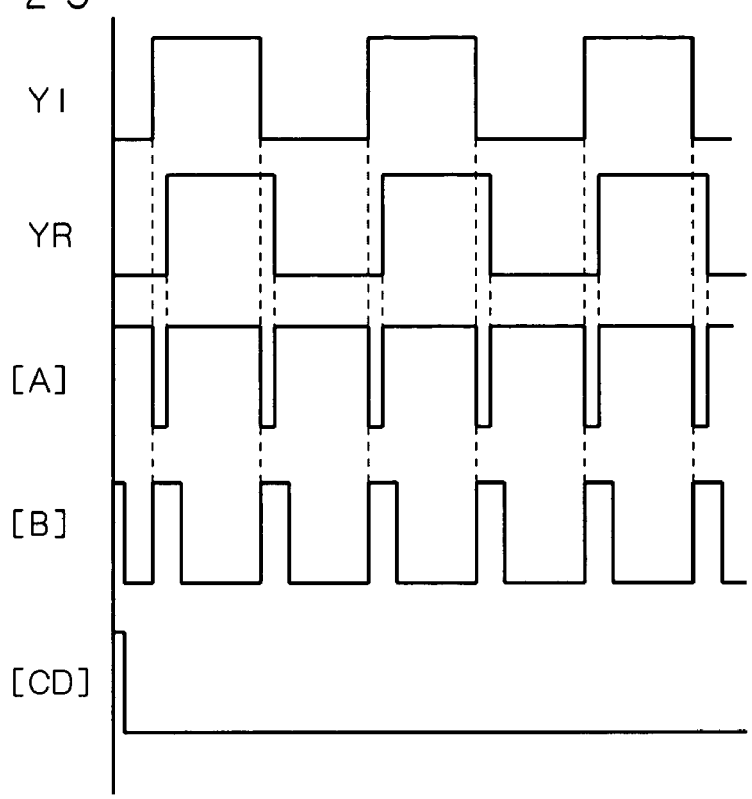
FIG. 25 is a timing chart showing changes in the signals of the respective parts when an inverting clock signal line is disconnected in the disconnection and short detecting circuit of the sixth preferred embodiment.
Figure 26:
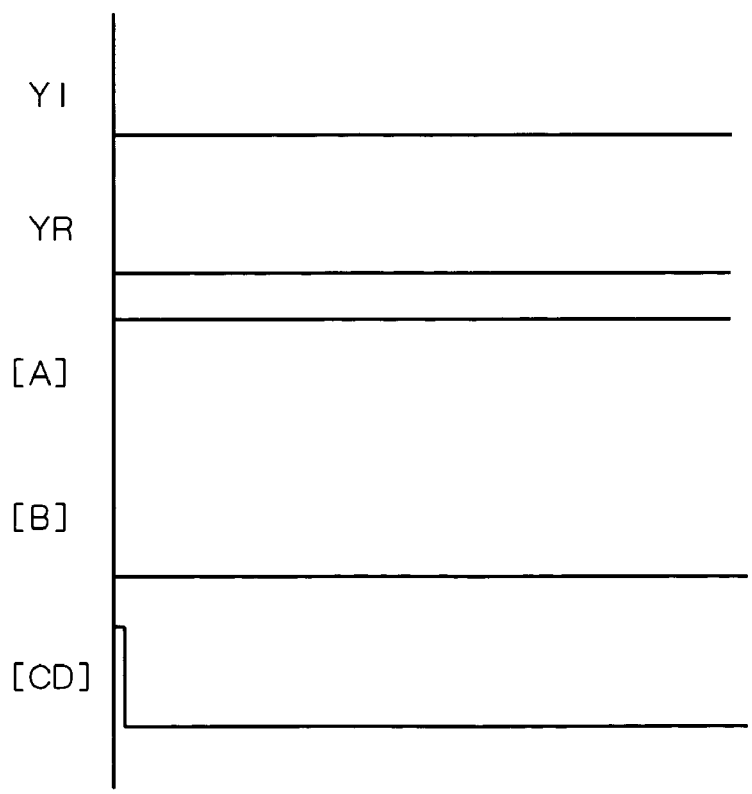
FIG. 26 is a timing chart showing changes in the signals of the respective parts when an inverting clock signal line is short-circuited to a grounding potential VSS in the disconnection and short detecting circuit of the sixth preferred embodiment.
Figure 27:
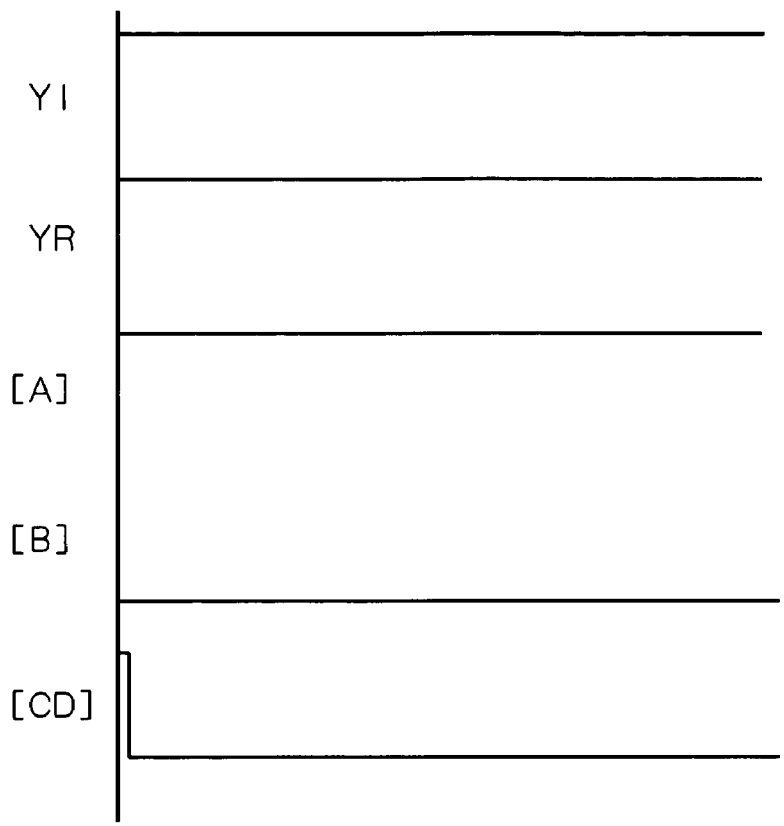
FIG. 27 is a timing chart showing changes in the signals of the respective parts when an inverting clock signal line is short-circuited to a power supply potential VDD in the disconnection and short detecting circuit of the sixth preferred embodiment.

The timing chart of FIG. 24 shows signal changes of respective parts during normal operation, during which neither disconnection nor short occurs on the signal lines of a non-inverting clock signal and an inverting clock signal. The timing chart of FIG. 25 shows signal changes of the respective parts when disconnection occurs on the signal line of the inverting clock signal. The timing chart of FIG. 26 shows signal changes of the respective parts when short to a grounding potential VSS occurs on the signal lines of the non-inverting clock signal and the inverting clock signal. The timing chart of FIG. 27 shows signal changes of the respective parts when short to a power supply potential VDD occurs on the signal lines of the non-inverting clock signal and the inverting clock signal.

During normal operation, as in FIG. 3, the non-inverting clock signal at the first clock input end PAD1 and the inverting clock signal at the second clock input end PADR, which are in opposite phases, repeat transition between states of Hi and Low. Thereby, signals YI and YR, which are in opposite phases, repeat transition between states of Hi and Low, as shown in FIG. 24.

Here, the signal [A] outputted from the two-input EXNOR circuit ER1 becomes Hi when both of the signals YI and YR are Low or Hi, and becomes Low in other instances. Like FIG. 3, FIG. 24 shows the case where there is a slight phase shift between the change of the signal YI and the change of the signal YR. Accordingly, when both of the signals YI and YR are Low or Hi, a brief pulse shape Hi appears in the signal [A], so that the signal [B] continues to output Hi, as in FIG. 3.

Therefore, the signal [B] continues to output Hi, as shown in FIG. 24. As a result, the signal [B] does not become Low, and no reset is performed at the second D-flip-flop circuit F2a. Accordingly the second D-flip-flop circuit F2a asserts, as a signal [G], the power supply potential VDD which is asserted by the first D-flip-flop circuit F1a, and then outputs it, as a signal [CD], by the fall transition from Hi to Low of a signal Y, for example.

Since this signal [CD] continues to output Hi, neither disconnection nor short occurs on the signal line and it is judged to be normal.

On the other hand, if disconnection occurs on the signal line of an inverting clock signal, a signal, which changes in the same phase as a non-inverting clock signal, appears at the second clock input end PADR, as in the case of FIG. 4. Thereby, the same signal change as in the signal YI appears in the signal YR, as shown in FIG. 25.

Here, the signal [A] outputted from the two-input EXNOR circuit ER1 becomes Hi when both of the signals YI and YR are Low or Hi, and becomes Low in other instances. In FIG. 25, a longer pulse shape Hi than the case of FIG. 24 appears in the signal [A] when both of the signals YI and YR are Low or Hi. As a result, the signal [B] outputted from the two-input NAND circuit ND1 becomes Low, and reset is performed at the second D-flip-flop circuit F2a. Accordingly the second D-flip-flop circuit F2a does not assert the signal [CD], and the signal [CD] continues to output Low.

Since this signal [CD] continues to output Low, disconnection or short occurs on the signal line and it is judged to be abnormal.

If short to a grounding potential VSS occurs on both of the signal lines of a non-inverting clock signal and an inverting clock signal, Low corresponding to the grounding potential VSS appears at the first and the second clock input ends PAD1 and PADR. Thereby, Low appears in the signals YI and YR, as shown in FIG. 26.

Here, the signal [A] outputted from the two-input EXNOR circuit ER1 continues to output Hi because the signals YI and YR are Low. Therefore, the signal [B] continues to output Low.

As a result, the signal [B] outputted from the two-input NAND circuit ND1 becomes Low, and reset is performed at the second D-flip-flop circuit F2a. Accordingly the signal [CD] continues to output Low.

Since this signal [CD] continues to output Low, disconnection or short occurs on the signal line and it is judged to be abnormal.

If short to a power supply potential VDD occurs on both of the signal lines of a non-inverting clock signal and an inverting clock signal, Hi corresponding to the power supply potential VDD appears at the first and the second clock input ends PAD1 and PADR. Thereby, Hi appears in the signals YI and YR, as shown in FIG. 27.

Here, the signal [A] outputted from the two-input EXNOR circuit ER1 continues to output Hi because the signals YI and YR are Hi. Therefore, the signal [B] continues to output Low.

As a result, the signal [B] outputted from the two-input NAND circuit ND1 becomes Low, and reset is performed at the second D-flip-flop circuit F2a. Accordingly the second D-flip-flop circuit F2a does not assert the signal [CD], and the signal [CD] continues to output Low.

Since this signal [CD] continues to output Low, disconnection or short occurs on the signal line and it is judged to be abnormal.

The disconnection and short detecting circuit of the sixth preferred embodiment includes, as a logical gate circuit, the two-input EXNOR circuit ER1 that receives the outputs of the second and the third comparators C2 and C3. It is therefore able to assert the signal [A] if both of the logical values outputted from the second and the third comparators C2 and C3 are Hi or Low. By replacing the two-input NOR circuit NR1 with the two-input EXNOR circuit ER1, the same effect as the fifth preferred embodiment is obtainable with less number of elements than the fifth preferred embodiment. Specifically, the two-input EXNOR circuit ER1 can be configured with ten elements of MOS transistors, the number of which is less than the case of disposing the delay stages D5 to D7, the two-input NAND circuit ND2, and the AND circuits AD2 and AD3.

Seventh Preferred Embodiment

A seventh preferred embodiment is a modification of the disconnection and short detecting circuit of the first preferred embodiment. Specifically, it is arranged to further include a selector circuit that can select and output, as an output of a delay circuit, one of the outputs of a plurality of delay stages D1 to D3 to a two-input NAND circuit ND1.

Figure 28:
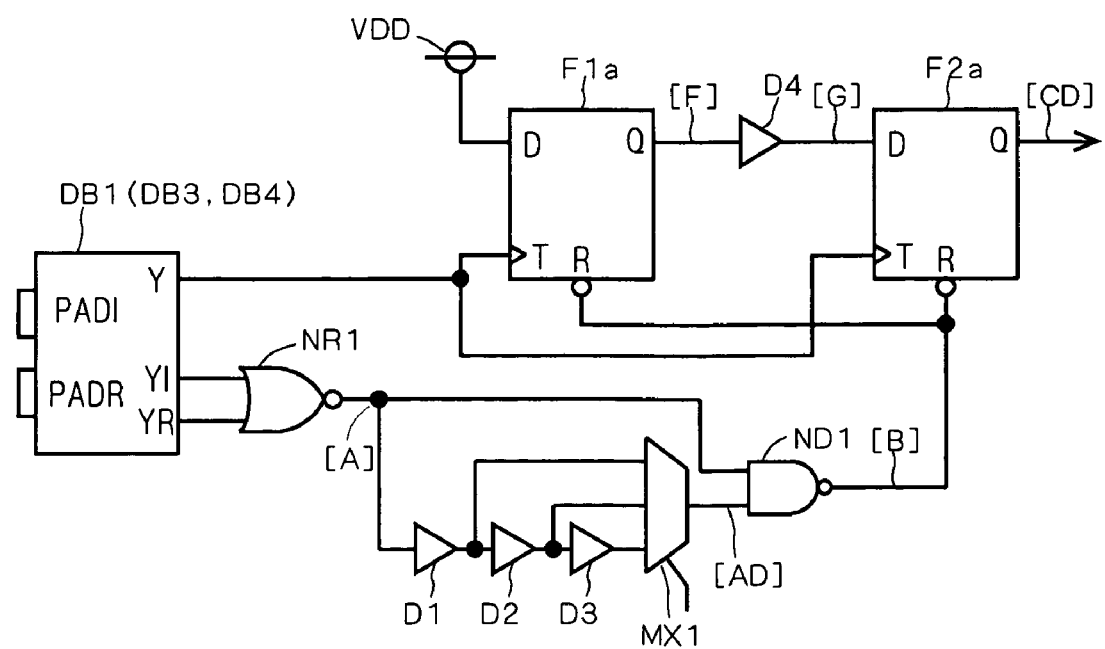
FIG. 28 is a diagram showing a disconnection and short detecting circuit according to a seventh preferred embodiment of the present invention.

FIG. 28 is a diagram showing a disconnection and short detecting circuit in accordance with the seventh preferred embodiment. The device configuration of FIG. 28 is the same as that in FIG. 1, except to further include a selector circuit MX1 that can select and output, as an output [AD] of the delay circuit, one of the outputs of the plurality of delay stages D1 to D3 to the two-input NAND circuit ND1.

The operation of this disconnection and short detecting circuit will next be described by using the timing charts of FIGS. 29 and 30.

Figure 29:
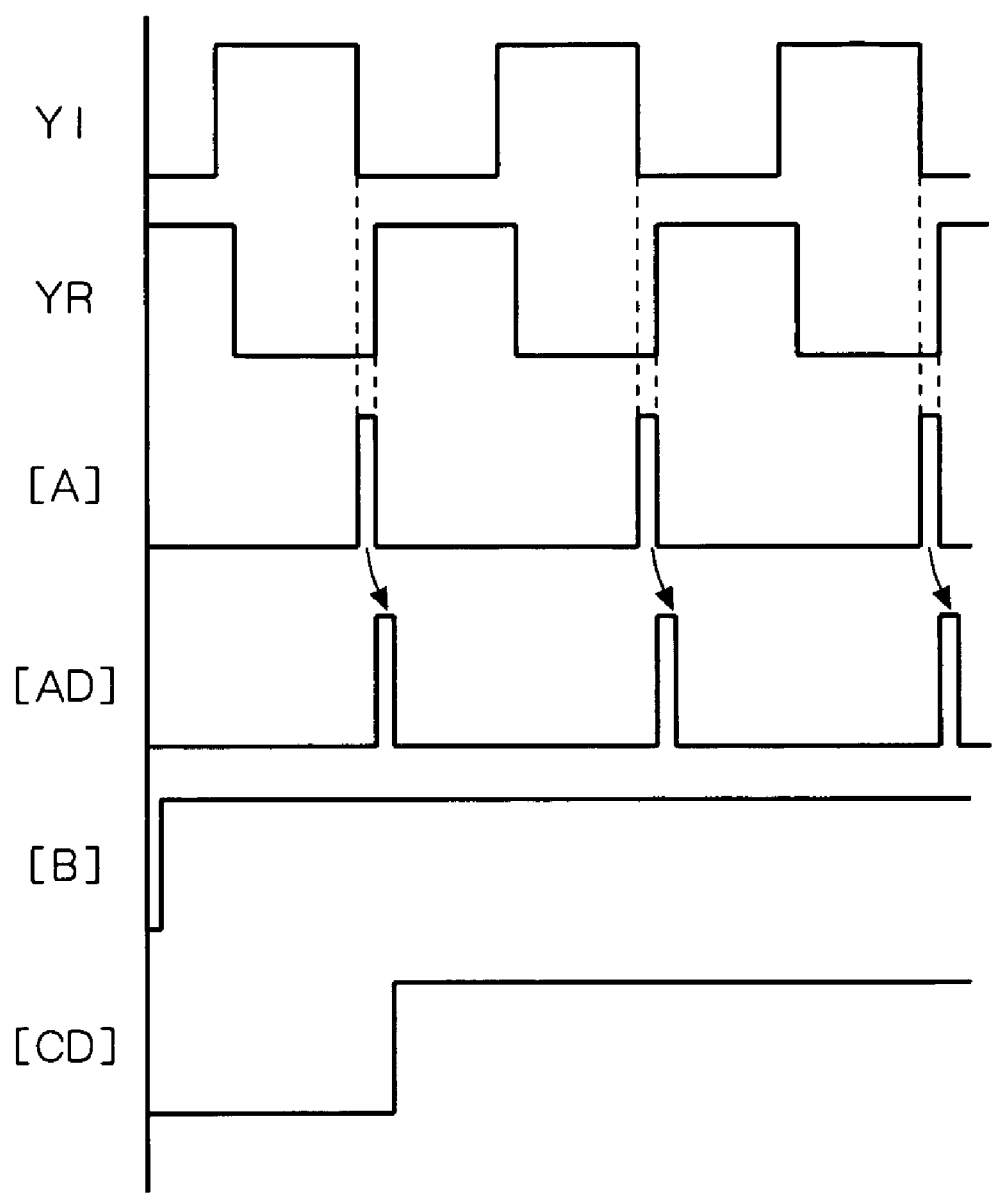
FIG. 29 is a timing chart showing changes in the signals of respective parts during the normal operation of a short period clock in the disconnection and short detecting circuit of the seventh preferred embodiment.

The timing chart of FIG. 29 shows signal changes of respective parts during normal operation, during which neither disconnection nor short occurs, in the case where a non-inverting clock signal and an inverting clock signal are short period clocks. The timing chart of FIG. 30 shows signal changes of respective parts during normal operation, during which neither disconnection nor short occurs, in the case where a non-inverting clock signal and an inverting clock signal are long period clocks.

Even during normal operation, a short Hi pulse equivalent to skew appears in the signal [A] outputted from the two-input NOR circuit NR1. However, if a non-inverting clock signal and an inverting clock signal become long period clocks, their pulse widths increase. Here, assuming that the delay amount at the plurality of delay stages D1 to D3 is able to have only the value to meet a short period, there is the possibility that Low may erroneously be outputted to the output [B] outputted from the two-input NAND circuit ND1.

Hence, in the seventh preferred embodiment, the delay amount on the delay circuit is decreased if a non-inverting clock signal and an inverting clock signal are short period clocks, whereas the delay amount on the delay circuit is increased if they are long period clocks.

In FIG. 29, the pulse width of a brief Hi pulse equivalent to skew in the signal [A] is sufficiently small. Therefore, it may be arranged such that a switch signal is applied from the exterior so as to control the selector circuit MX1, and the output of the first delay stage D1 is selected and outputted, as an output of the delay circuit, to the two-input NAND circuit ND1. With this arrangement, it is able to obtain an inverted AND on the two-input NAND circuit ND1 with a small amount of delay. This avoids that Low is erroneously outputted to the output [B].

Figure 30:
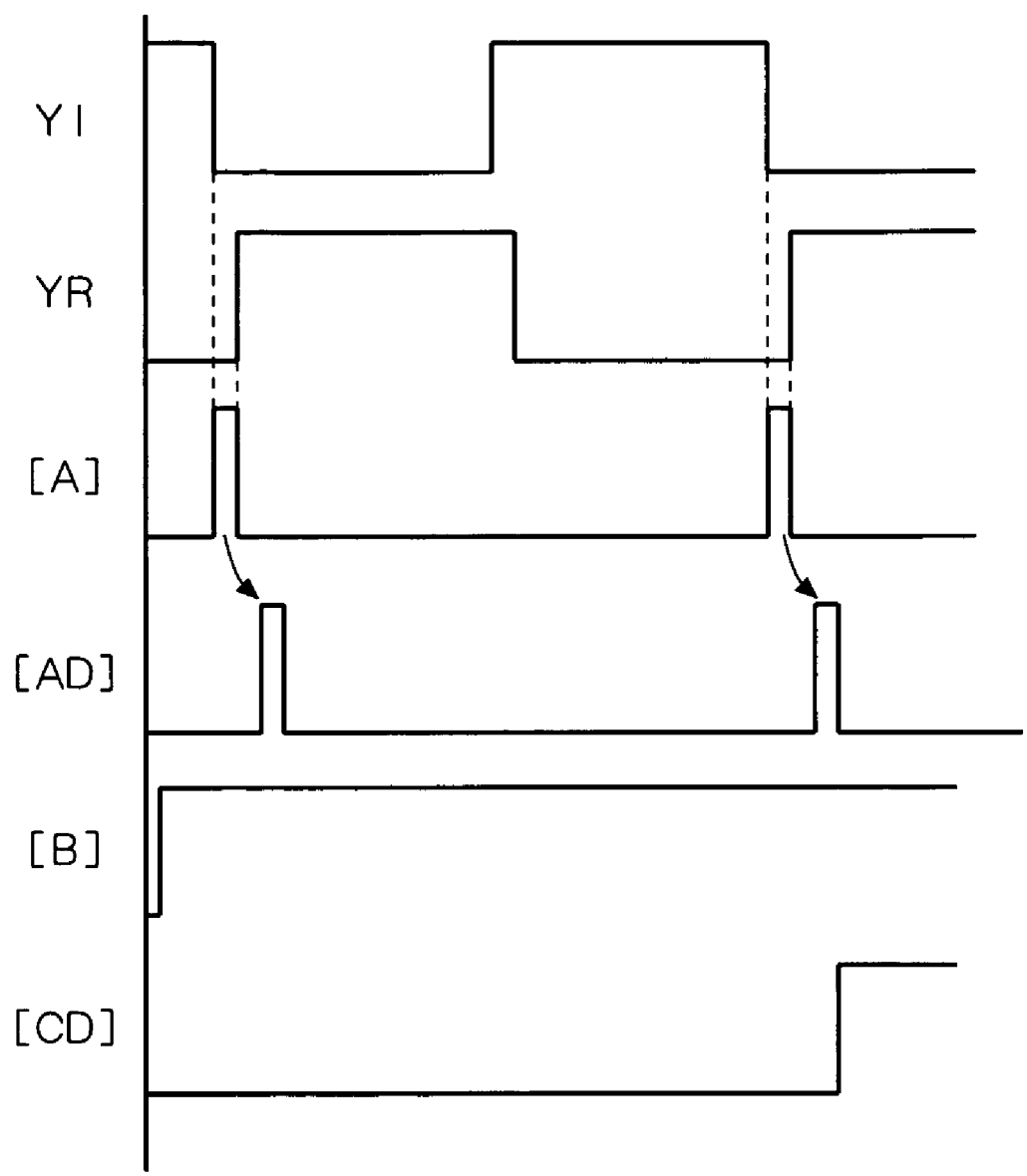
FIG. 30 is a timing chart showing changes in the signals of the respective parts during the normal operation of a long period clock in the disconnection and short detecting circuit of the seventh preferred embodiment.

On the other hand, in FIG. 30, the pulse width of a brief Hi pulse equivalent to skew in the signal [A] is large. Therefore, there is the possibility that Low is erroneously outputted to the output [B] with the delay amount only at the first delay stage D1. Therefore, it may be arranged such that a switch signal is applied from the exterior so as to control the selector circuit MX1 and, for example, the output of the final delay stage D3 is selected and outputted as an output of the delay circuit, to the two-input NAND circuit ND1. With this arrangement, it is able to obtain an inverted AND on the two-input NAND circuit ND1 with a large amount of delay, thereby avoiding that Low is erroneously outputted to the output [B].

In accordance with the disconnection and short detecting circuit of the seventh preferred embodiment, the delay amount on the delay circuit can be set suitably according to the frequency of a non-inverting clock signal and the frequency of an inverting clock signal, by the presence of the selector circuit MX1 that can select and output, as an output of the delay circuit, one of the outputs of the plurality of delay stages D1 to D3 to the two-input NAND circuit ND1.

Eighth Preferred Embodiment

An eighth preferred embodiment is a modification of the disconnection and short detecting circuit of the first preferred embodiment. Specifically, the plurality of delay stages D1 to D3 of the first preferred embodiment are replaced with variable delay stages, and a control signal on a phase locked loop (PLL) circuit is also used for control of the variable delay stages.

It is often performed at input a signal Y for detecting a differential clock signal to a PLL circuit disposed in a semiconductor device. Here, a delay control signal of the PLL circuit is utilized to control the delay amount at the variable delay stages.

Figure 31:
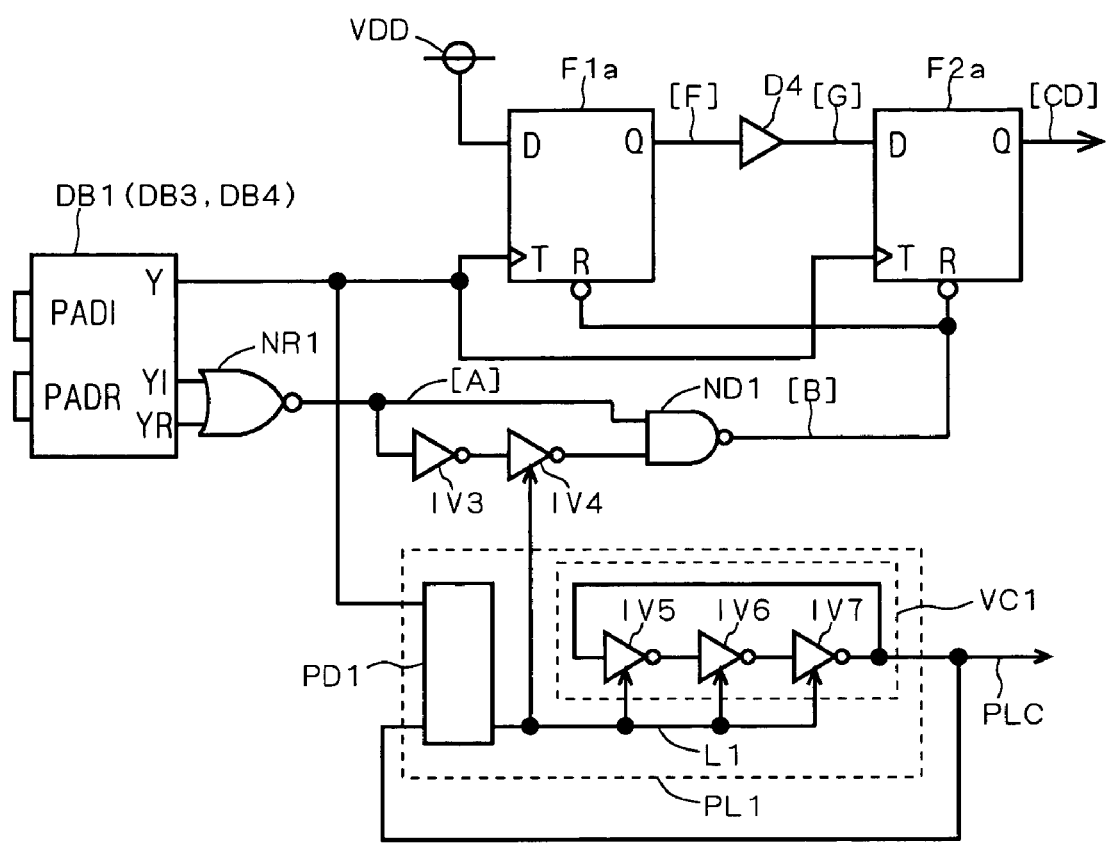
FIG. 31 is a diagram showing a disconnection and short detecting circuit according to an eighth preferred embodiment of the present invention.

FIG. 31 is a diagram showing a disconnection and short detecting circuit in accordance with the eighth preferred embodiment. The device configuration of FIG. 31 is the same as that in FIG. 1, except that the delay stages D1 to D3 are replaced with inverters IV3 and IV4, and that a PLL circuit PL1 is disposed.

The inverter IV4 functions as a variable delay stage that can change the delay amount of its signal. The PLL circuit PL1 includes an oscillator VC1 composed of a phase detector PD1 and inverters IV5 to IV7 connected in series in a ring shape. A delay control signal outputted from the phase detector PD1 is transmitted to the inverters IV5 to IV7 via a control line L1. The phase detector PD1 compares a PLL clock signal PLC outputted from the oscillator VC1 and a signal Y, in order to output a delay control signal to the control line L1 such that the PLL clock signal PLC is synchronized with the cycle of the signal Y.

The delay control signal outputted to the control line L1 is also applied to the inverter IV4, which is disposed instead of the delay stages D1 to D3, so that the delay amount on the inverter IV4 is controlled by this delay control signal.

The operation of this disconnection and short detecting circuit will next be described by using the timing charts of FIGS. 32 and 33.

Figure 32:
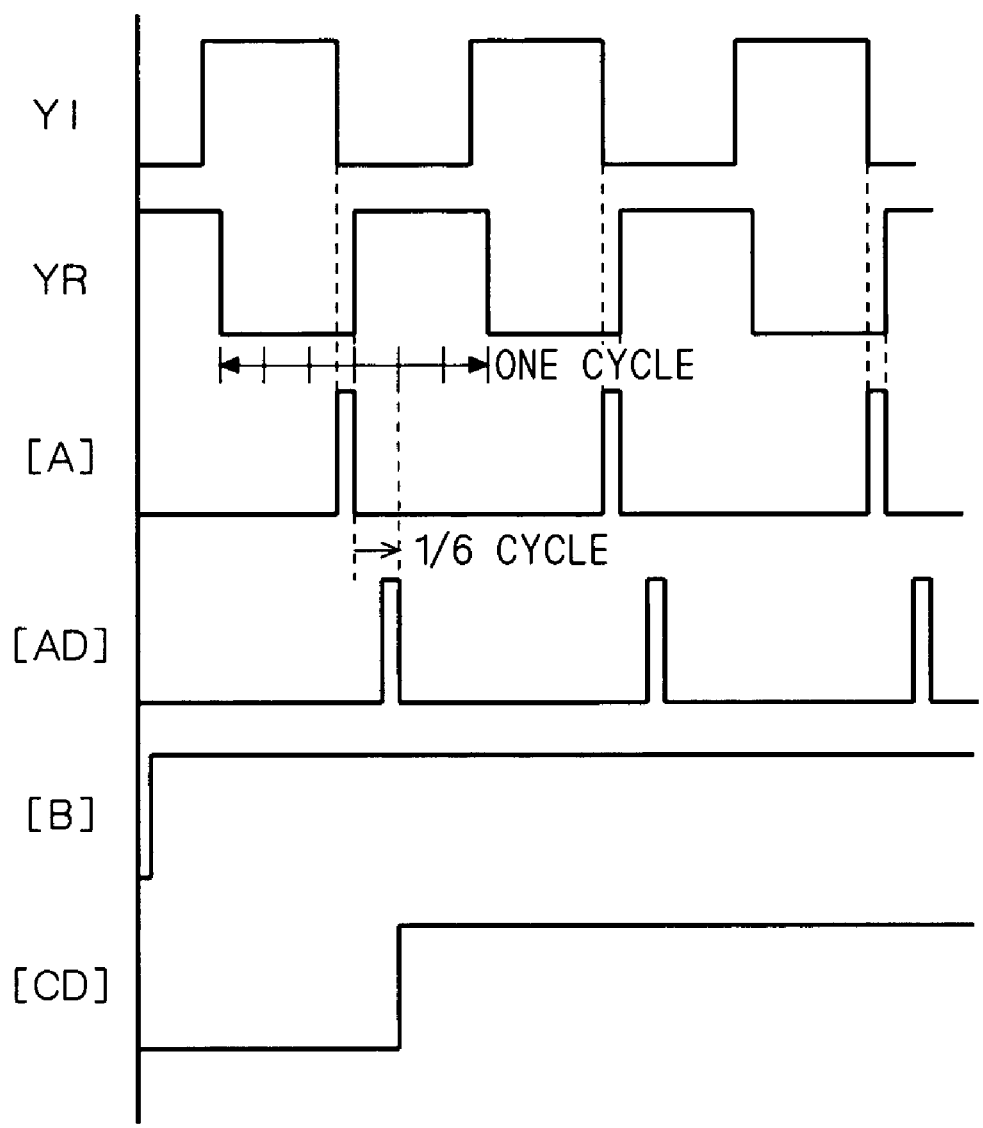
FIG. 32 is a timing chart showing changes in the signals of respective parts during the normal operation of a short period clock in the disconnection and short detecting circuit of the eighth preferred embodiment.

The timing chart of FIG. 32 shows signal changes of respective parts during normal operation, during which neither disconnection nor short occurs, in the case where a non-inverting clock signal and an inverting clock signal are short period clocks. The timing chart of FIG. 33 shows signal changes of the respective parts during normal operation, during which neither disconnection nor short occurs, in the case where a non-inverting clock signal and an inverting clock signal are long period clocks.

Even during normal operation, a short Hi pulse equivalent to skew appears in the signal [A] outputted from the two-input NOR circuit NR1. However, if a non-inverting clock signal and an inverting clock signal become long period clocks, their pulse widths increase. Here, assuming that the delay amount at the inverters IV3 and IV4, which are disposed instead of the plurality of delay stages D1 to D3, is able to have only the value to meet a short period, there is the possibility that Low may erroneously be outputted to the output [B] outputted from the two-input NAND circuit ND1.

Hence, in the eighth preferred embodiment, the delay amount in the inverter IV4 is automatically controlled by a delay control signal from the phase detector PD1, and the delay amount is decreased if a non-inverting clock signal and an inverting clock signal are short period clocks, whereas the delay amount is increased if they are long period clocks.

In FIG. 32, the pulse width of a brief Hi pulse equivalent to skew in the signal [A] is sufficiently small because the non-inverting clock signal and the inverting clock signal are short period clocks. For example, in the case where CMOS transistors constituting the inverter IV4 are designed such that the delay amount in the inverter IV4 is one sixth cycle of the non-inverting clock signal, the delay amount can be set to this value by having a delay control signal from the phase detector PD1 to be applied to the inverter IV4. In this case, it is able to obtain an inverted AND on the two-input NAND circuit ND1 with a small amount of delay. This avoids that Low is erroneously outputted to the output [B].

Figure 33:
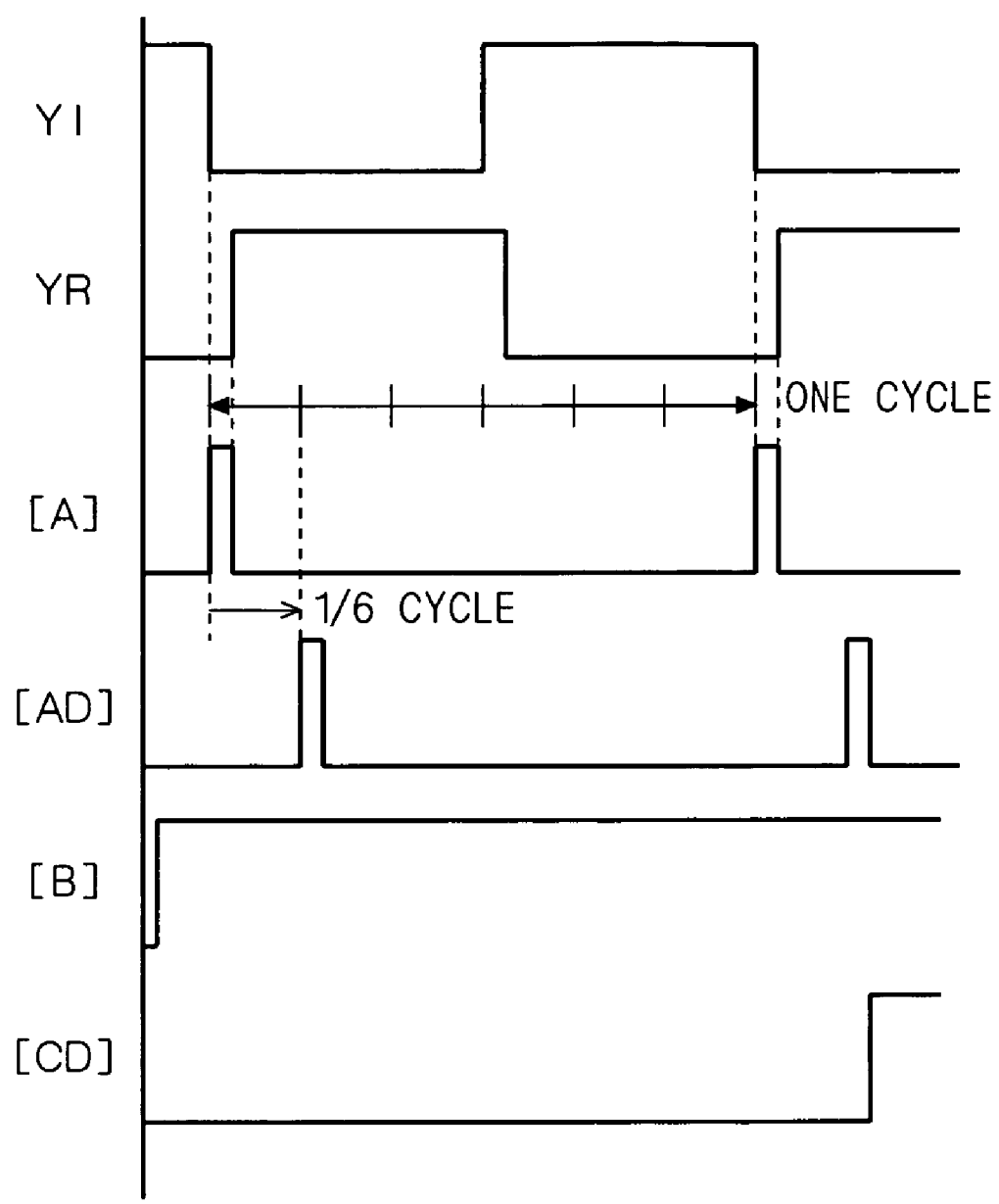
FIG. 33 is a timing chart showing changes in the signals of respective parts during the normal operation of a long period clock in the disconnection and short detecting circuit of the eighth preferred embodiment.

On the other hand, in FIG. 33, the pulse width of a brief Hi pulse equivalent to skew in the signal [A] is large because the non-inverting clock signal and the inverting clock signal are long period clocks. Therefore, there is the possibility that Low is erroneously outputted to the output [B] with a small amount of delay. As described above, in the case where CMOS transistors constituting the inverter IV4 are designed such that the delay amount in the inverter IV4 is one sixth cycle of the non-inverting clock signal, the delay amount can be set to this value by having a delay control signal from the phase detector PD1 to be applied to the inverter IV4. In this case, it is able to obtain an inverted AND on the two-input NAND circuit ND1 with a large amount of delay. This avoids that Low is erroneously outputted to the output [B].

In accordance with the disconnection and short detecting circuit of the eighth preferred embodiment, the delay amount at the inverter IV4 as a variable delay stage can be controlled by a delay control signal generated on the PLL circuit PL1. This enables to automatically adjust the delay amount on the delay circuit, according to the frequency of a non-inverting clock signal and the frequency of an inverting clock signal.

In addition, the PLL circuit permits adjustment to the delay amount in always proportion to the cycle of a differential clock signal, irrespective of manufacturing variations, and operation temperature and operation voltage. It is therefore also able to reliably adjust the delay amount at the inverter IV4, without being affected by these factors. Additionally, the eighth preferred embodiment does not require any switch signal from the exterior, which is needed in the seventh preferred embodiment.

Ninth Preferred Embodiment

A ninth preferred embodiment is a modification of the disconnection and short detecting circuit of the first preferred embodiment. Specifically, a potential Vref that is a comparison object at second and third comparators C2 and C3 is different from the value of a potential Vterm, and there is disposed an initial reset circuit to bring a second D-flip-flop circuit F2a into a reset state at the time of turning on power and in the vicinity thereof, even if a signal [B] is not asserted.

Figure 34:
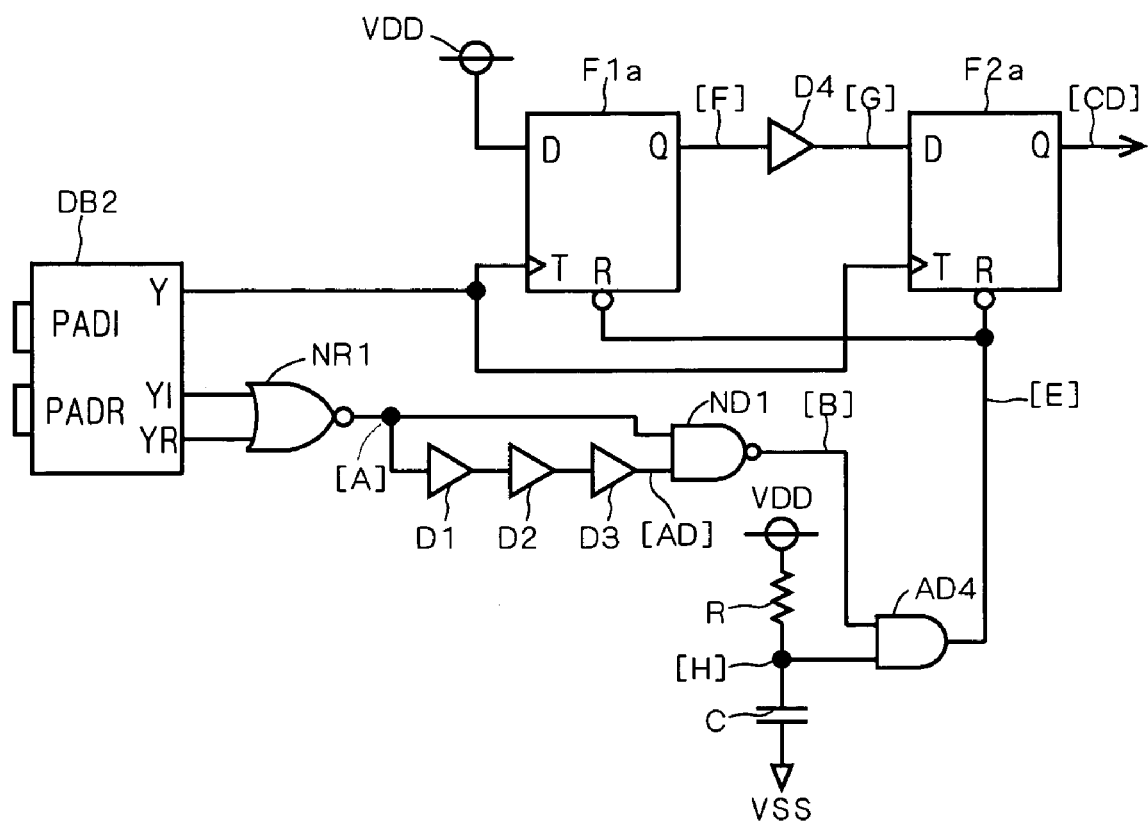
FIG. 34 is a diagram showing a disconnection and short detecting circuit according to a ninth preferred embodiment of the present invention.

FIG. 34 is a diagram showing a disconnection and short detecting circuit in accordance with the ninth preferred embodiment. The device configuration of FIG. 34 is the same as that in FIG. 1, except that the differential buffer part DB1 is replaced with a differential buffer part DB2, and that a resistor R, a capacitance C, and a two-input AND circuit AD4 are added.

A power supply potential VDD is applied to one end of the resistor R, and the other end of the resistor R is connected to one end of the capacitance C. A grounding potential VSS is applied to the other end of the capacitance C, and a signal [B] from a two-input NAND circuit ND1 is applied to one input end of a two-input AND circuit AD4. The one end of the capacitance C is connected to the other input end of the two-input AND circuit AD4. Instead of the signal [B], a signal [E] that is the output of the two-input AND circuit AD4 is applied to a reset terminal of a second D-flip-flop circuit F2a. The resistor R, the capacitance C and the two-input AND circuit AD4 operate closely together to configure the above-mentioned initial reset circuit.

Figure 35:
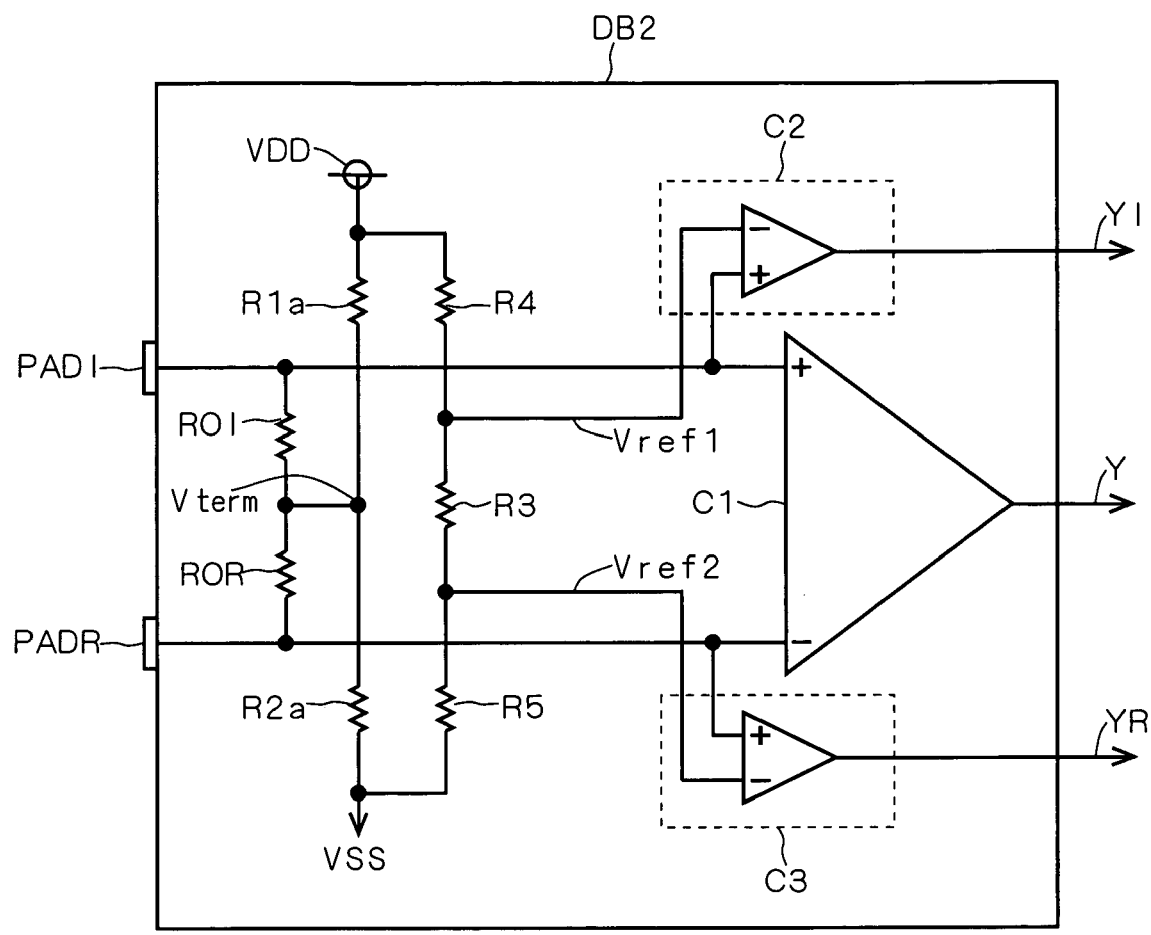
FIG. 35 is a diagram showing a detailed configuration of a differential buffer part DB2 in FIG. 34.

FIG. 35 is a diagram showing a detailed configuration of the differential buffer part DB2. Referring to FIG. 35, instead of the resistors R1b and R2b of the differential buffer part DB1 in FIG. 2, resistors R3 to R5 connected in series are disposed between a power supply voltage VDD and a grounding potential VSS in the differential buffer part DB2. Instead of the potential Vref, a potential Vref1 at the connection of the resistors R3 and R4 is inputted to the second comparator C2. Instead of the potential Vref, a potential Vref2 at the connection of the resistors R3 and R5 is inputted to the third comparator C3. The respective values of the resistors R3 to R5 are set such that the magnitudes of respective potentials are as follows: (The maximum value of the amplitude of a non-inverting clock signal or an inverting clock signal)>Vref1>Vterm>Vref2>(The minimum value of the amplitude of the non-inverting clock signal or the inverting clock signal).

In the second and the third comparators C2 and C3, a comparison in potential between a non-inverting clock signal and an inverting clock signal is made by using, instead of the potential Vterm, the potentials Vref1 and Vref2 that are different from the potential Vterm. If both of the signal lines of the non-inverting clock signal and the inverting clock signal are disconnected, the potential Vterm appears at first and second clock input ends PAD1 and PADR via terminating resistors R0I and R0R, respectively. Accordingly the second and the third comparators C2 and C3 make a comparison between the potential Vterm and the potential Vref1, and between the potential Vterm and the potential Vref2, respectively. Therefore, the logical values outputted from the second and the third comparators C2 and C3 do not become indeterminate. This permits more reliable detection of disconnection on the signal line of the differential clock signal.

The operation of this disconnection and short detecting circuit will next be described by using the timing chart of FIG. 36.

Figure 36:
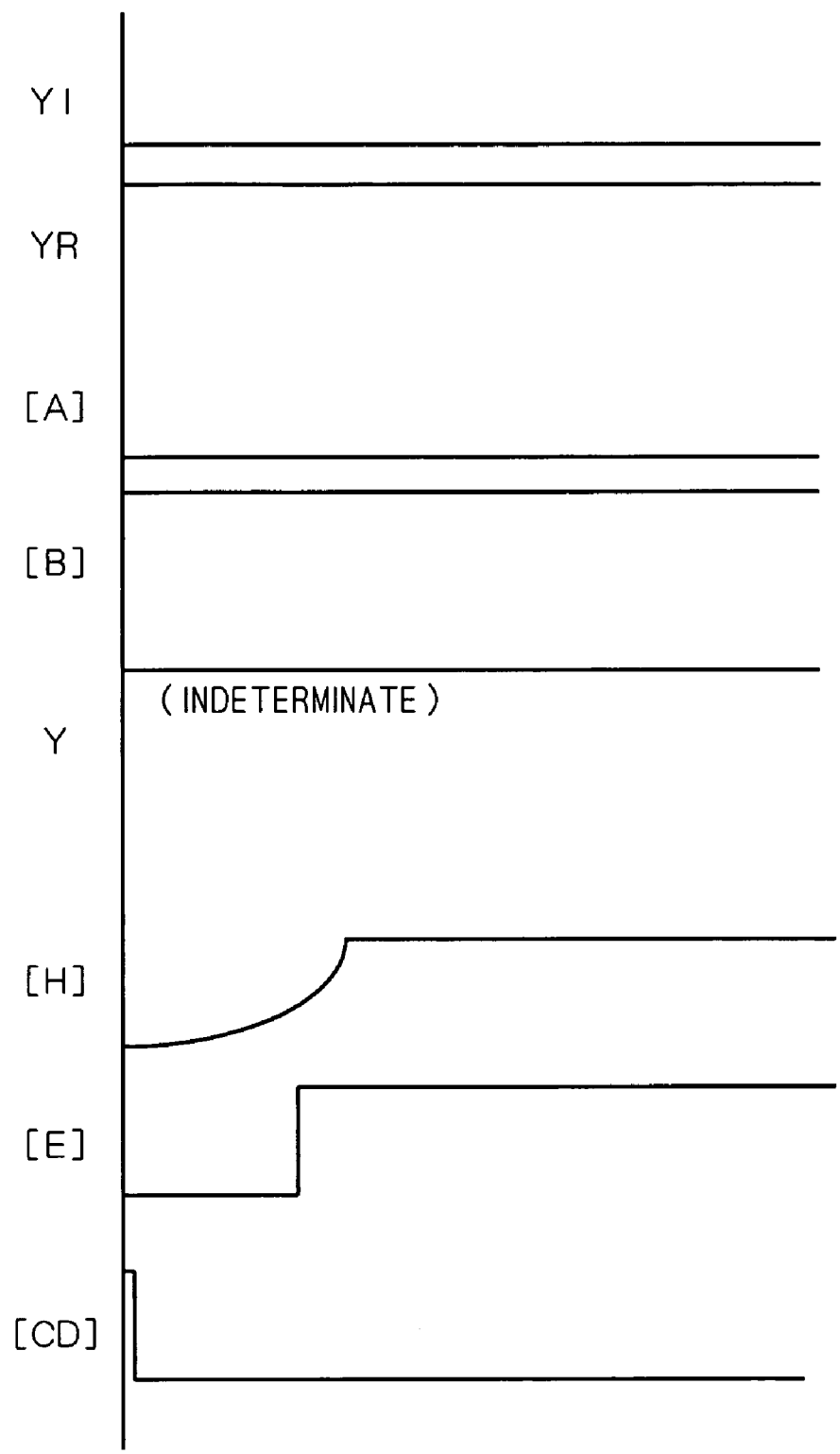
FIG. 36 is a timing chart showing changes in the signals of respective parts when both of a non-inverting clock signal line and an inverting clock signal line are disconnected in the disconnection and short detecting circuit of the ninth preferred embodiment.

The timing chart of FIG. 36 shows signal changes of respective parts if both of the signal lines of a non-inverting clock signal and an inverting clock signal are disconnected.

If both of the signal lines of the non-inverting clock signal and the inverting clock signal are disconnected, the potential Vterm appears at the first and the second clock input ends PAD1 and PADR. Thereby, Low appears in a signal YI, and Hi appears in a signal YR (Vref1>Vterm>Vref2), as shown in FIG. 36.

As a result, the signal [A] outputted from the two-input NOR circuit NR1 continues to output Low. Thereby, the signal [B] outputted from the two-input NAND circuit ND1 continues to output Hi.

When this signal [B] is directly applied to the reset terminal R of the second D-flip-flop circuit F2a, no reset is performed in spite of the occurrence of disconnection, so that the second D-flip-flop circuit F2a exhibits normal to a signal [CD].

The initial reset circuit is disposed to prevent this phenomenon. At the time of turning on power and in the vicinity thereof, charge is accumulated in the capacitance C via the resistor R. In response to the charge accumulation, the potential of a signal [H] at the connection end of the resistor R and the capacitance C increases, as shown in FIG. 36.

Immediately after turning on power, the signal [H] remains Low even when the signal [B] becomes Hi. Therefore, the two-input AND circuit AD4 outputs Low as a signal [E]. Therefore, at this point of time, reset is performed at the second D-flip-flop circuit F2a.

Then, when a predetermined amount of charge is accumulated in the capacitance C, the signal [E] transits from Low to Hi, as shown in FIG. 36. It follows that thereafter, no reset is performed at the second D-flip-flop circuit F2a. However, if disconnection occurs on the signal lines of a non-inverting clock signal and an inverting clock signal, the transition of the signal Y is not inputted to a clock input end T. Therefore, an output end Q of the second D-flip-flop circuit F2a still continues to output Low due to the reset at the time of turning on power.

In other words, according to the disconnection and short detecting circuit of the ninth preferred embodiment, the initial reset circuit forcibly asserts the signal [E] and applies it to the second D-flip-flop circuit F2a, even if the logical values outputted from the second and the third comparators C2 and C3 are not equal, in spite of disconnection on both of the signal lines of a non-inverting clock signal and an inverting clock signal. This permits more reliable detection of disconnection on the signal line of a differential clock signal.

In addition, by configuring the initial reset circuit with use of the resistor R, the capacitance C and the two-input AND circuit AD4, the output of the two-input AND circuit AD4 does not activate until a predetermined mount of charge is accumulated in the capacitance C, at the time of turning on power and in the vicinity thereof. This facilitates to configure the initial reset circuit.

Although FIG. 36 shows such that the signal Y continues to output Hi, strictly speaking, the signal Y is indeterminate because Vterm is applied to both input ends of the first comparator C1, and it continues to output Low in some cases.

Tenth Preferred Embodiment

A tenth preferred embodiment is a modification of the disconnection and short detecting circuit of the fourth preferred embodiment. Specifically, like FIG. 34, a potential Vref, which is a comparison object at second and third comparators C2 and C3, have a different value than that of a potential Vterm, and there is disposed an initial reset circuit to bring a second D-flip-flop circuit F2a into its reset state even if a signal [B] is not asserted, at the time of turning on power and in the vicinity thereof.

Figure 37:
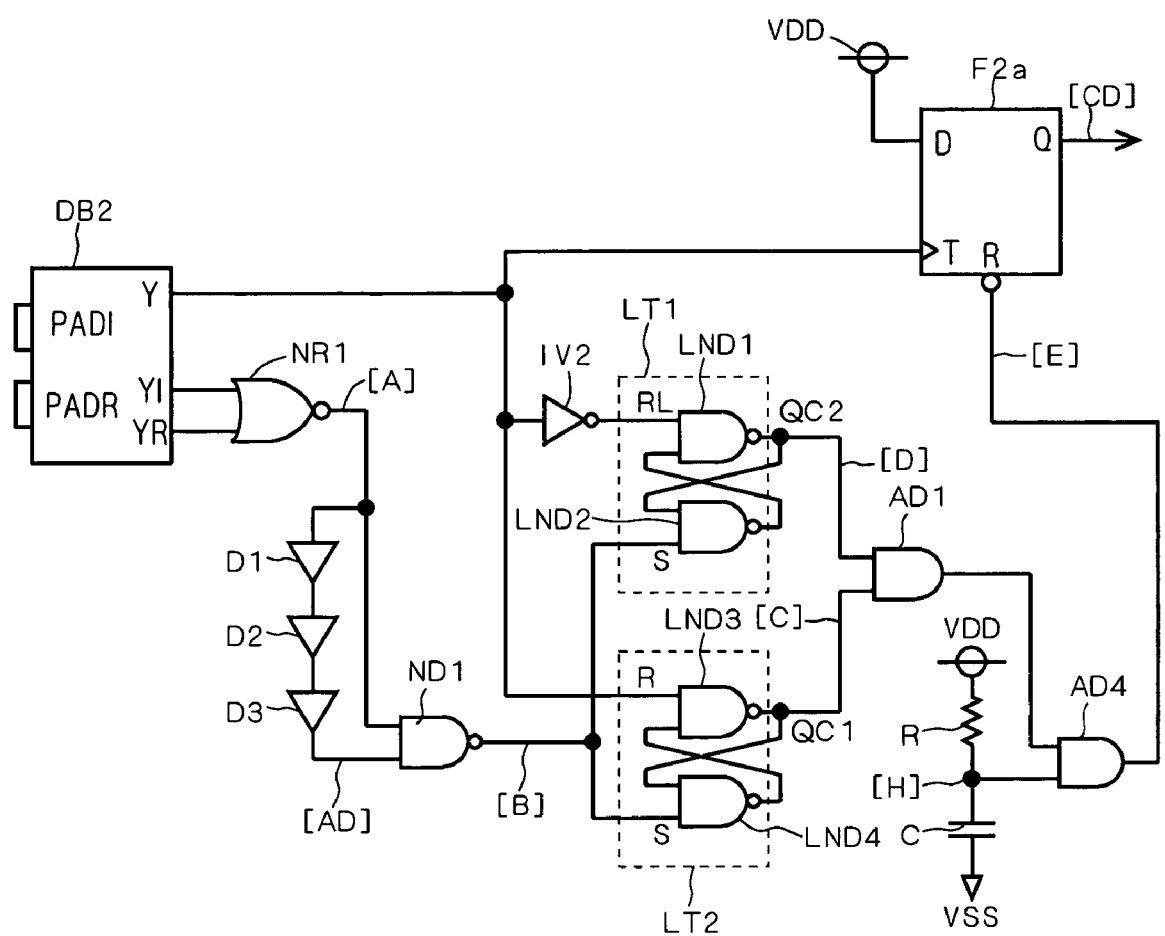
FIG. 37 is a diagram showing a disconnection and short detecting circuit according to a tenth preferred embodiment of the present invention.

FIG. 37 is a diagram showing a disconnection and short detecting circuit in accordance with the tenth preferred embodiment. The device configuration of FIG. 37 is the same as that in FIG. 9, except that the differential buffer part DB1 is replaced with a differential buffer part DB2, and that a resistor R, a capacitance C, and a two-input AND circuit AD4 are added.

Since the configuration of the differential buffer part DB2 and the configuration of the initial reset circuit are completely the same as that in the ninth preferred embodiment, their respective descriptions are omitted here.

The operation of this disconnection and short detecting circuit will next be described by using the timing chart of FIG. 38.

Figure 38:
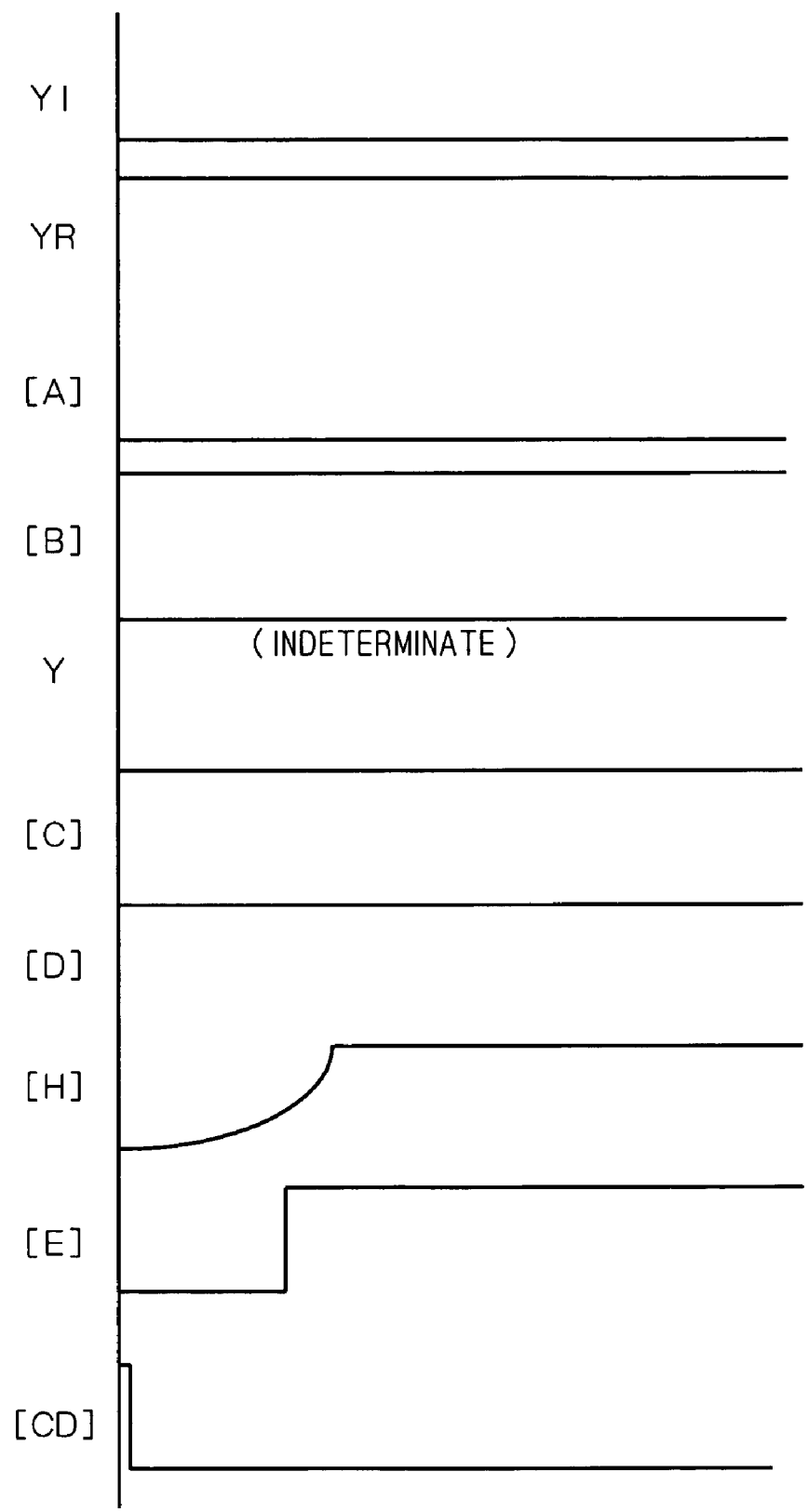
FIG. 38 is a timing chart showing changes in the signals of respective parts when both of a non-inverting clock signal line and an inverting clock signal line are disconnected in the disconnection and short detecting circuit of the tenth preferred embodiment.

Like FIG. 36, the timing chart of FIG. 38 also shows signal changes of respective parts if both of the signal lines of a non-inverting clock signal and an inverting clock signal are disconnected. Since signals YI, YR, [A], [B], Y, and [H] are similar to the case of FIG. 36, their respective descriptions are omitted here.

Since the signal [B] continues to output Hi, both of an output QC1 of a latch circuit LT2 and an output QC2 of a latch circuit LT1 continue to output Hi or continue to hold signal, as apparent from the logical value table of FIG. 10. Accordingly both of the signals [C] and [D] continue to output Hi, as shown in FIG. 38. As a result, the signal outputted from the two-input AND circuit AD1 does not become Low.

Immediately after turning on power, the signal [H] remains Low even when the signal outputted from the two-input AND circuit AD1 is Hi. Therefore, the two-input AND circuit AD4 outputs Low as a signal [E]. Accordingly, at this point of time, reset is performed at the second D-flip-flop circuit F2a.

Thereby, the tenth preferred embodiment produces the same effect as the ninth preferred embodiment.

Eleventh Preferred Embodiment

An eleventh preferred embodiment is a modification of the disconnection and short detecting circuit of the first preferred embodiment. Specifically, a potential Vref, which is a comparison object at second and third comparators C2 and C3, has a different value than that of a potential Vterm.

Figure 39:
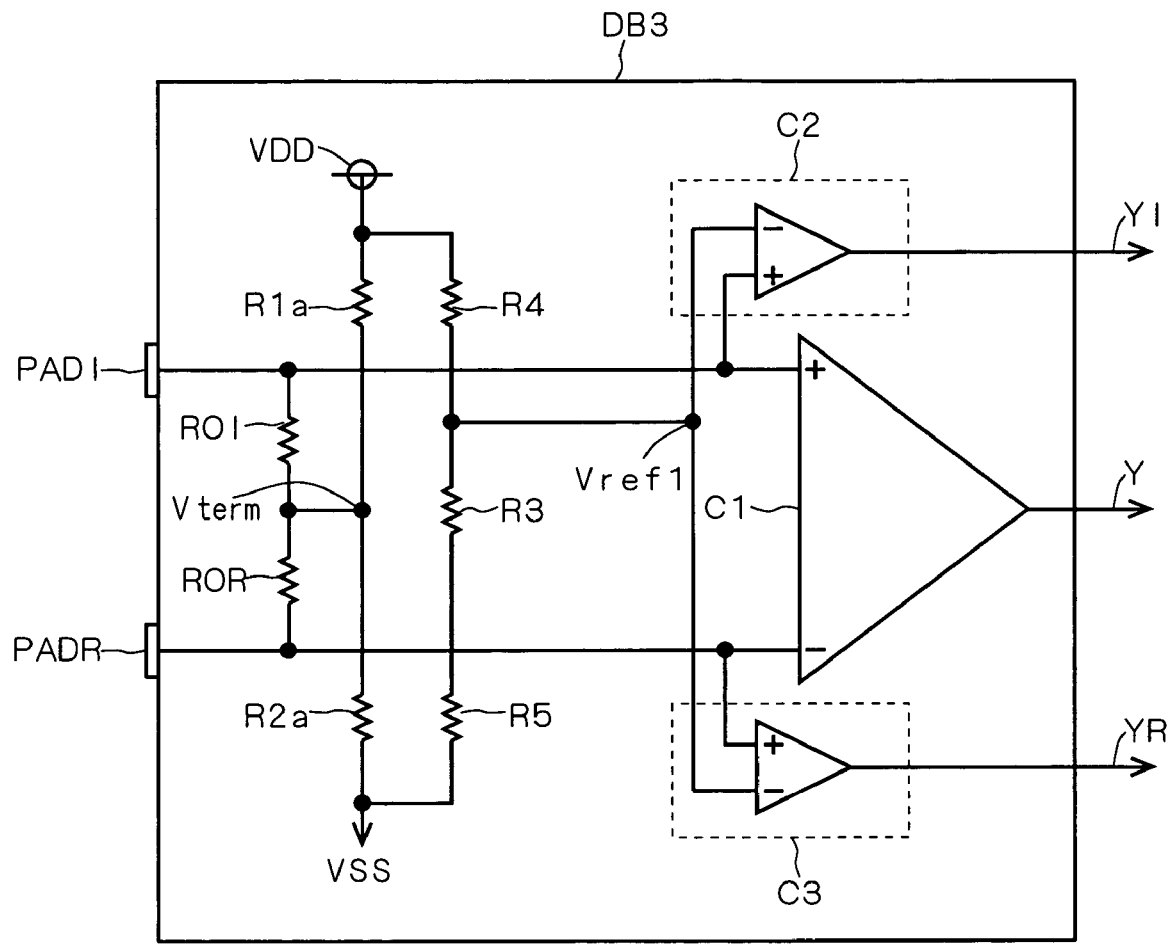
FIG. 39 is a diagram showing a detailed configuration of a differential buffer part DB3 in a disconnection and short detecting circuit according to an eleventh preferred embodiment of the present invention.

A disconnection and short detecting circuit in accordance with the eleventh preferred embodiment is obtained by employing a differential buffer part DB3 in FIG. 39, instead of the differential buffer part DB1 in FIG. 1.

FIG. 39 is a diagram showing a detailed configuration of the differential buffer part DB3. Referring to FIG. 39, like the differential buffer part DB2 of FIG. 35, resistors R3 to R5 connected in series are disposed between a power supply voltage VDD and a grounding potential VSS in the differential buffer part DB3. Unlike the case of FIG. 35, a potential Vref1 at the connection of the resistors R3 and R4 is inputted to both of the second and the third comparators C2 and C3. The respective values of the resistors R3 to R5 are set such that the magnitudes of respective potentials are as follows: (The maximum value of the amplitude of a non-inverting clock signal or an inverting clock signal) >Vref1>Vterm>(The minimum value of the amplitude of the non-inverting clock signal or the inverting clock signal).

In the differential buffer part DB1, the second and the third comparators C2 and C3 compare the potential Vref having the same value as the potential Vterm, with a non-inverting clock signal and an inverting clock signal. If both of the signal lines of the non-inverting clock signal and the inverting clock signal are disconnected, the potential Vterm appears at the first and the second clock input ends PAD1 and PADR, respectively. Accordingly the second and the third comparators C2 and C3 compare the potential Vref1 with the potential Vterm. It is therefore indeterminate whether signals YI and YR, which are their respective outputs, become Hi or Low.

Figure 40:
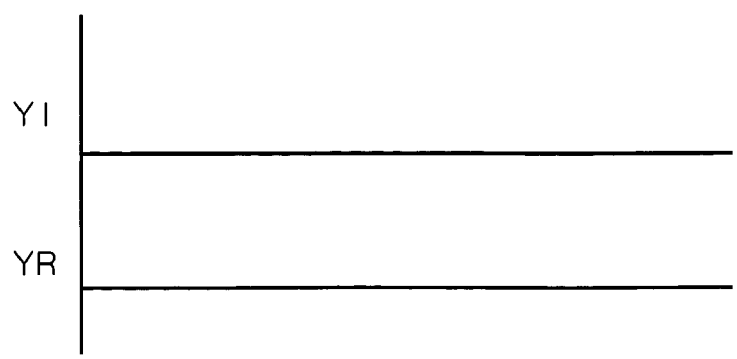
FIG. 40 is a timing chart showing changes in the signals of respective parts when both of a non-inverting clock signal line and an inverting clock signal line are disconnected in the disconnection and short detecting circuit of the eleventh preferred embodiment.

In the differential buffer part DB3 of FIG. 39, the second and the third comparators C2 and C3 compare the potential Vref1 having a greater value than the potential Vterm with a non-inverting clock signal and an inverting clock signal. Therefore, if both of the signal lines of the non-inverting clock signal and the inverting clock signal are disconnected, the potential Vterm appears at the first and the second clock input ends PADI and PADR, respectively. Accordingly the second and the third comparators C2 and C3 compare the potential Vref1 and the potential Vterm, so that the signals YI and YR, which are their respective outputs, become Low, as shown in FIG. 40.

Also in the eleventh preferred embodiment, in the second and the third comparators C2 and C3, a comparison in potential between a non-inverting clock signal and an inverting clock signal is made by using, instead of the potential Vterm, the potential Vref1 different from the potential Vterm. If both of the signal lines of the non-inverting clock signal and the inverting clock signal are disconnected, the second and the third comparators C2 and C3 compare the potential Vterm and the potential Vref1, respectively. Therefore, the logical values outputted from the second and the third comparators C2 and C3 do not become indeterminate. This permits more reliable detection of disconnection on the signal line of a differential clock signal.

Twelfth Preferred Embodiment

A twelfth preferred embodiment is also a modification of the disconnection and short detecting circuit of the first preferred embodiment. Specifically, a potential Vref, which is a comparison object at the second and the third comparators C2 and C3 in the first preferred embodiment, has a different value than that of a potential Vterm.

Figure 41:
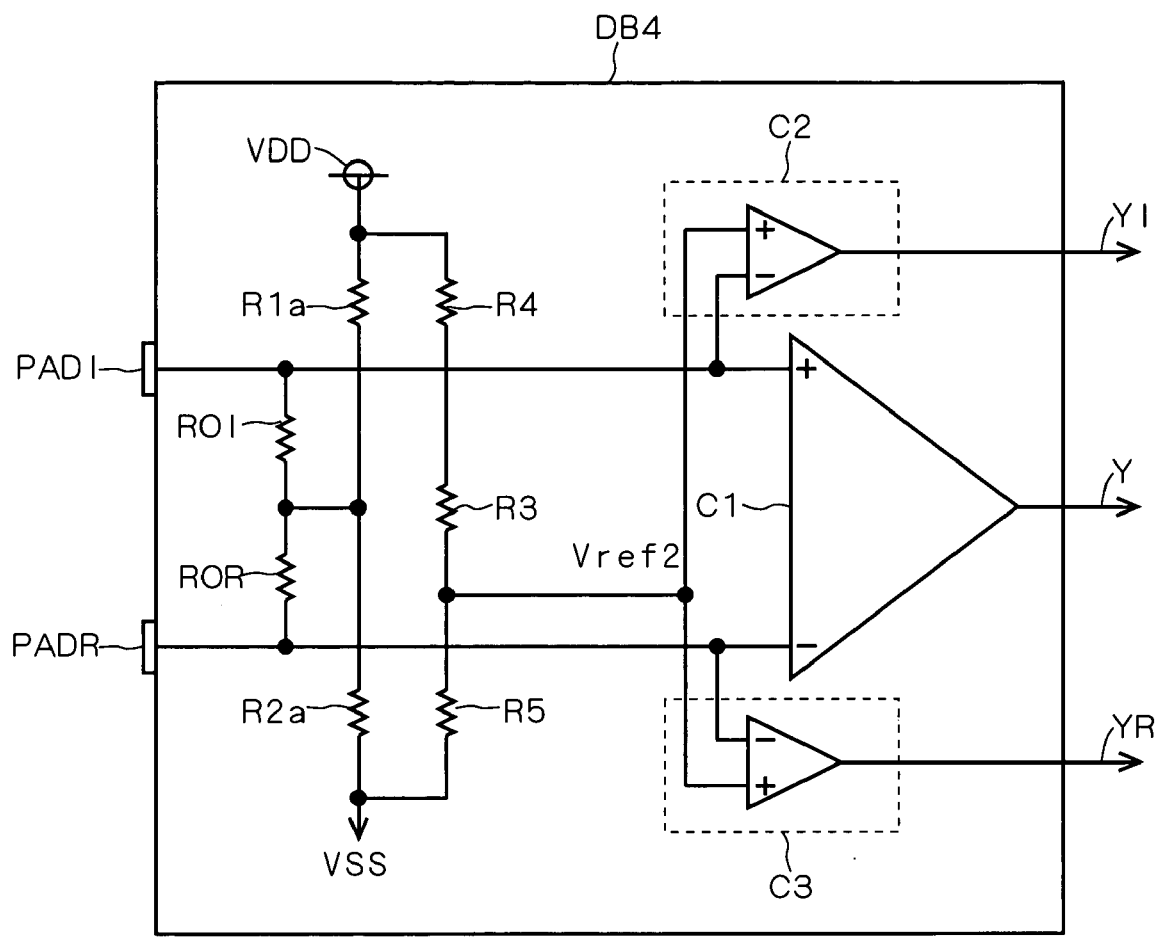
FIG. 41 is a diagram showing a detailed configuration of a differential buffer part DB4 in a disconnection and short detecting circuit according to a twelfth preferred embodiment of the present invention.

A disconnection and short detecting circuit in accordance with the twelfth preferred embodiment is obtained by employing a differential buffer part DB4 in FIG. 41, instead of the differential buffer part DB1 in FIG. 1.

FIG. 41 is a diagram showing a detailed configuration of the differential buffer part DB4. Referring to FIG. 41, like the differential buffer part DB2 of FIG. 35, resistors R3 to R5 connected in series are disposed between a power supply voltage VDD and a grounding potential VSS in the differential buffer part DB4. Unlike the case of FIG. 35, a potential Vref2 at the connection of the resistors R3 and R5 is inputted to positive (+) terminals of both of the second and the third comparators C2 and C3. A non-inverting clock signal is inputted to a negative (−) terminal of the second comparator C2, and an inverting clock signal is inputted to a negative (−) terminal of the third comparator C3.

The respective values of the resistors R3 to R5 are set such that the magnitudes of respective potentials are as follows: (The maximum value of the amplitude of a non-inverting clock signal or an inverting clock signal)>Vterm>Vref2>(The minimum value of the amplitude of the non-inverting clock signal or the inverting clock signal).

Figure 42:
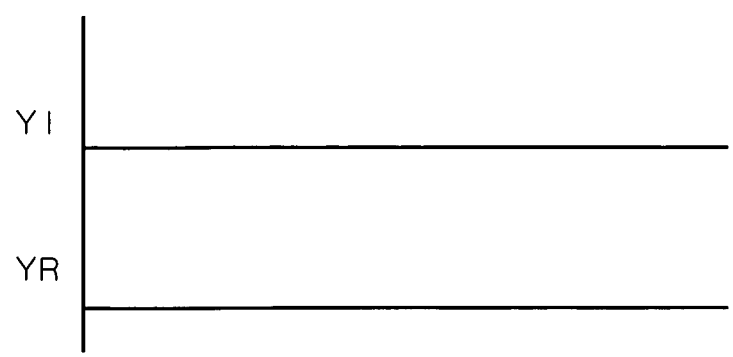
FIG. 42 is a timing chart showing changes in the signals of respective parts when both of a non-inverting clock signal line and an inverting clock signal line are disconnected in the disconnection and short detecting circuit of the twelfth preferred embodiment.

In the differential buffer part DB4 of FIG. 41, the second and the third comparators C2 and C3 compare the potential Vref2 having a smaller value than the potential Vterm with a non-inverting clock signal and an inverting clock signal. Therefore, if both of the signal lines of the non-inverting clock signal and the inverting clock signal are disconnected, the potential Vterm appears at first and second clock input ends PAD1 and PADR, respectively. Accordingly the second and the third comparators C2 and C3 compare the potential Vref2 and the potential Vterm, and the signals YI and YR, which are their respective outputs, become Low as shown in FIG. 42 (because, unlike FIG. 39, the non-inverting clock signal and the inverting clock signal are inputted to the negative (−) terminal, not the positive (+) terminal).

Also in the twelfth preferred embodiment, in the second and the third comparators C2 and C3, a comparison in potential between a non-inverting clock signal and an inverting clock signal is made by using, instead of the potential Vterm, the potential Vref2 different from the potential Vterm. If both of the signal lines of the non-inverting clock signal and the inverting clock signal are disconnected, the second and the third comparators C2 and C3 compare the potential Vterm and the potential Vref2, respectively. Therefore, the logical values outputted from the second and the third comparators C2 and C3 do not become indeterminate. This permits more reliable detection of disconnection on the signal line of a differential clock signal.

Thirteenth Preferred Embodiment

A thirteenth preferred embodiment is a modification of the disconnection and short detecting circuit of the sixth preferred embodiment. Specifically, it is configured such that strength damping in a non-inverting clock signal and an inverting clock signal is also detectable by increasing the number of comparators in the sixth preferred embodiment.

Figure 43:
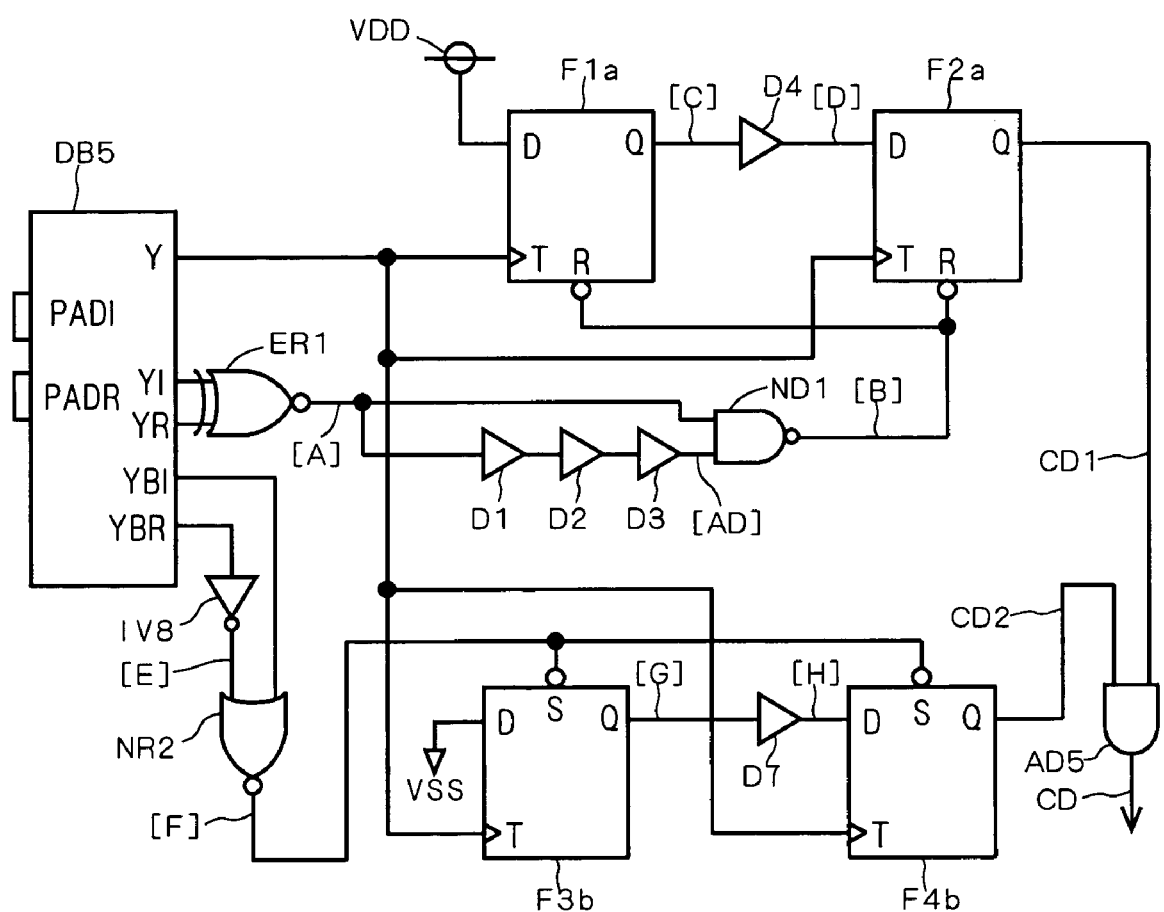
FIG. 43 is a diagram showing a disconnection and short detecting circuit according to a thirteenth preferred embodiment of the present invention.

FIG. 43 is a diagram showing a disconnection and short detecting circuit in accordance with the thirteenth preferred embodiment. The device configuration of FIG. 43 is the same as that of FIG. 23, except that a differential buffer part DB5 of FIG. 44 is employed instead of the differential buffer part DB1, and that an inverter IV8, a two-input NOR circuit NR2, third and fourth D-flip-flop circuits with set function F3b and F4b, a delay circuit D7, and a two-input AND circuit AD5 are added.

In the thirteenth preferred embodiment, the inverter IV8 and the two-input NOR circuit NR2 operates closely together to function as a second signal output circuit. The second signal output circuit has the function of asserting (i.e., bringing into Low) and outputting a signal [F], in the cases other than that the logical value of a signal YBI outputted from a fourth comparator C4 is Low, and the logical value of a signal YB outputted from a fifth comparator C5 is Hi.

Figure 44:
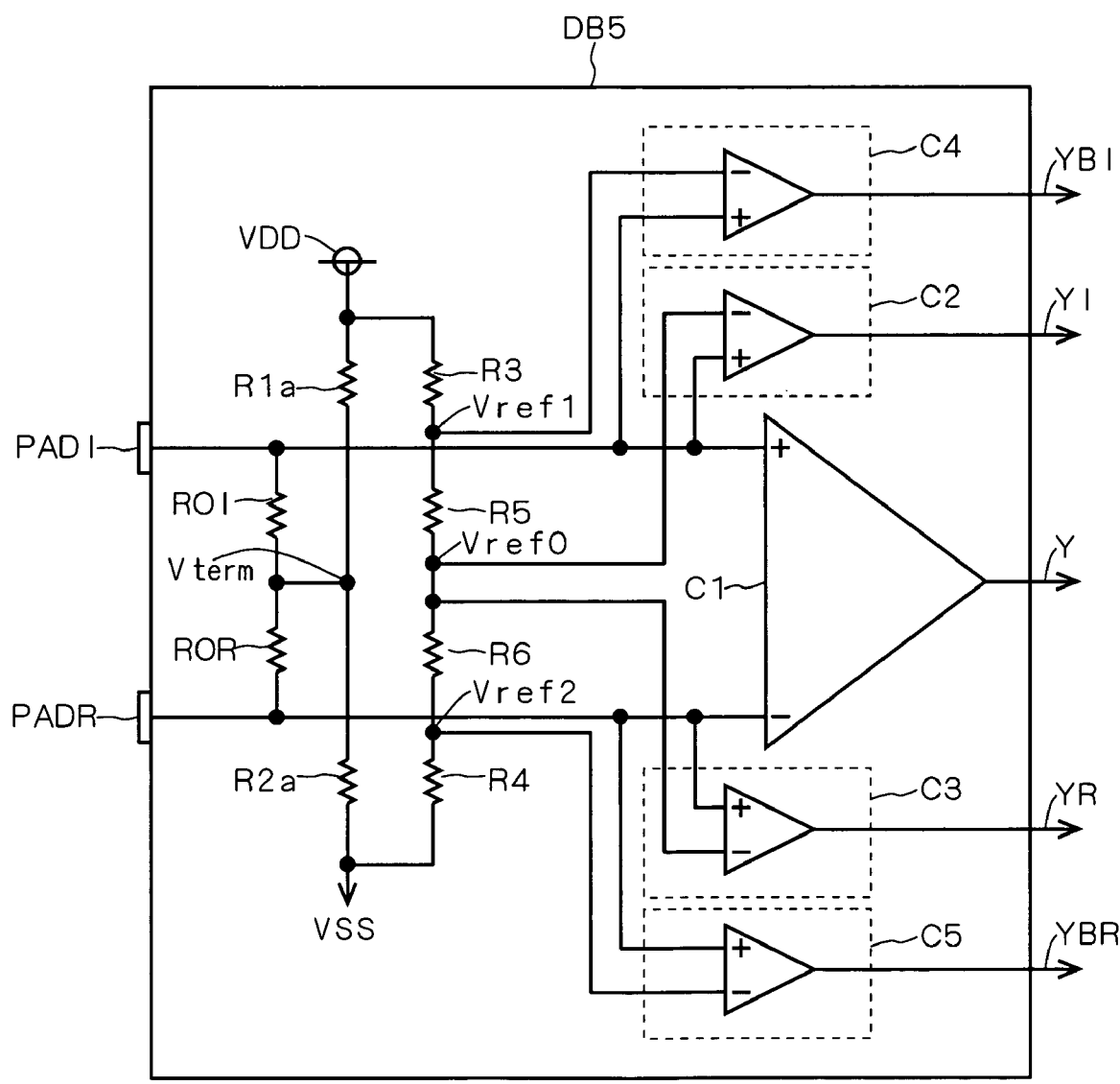
FIG. 44 is a diagram showing a detailed configuration of a differential buffer part DB5 in a disconnection and short detecting circuit of the thirteenth preferred embodiment.

FIG. 44 is a diagram showing a detailed configuration of the differential buffer part DB5. Referring to FIG. 44, instead of the resistors R1b and R2b of the differential buffer part DB1 in FIG. 2, resistors R3 to R6 connected in series are disposed between a power supply voltage VDD and a grounding potential VSS in the differential buffer part DB5. For example, each of the resistance values of the resistors R3 to R6 may be set to the same value. Instead of the potential Vref in FIG. 2, a potential Vref0 at the connection of the resistors R5 and R6 is inputted to second and third comparators C2 and C3.

The differential buffer part DB5 further includes the fourth and the fifth comparators C4 and C5. The fourth comparator C4 has a positive (+) input end connected to the first clock input end PAD1, and a negative (−) input end to which a potential Vref1 at the connection of the resistors R3 and R5 is applied. The fourth comparator C4 compares the potentials at the positive (+) and the negative (−) input ends and, based on the comparison result, outputs, as a signal YBI, Hi that is a first logical value or Low that is a second logical value. The fifth comparator C5 has a positive (+) input end connected to the second clock input end PADR, and a negative (−) input end to which a potential Vref2 at the connection of the resistors R4 and R6 is applied. The fifth comparator C5 compares the potentials at the positive (+) and the negative (−) input ends and, based on the comparison result, outputs, as a signal YBR, Hi that is the first logical value or Low that is the second logical value.

The respective values of the resistors R3 to R6 are set such that the magnitudes of respective potentials are as follows: (The maximum value of the amplitude of a non-inverting clock signal or an inverting clock signal)>Vref1>Vterm=Vref0>Vref2>(The minimum value of the amplitude of the non-inverting clock signal or the inverting clock signal).

Here, the signal YBR is applied, as a signal [E], to one input end of the two-input NOR circuit NR2 via the inverter IV8. The signal YBI is applied to the other input end of the two-input NOR circuit NR2. The output of the two-input NOR circuit NR2 is applied, as a signal [F], to set terminals S of the third and the fourth D-flip-flop circuits F3b and F4b. A signal Y is applied to respective clock input ends T of the third and the fourth D-flip-flop circuits F3b and F4b.

A grounding potential VSS is inputted to an input end D of the third D-flip-flop circuit F3b, and a signal [G] from its output end Q is applied, as a signal [H], to an input end D of the fourth D-flip-flop circuit F4b via the delay circuit D7. A signal [CD2] from the output end Q of the fourth D-flip-flop circuit F4b and a signal [CD1] from the second D-flip-flop circuit F2a are inputted to the two-input AND circuit AD5. A signal [CD] outputted from the two-input AND circuit AD5 becomes a disconnection or short detecting signal.

Figure 45:
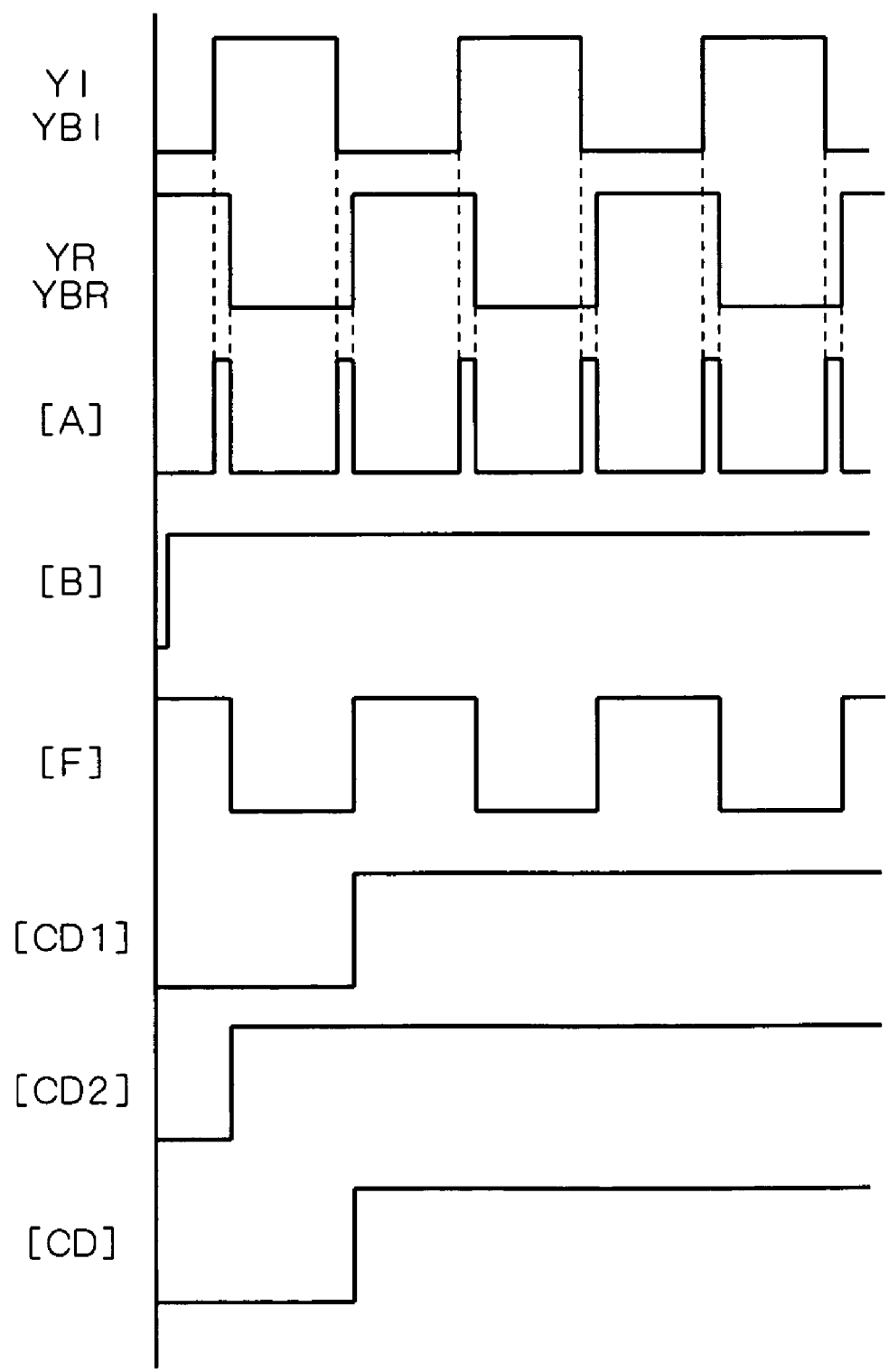
FIG. 45 is a timing chart showing changes in the signals of respective parts during normal operation in the disconnection and short detecting circuit of the thirteenth preferred embodiment.
Figure 46:
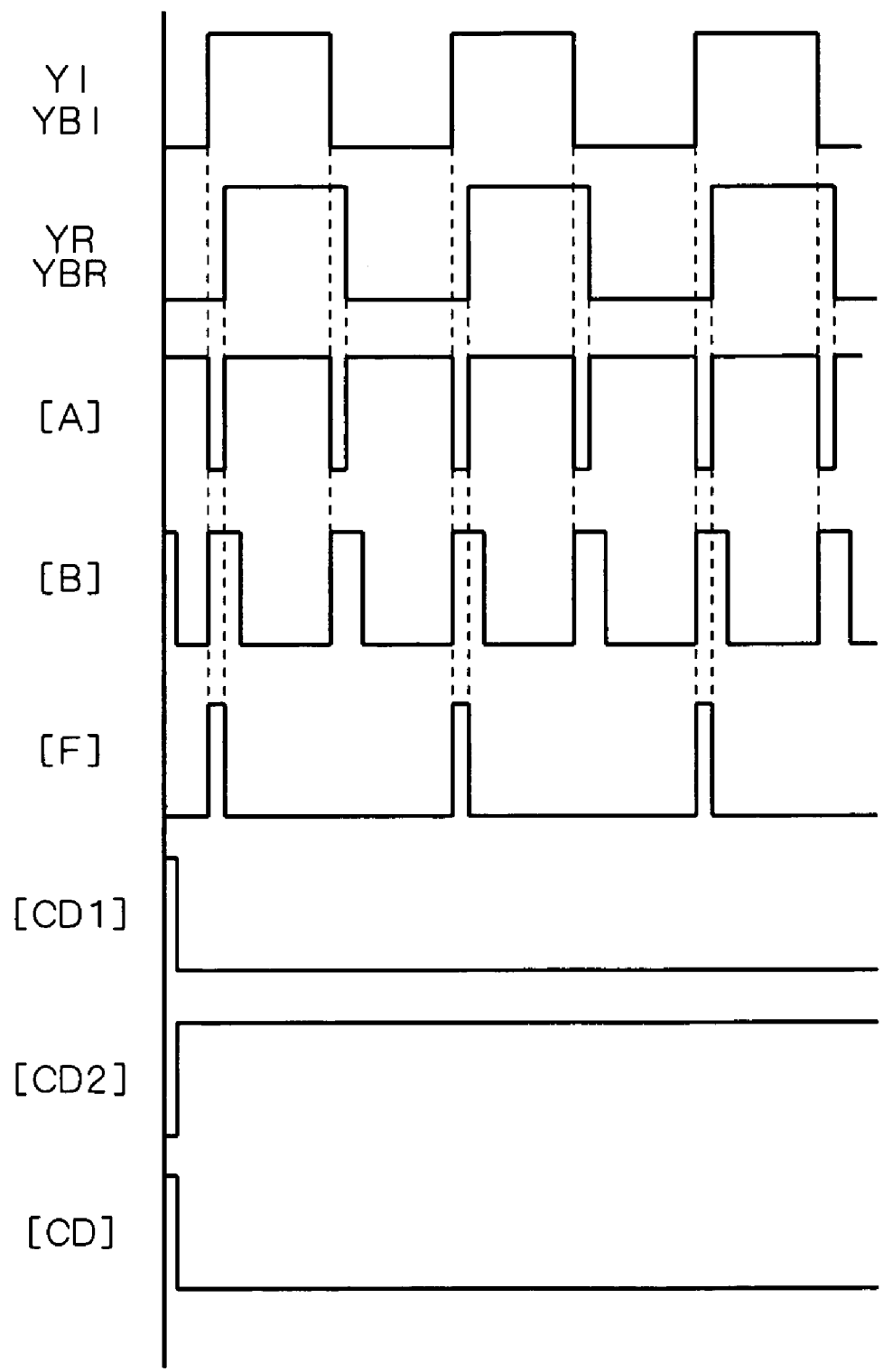
FIG. 46 is a timing chart showing changes in the signals of the respective parts when an inverting clock signal line is disconnected in the disconnection and short detecting circuit of the thirteenth preferred embodiment.
Figure 47:
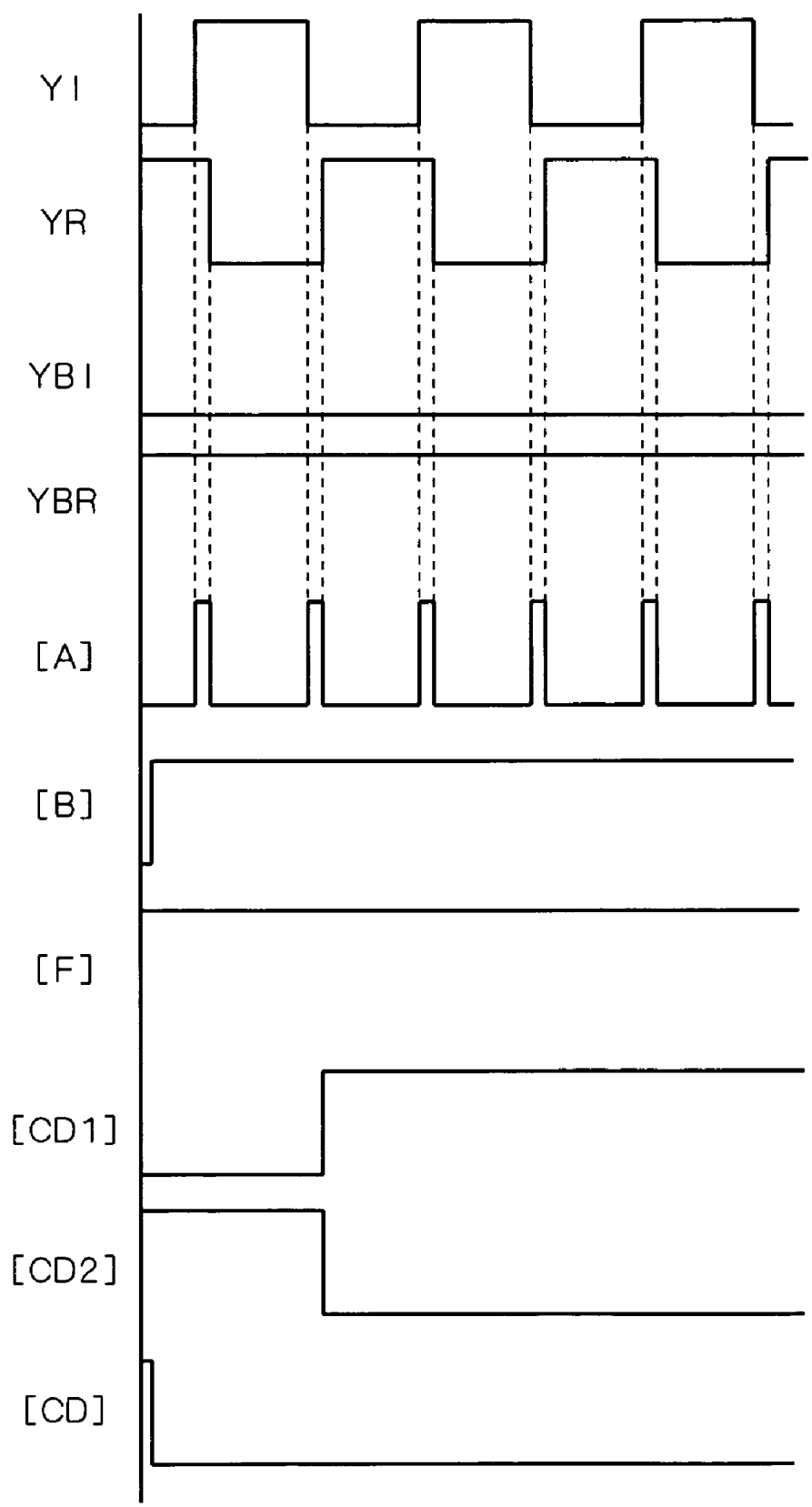
FIG. 47 is a timing chart showing changes in the signals of the respective parts when a non-inverting clock signal and an inverting clock signal are damped in the disconnection and short detecting circuit of the thirteenth preferred embodiment.
Figure 48:
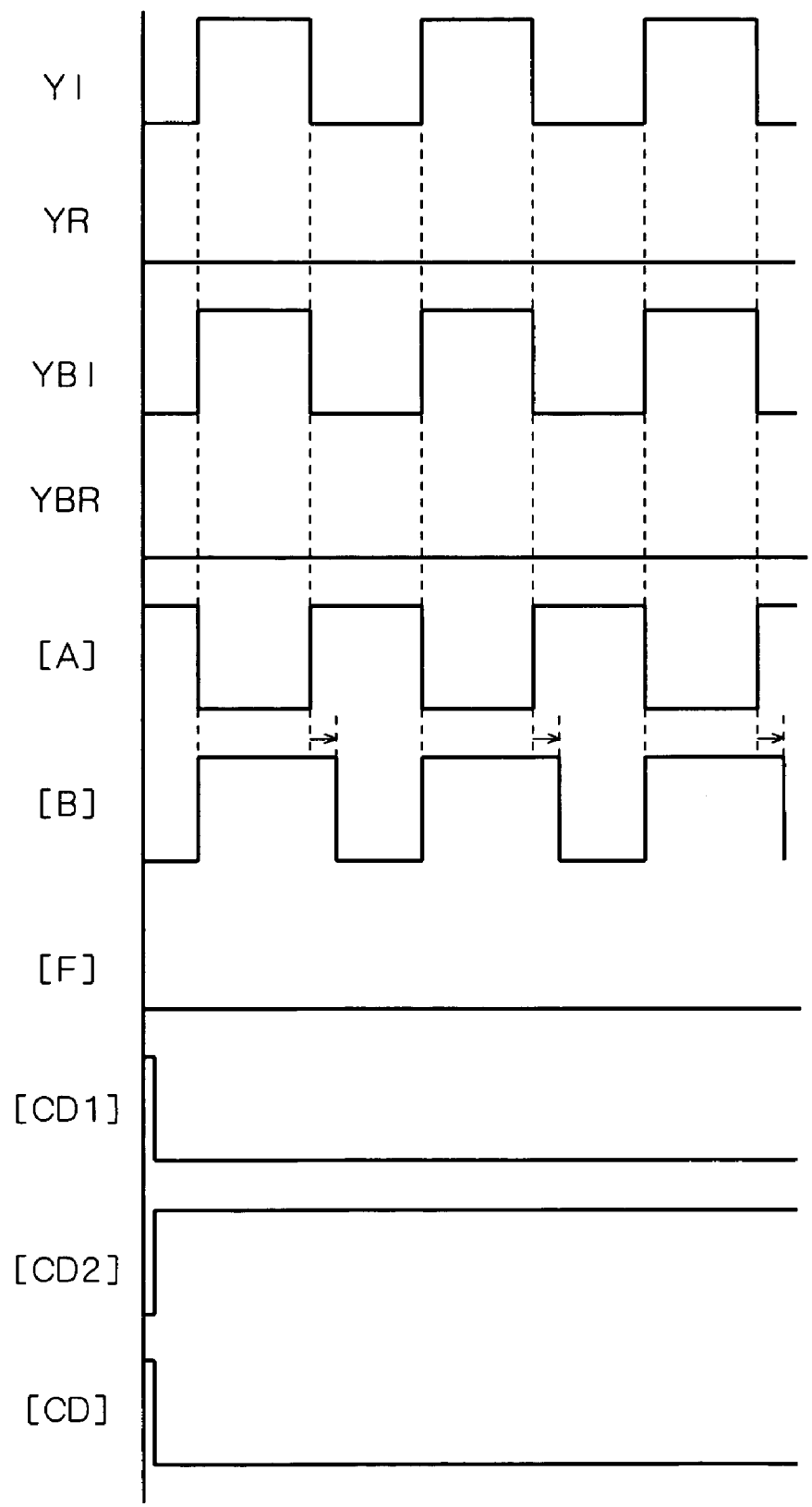
FIG. 48 is a timing chart showing changes in the signals of the respective parts when an inverting clock signal line is short-circuited to a grounding potential VSS in the disconnection and short detecting circuit of the thirteenth preferred embodiment.
Figure 49:
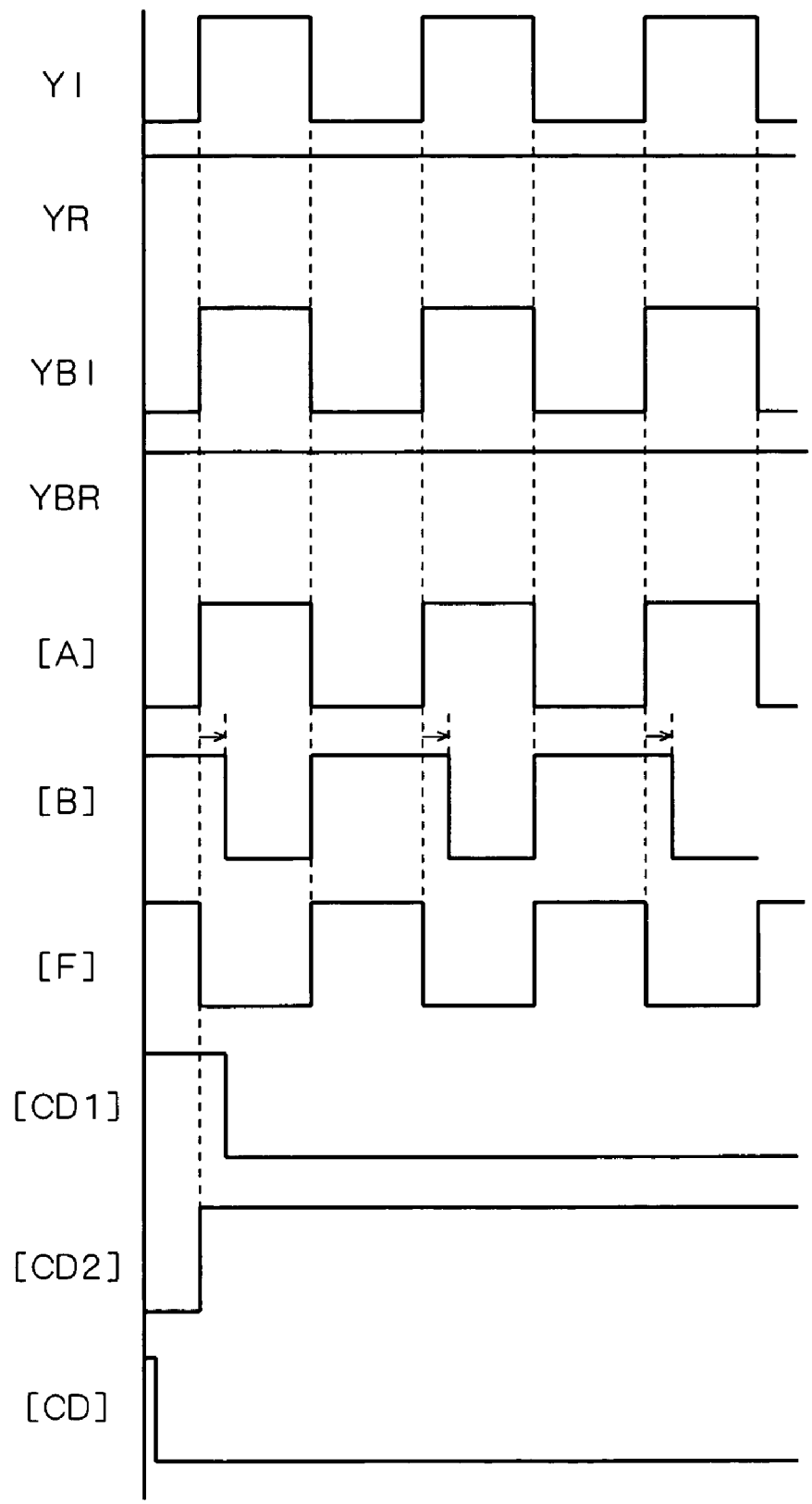
FIG. 49 is a timing chart showing changes in the signals of the respective parts when an inverting clock signal line is short-circuited to a power supply potential VDD in the disconnection and short detecting circuit of the thirteenth preferred embodiment.

The operation of this disconnection and short detecting circuit will next be descried by using the timing charts of FIGS. 45 to 49. The timing chart of FIG. 45 shows signal changes of respective parts during normal operation, during which neither disconnection nor short occurs on the signal lines of a non-inverting clock signal and an inverting clock signal. The timing chart of FIG. 46 shows signal changes of the respective parts when disconnection occurs on the signal line of the inverting clock signal. The timing chart of FIG. 47 shows signal changes of the respective parts when the non-inverting clock signal and the inverting clock signal are damped. The timing chart of FIG. 48 shows signal changes of the respective parts when short to a grounding potential VSS occurs on the signal line of the inverting clock signal. The timing chart of FIG. 49 shows signal changes of the respective parts when short to a power supply potential VDD occurs on the signal line of the inverting clock signal.

During normal operation, the non-inverting clock signal at the first clock input end PADI and the inverting clock signal at the second clock input end PADR, which are in opposite phases, repeat transition between states of Hi and Low. Thereby, signals YI and YR, which are in opposite phases, repeat transition between states of Hi and Low, as shown in FIG. 45. Signals YBI and YBR, which are in opposite phases, also repeat transition between states of Hi and Low.

Here, a signal [A] outputted from a two-input EXNOR circuit ER1 becomes Hi when both of the signals YI and YR are Low or Hi, and becomes Low in other instances. Like FIG. 24, FIG. 45 shows the case where there is a slight phase shift between the change of the signal YI and the change of the signal YR. Accordingly, when both of the signals YI and YR are Low or Hi, a brief pulse shape Hi appears in the signal [A], so that the signal [B] continues to output Hi, as in FIG. 24. As a result, the signal [B] does not become Low, and no reset is performed at the second D-flip-flop circuit F2a. Accordingly a signal [CD1] outputted from the second D-flip-flop circuit F2a is asserted to be Hi.

On the other hand, a signal [F] outputted from the two-input NOR circuit NR2 becomes Hi when the signal YBI is Low and the signal YBR is Hi, and becomes Low in other instances. In FIG. 45, since it is long that the signal YBI is Hi and the signal YBR is Low, a long pulse shape Low appears in the signal [F]. As a result, set is performed at the third and the fourth D-flip-flop circuits F3b and F4b. Accordingly the fourth D-flip-flop circuit F4b asserts a signal [CD2], and the signal [CD2] outputs Hi.

Upon receipt of the Hi of the signal [CD1] and the Hi of the signal [CD2], the two-input AND circuit AD5 asserts and outputs the signal [CD] as Hi. Since this signal [CD] continues to output Hi, neither disconnection nor short occurs on the signal line and it is judged to be normal.

On the other hand, if disconnection occurs on the signal line of an inverting clock signal, a signal, which changes in the same phase as a non-inverting clock signal, appears at the second clock input end PADR. Thereby, the same signal change as the signal YI appears in the signal YR, as shown in FIG. 46. Further, the same signal change as the signal YBI appears in the signal YBR.

Here, the signal [A] outputted from the two-input EXNOR circuit ER1 becomes Hi when both of the signals YI and YR are Low or Hi, and becomes Low in other instances. In FIG. 46, a longer pulse shape Hi than the case of FIG. 45 appears in the signal [A] when both of the signals YI and YR are Low or Hi. As a result, a signal [B] outputted from a two-input NAND circuit ND1 becomes Low, and reset is performed at the second D-flip-flop circuit F2a. Accordingly, upon receipt of a signal [D], the second D-flip-flop circuit F2a does not assert the output, and the signal [CD1] continues to output Low.

On the other hand, the signal [F] outputted from the two-input NOR circuit NR2 becomes Hi when the signal YBI is Low and the signal YBR is Hi, and becomes Low in other instances. In FIG. 46, it is short that the signal YBI is Low and the signal YBR is Hi, and therefore a long pulse shape Low appears in the signal [F]. As a result, set is performed at the third and the fourth D-flip-flop circuits F3b and F4b. Accordingly the fourth D-flip-flop circuit F4b asserts the signal [CD2], and the signal [CD2] outputs Hi.

Thus, as shown in FIG. 46, the two-input AND circuit AD5 receives the Low of the signal [CD1] and the Hi of the signal [CD2], and negates and outputs the signal [CD] as Low. Since this signal [CD] continues to output Low, disconnection or short occurs on the signal line and it is judged to be abnormal.

If both of a non-inverting clock signal and an inverting clock signal are damped, the signal YI and YR, which are in opposite phases, repeat transition between states of Hi and Low, as shown in FIG. 47. Whereas in the signals YBI and YBR, the amplitudes of a non-inverting clock signal and an inverting clock signal do not reach the level of Vref1 and the level of Vref2. It follows that Low appears in the signal YBI and Hi appears in the signal YBR.

In this case, the signals [A], [B] and [CD1] change similarly to the case of FIG. 45, whereas the signal [F] outputted from the two-input NOR circuit NR2 remains Hi. As a result, no set is performed at the third and the fourth D-flip-flop circuits F3b and F4b. Accordingly the fourth D-flip-flop circuit F4b does not assert the signal [CD2], and the signal [CD2] outputs Low.

Thus, as shown in FIG. 47, the two-input AND circuit AD5 receives the Hi of the signal [CD1] and the Low of the signal [CD2], and negates and outputs the signal [CD] as Low. Since this signal [CD] continues to output Low, signal damping occurs and it is judged to be abnormal.

If short to a grounding potential VSS occurs on the signal line of an inverting clock signal, Low corresponding to the grounding potential VSS appears at the second clock input end PADR. Thereby, Low appears in the signals YR and YBR, as shown in FIG. 48.

The signal [A] outputted from the two-input EXNOR circuit ER1 repeats transition between states of Hi and Low, because the signal YR is Low and the signal YI transits between states of Hi and Low. Thereby, a long pulse shape Low appears in the signal [B], so that reset is performed at the second D-flip-flop circuit F2a. Accordingly, upon receipt of a signal [D], the second D-flip-flop circuit F2a does not assert the output, and the signal [CD1] continues to output Low.

On the other hand, the signal [F] outputted from the two-input NOR circuit NR2 becomes Hi when the signal YBI is Low and the signal YBR is Hi, and becomes Low in other instances. In FIG. 48, since the signal YBR remains Low, the signal [F] remains Low. As a result, set is performed at the third and the fourth D-flip-flop circuits F3b and F4b. Accordingly the fourth D-flip-flop circuit F4b asserts the signal [CD2], and the signal [CD2] outputs Hi.

As shown in FIG. 48, the two-input AND circuit AD5 receives the Low of the signal [CD1] and the Hi of the signal [CD2], and negates and outputs the signal [CD] as Low. Since this signal [CD] continues to output Low, disconnection or short occurs on the signal line and it is judged to be abnormal.

If short to a power supply potential VDD occurs on the signal line of an inverting clock signal, Hi corresponding to the power supply potential VDD appears at the second clock input end PADR. Thereby, Hi appears in the signals YR and YBR, as shown in FIG. 49.

The signal [A] outputted from the two-input EXNOR circuit ER1 repeats transition between states of Hi and Low, because the signal YR is Hi and the signal YI transits between states of Hi and Low. Thereby, a long pulse shape Low appears in the signal [B], so that reset is performed at the second D-flip-flop circuit F2a. Accordingly, upon receipt of the signal [D], the second D-flip-flop circuit F2a does not assert the output, and the signal [CD 1] continues to output Low.

On the other hand, the signal [F] outputted from the two-input NOR circuit NR2 becomes Hi when the signal YBI is Low and the signal YBR is Hi, and becomes Low in other instances. In FIG. 49, since it is long that the signal YBI is Hi and the signal YBR is Low, a long pulse shape Low appears in the signal [F]. As a result, set is performed at the third and the fourth D-flip-flop circuits F3b and F4b. Accordingly the fourth D-flip-flop circuit F4b asserts the signal [CD2], and the signal [CD2] outputs Hi.

Thus, as shown in FIG. 49, on receipt of the Low of the signal [CD 1] and the Hi of the signal [CD2], the two-input AND circuit AD5 negates and outputs the signal [CD] as Low. Since this signal [CD] continues to output Low, disconnection or short occurs on the signal line and it is judged to be abnormal.

In the thirteenth preferred embodiment, the third and the fourth D-flip-flop circuits F3b and F4b, and the delay circuit D7 operate closely together to function as a second flip-flop circuit. The second flip-flop circuit has a clock input end for receiving a signal Y outputted from the first comparator C1, an input end to which applied is a voltage signal corresponding to a logical value Low (i.e., a grounding potential VSS), and an output end for outputting an output signal (i.e., the output end Q of the fourth D-flip-flop circuit F4b). The second flip-flop circuit has the function of outputting the voltage signal as a negated output signal [CD2] if a predetermined transition occurs in the signal received at the clock input end, and asserting the output signal [CD2] if received the asserted signal [F] (of Low level) from the above-mentioned second signal output circuit.

In accordance with the thirteenth preferred embodiment, if the amplitude of a non-inverting clock signal or an inverting clock signal is damped, the second flip-flop circuit negates the output signal [CD2], and the output of the two-input AND circuit AD5 is negated. It is therefore able to judge that the amplitudes of the non-inverting clock signal and the inverting clock signal are damped. This permits not only the detection of disconnection and short of the signal line of a differential clock signal, but also the detection of damping of the amplitudes of the non-inverting clock signal and the inverting clock signal.

The fourth D-flip-flop circuit F4b also outputs, as a negated output signal, the output of the third D-flip-flop circuit F3b if transition in a predetermined direction occurs in the signal Y. On receipt of the asserted signal [F] (of Low level), both of the third and the fourth D-flip-flop circuits F3b and F4b assert the output. Therefore, even if transition in a predetermined direction occurs temporarily in the signal Y after the fourth D-flip-flop circuit F4b receives the asserted signal [F] and asserts the output (brings into Hi level), the fourth D-flip-flop circuit F4b does not erroneously negate the output signal because the output [G] of the third D-flip-flop circuit F3b is asserted.

If transition in a predetermined direction occurs temporarily in the signal Y after the third and the fourth D-flip-flop circuits F3b and F4b receive the asserted signal [F] and assert the output, the output [G] of the third D-flip-flop circuit F3b is not immediately transmitted to the fourth D-flip-flop circuit F4b by the presence of the delay circuit D7. This enables to reliably prevent erroneous negation on the fourth D-flip-flop circuit F4b.

Additionally, the second signal output circuit includes an inverter IV8 for receiving the output of the fifth comparator C5, and a two-input NOR circuit NR2 as a logical gate circuit, which receives the output of the fourth comparator C4 and the output of the inverter IV8. Accordingly the second signal output circuit is able to assert the signal [F], in the cases other than that the logical value outputted from the fourth comparator C4 is Low and the logical value outputted from the fifth comparator C5 is Hi.

Fourteenth Preferred Embodiment

A fourteenth preferred embodiment is a modification of the disconnection and short detecting circuit of the thirteenth preferred embodiment. Specifically, like the thirteenth preferred embodiment, strength damping in a non-inverting clock signal and an inverting clock signal is also detectable by disposing a resistor R and a capacitance C, instead of the third and the fourth D-flip-flop circuits F3b and F4b, and the delay circuit D7 in the thirteenth preferred embodiment.

FIG. 50 is a diagram showing a disconnection and short detecting circuit in accordance with the fourteenth preferred embodiment. The device configuration of FIG. 50 is the same as that of FIG. 43, except that the resistor R, the capacitance C, a PMOS transistor P1, an NMOS transistor N1, and inverters IV9 and IV10 are disposed, instead of the third and the fourth D-flip-flop circuits F3b and F4b, and the delay circuit D7.

A signal [F] from the two-input NOR circuit NR2 is inputted to the inverter IV9. A power supply potential VDD is applied to the source of the PMOS transistor P1. One end of the resistor R is connected to the drain of the PMOS transistor P1. The other end of the resistor R is connected to the drain of the NMOS transistor N1. A grounding potential VSS is applied to the source of the NMOS transistor N1. The output of the inverter IV9 is applied in common to the gates of the PMOS transistor P1 and the NMOS transistor N1.

One end of the capacitance C is also connected to the drain of the NMOS transistor N1. The grounding potential VSS is applied to the other end of the capacitance C. Then, the potential at the one end of the capacitance C is inputted to the inverter IV10, and the output of the inverter IV10 is inputted, as a signal CD2, to the two-input AND circuit AD5.

Figure 51:
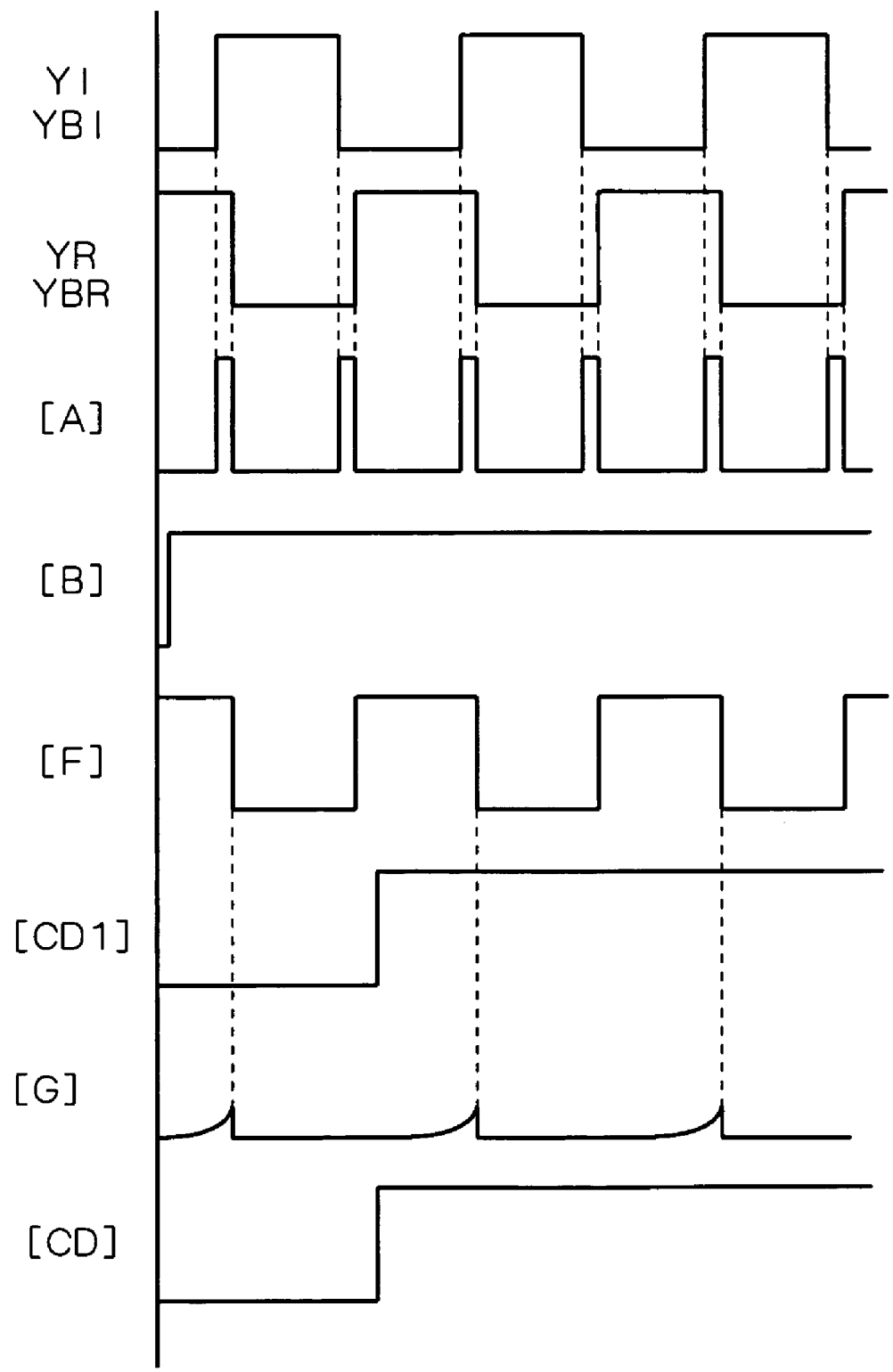
FIG. 51 is a timing chart showing changes in the signals of respective parts during normal operation in the disconnection and short detecting circuit of the fourteenth preferred embodiment.
Figure 52:
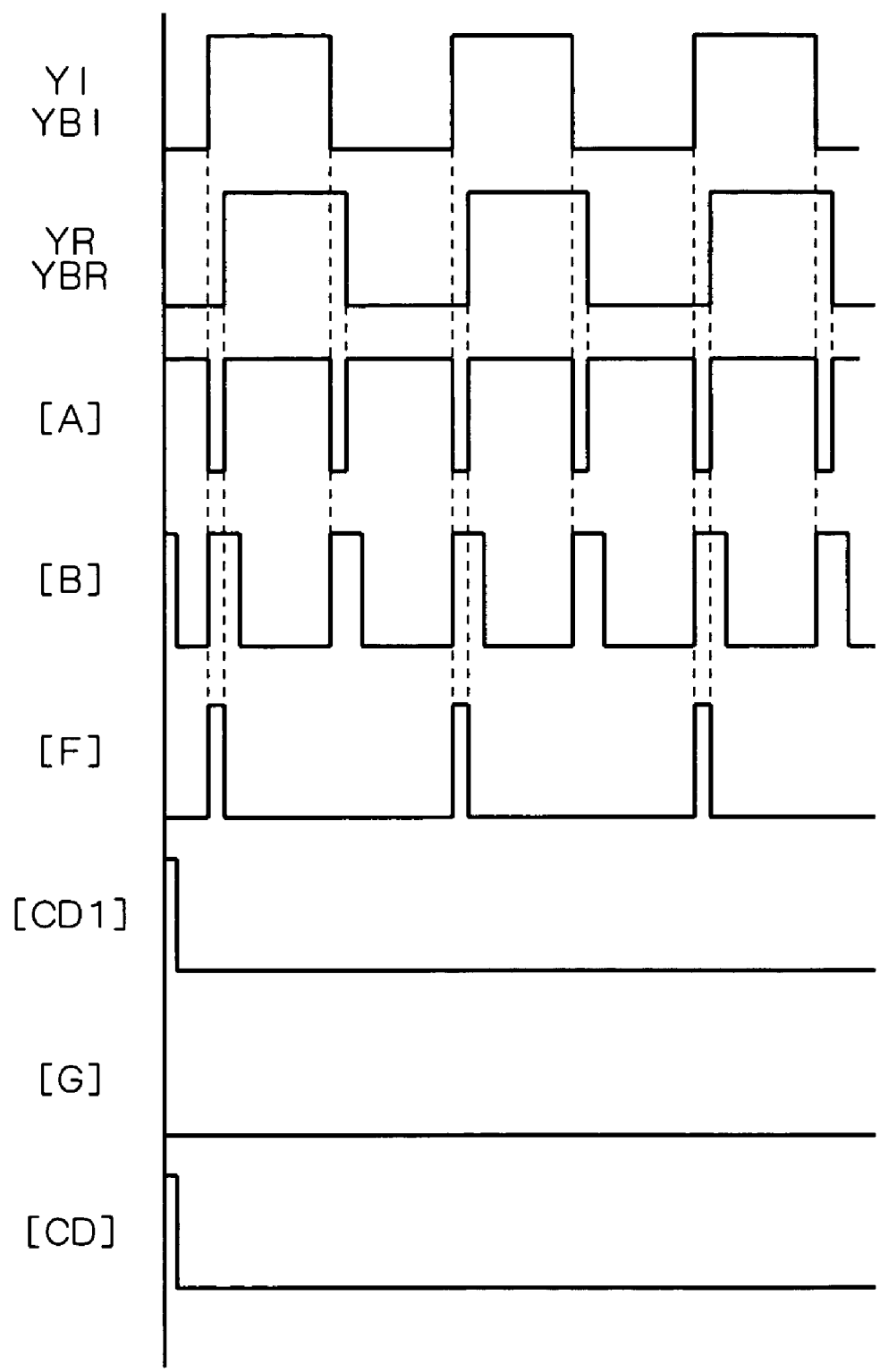
FIG. 52 is a timing chart showing changes in the signals of the respective parts when an inverting clock signal line is disconnected in the disconnection and short detecting circuit of the fourteenth preferred embodiment.
Figure 53:
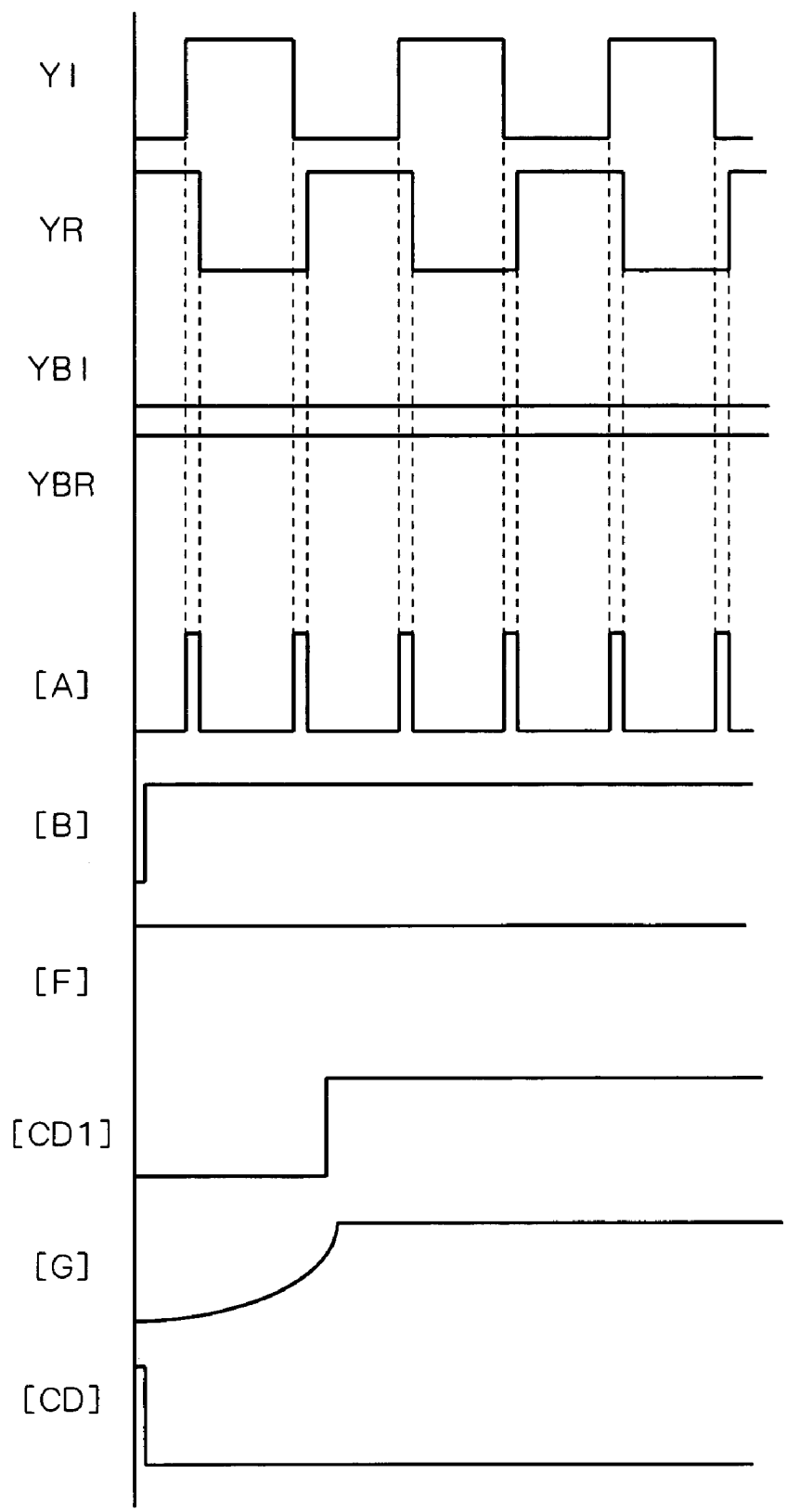
FIG. 53 is a timing chart showing changes in the signals of the respective parts when a non-inverting clock signal and an inverting clock signal are damped in the disconnection and short detecting circuit of the fourteenth preferred embodiment.
Figure 54:
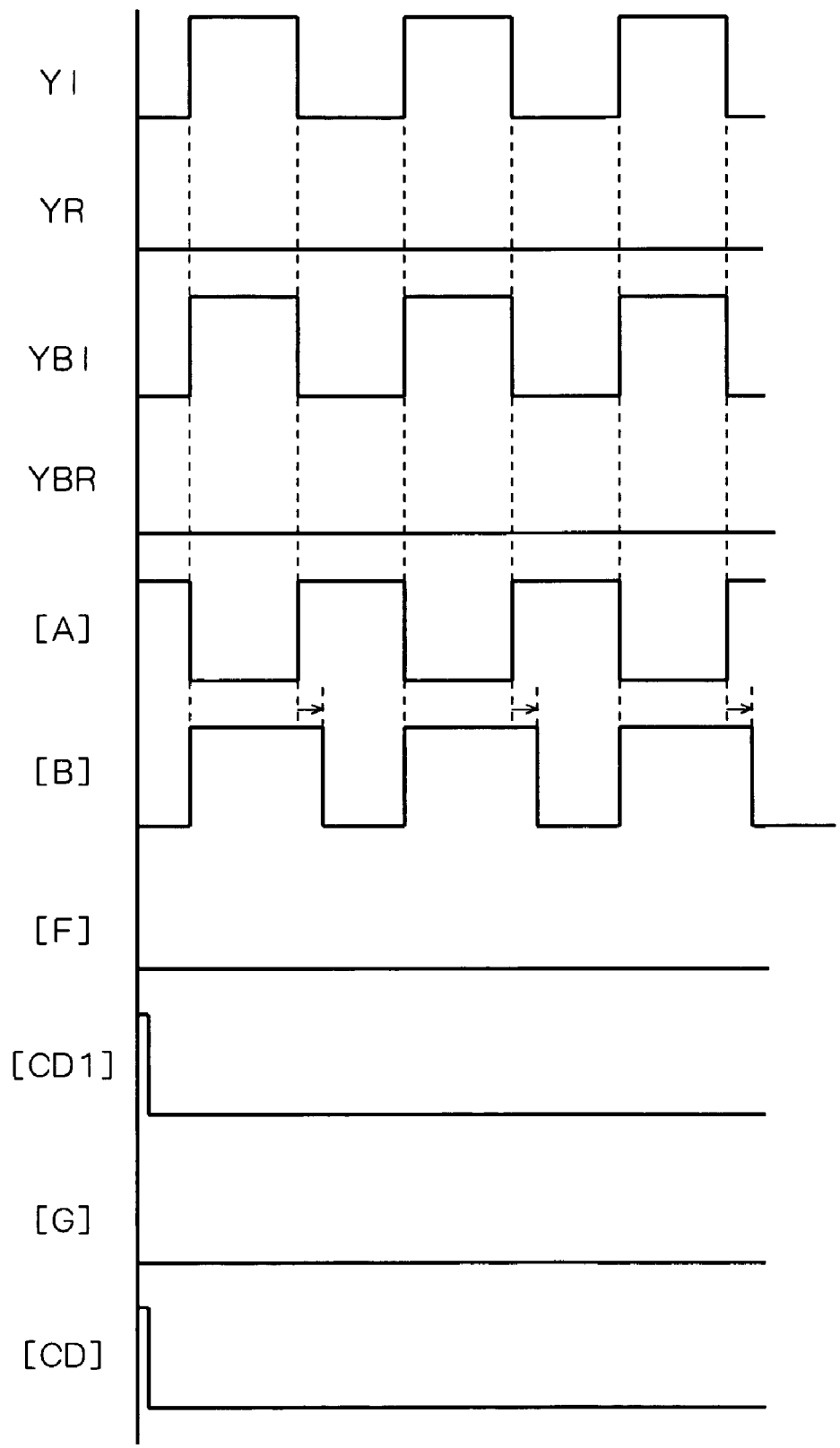
FIG. 54 is a timing chart showing changes in the signals of the respective parts when an inverting clock signal line is short-circuited to a grounding potential VSS in the disconnection and short detecting circuit of the fourteenth preferred embodiment.

The operation of this disconnection and short detecting circuit will next be descried by using the timing charts of FIGS. 51 to 54. The timing chart of FIG. 51 shows signal changes of respective parts during normal operation, during which neither disconnection nor short occurs on the signal lines of a non-inverting clock signal and an inverting clock signal. The timing chart of FIG. 52 shows signal changes of the respective parts when disconnection occurs on the signal line of the inverting clock signal. The timing chart of FIG. 53 shows signal changes of the respective parts when the non-inverting clock signal and the inverting clock signal are damped. The timing chart of FIG. 54 shows signal changes of the respective parts when short to a grounding potential VSS occurs on the signal line of the inverting clock signal.

During normal operation, the non-inverting clock signal at a first clock input end PADI and the inverting clock signal at a second clock input end PADR, which are in opposite phases, repeat transition between states of Hi and Low. Thereby, signals YI and YR, which are in opposite phases, repeat transition between states of Hi and Low, as shown in FIG. 51. Signals YBI and YBR, which are in opposite phases, also repeat transition between states of Hi and Low.

A signal [A] outputted from a two-input EXNOR circuit ER1 becomes Hi when both of the signals YI and YR are Low or Hi, and becomes Low in other instances. Like FIG. 24, FIG. 51 also shows the case where there is a slight phase shift between the change of the signal YI and the change of the signal YR. Accordingly, when both of the signals YI and YR are Low or Hi, a brief pulse shape Hi appears in the signal [A], so that a signal [B] continues to output Hi, as in FIG. 24. As a result, the signal [B] does not become Low, and no reset is performed at a second D-flip-flop circuit F2a.

Accordingly a signal [CD1] outputted from the second D-flip-flop circuit F2a is asserted to be Hi.

On the other hand, a signal [F] outputted from the two-input NOR circuit NR2 becomes Hi when the signal YBI is Low and the signal YBR is Hi, and becomes Low in other instances. In FIG. 51, since it is long that the signal YBI is Hi and the signal YBR is Low, a long pulse shape Low appears in the signal [F].

When the signal [F] becomes Hi, Low level is transmitted via the inverter IV9 to the gate of the PMOS transistor P1. Upon this, the PMOS transistor P1 is ON, and charge is accumulated in the capacitance C, so that a signal [G] at the one end of the capacitance C tends to rise.

However, the Hi level of the signal [F] is a pulse shape in FIG. 51. Therefore, when the level of the signal [F] returns to Low, the rise of the signal [G] is stopped. Since the inverter IV10 reverses and inputs the signal [G], as a signal CD2 of Hi level, to the two-input AND circuit AD5, the signal CD depends on the signal change of a signal CD1 from the second D-flip-flop circuit F2a. As shown in FIG. 51, upon receipt of the Hi of the signal [CD1] and the Hi of the signal [CD2], the two-input AND circuit AD5 asserts and outputs the signal [CD] as Hi. Since this signal [CD] continues to output Hi, neither disconnection nor short occurs on the signal line and it is judged to be normal.

On the other hand, if disconnection occurs on the signal line of an inverting clock signal, a signal, which changes in the same phase as a non-inverting clock signal, appears at the second clock input end PADR. Thereby, the same signal change as the signal YI appears in the signal YR, as shown in FIG. 52. Further, the same signal change as the signal YBI appears in the signal YBR.

Here, the signal [A] outputted from the two-input EXNOR circuit ER1 becomes Hi when both of the signals YI and YR are Low or Hi, and becomes Low in other instances. In FIG. 52, a longer pulse shape Hi than the case of FIG. 51 appears in the signal [A] when both of the signals YI and YR are Low or Hi. As a result, the signal [B] outputted from the two-input NAND circuit ND1 becomes Low, and reset is performed at the second D-flip-flop circuit F2a. Accordingly, upon receipt of a signal [D], the second D-flip-flop circuit F2a does not assert the output, and the signal [CD1] continues to output Low.

On the other hand, the signal [F] outputted from the two-input NOR circuit NR2 becomes Hi when the signal YBI is Low and a signal YBR is Hi, and becomes Low in other instances. In FIG. 52, it is short that the signal YBI is Low and the signal YBR is Hi, and therefore a brief pulse shape Hi appears in the signal [F].

Since the signal [F] is Low for almost all period, Hi level is transmitted via the inverter IV9 to the gate of the NMOS transistor N1. Thereby, the NMOS transistor N1 is ON, and the charge of the capacitance C is in its discharge state. Therefore, no rise occurs in the signal [G] at the one end of the capacitance C.

Since the inverter IV10 reverses and inputs the signal [G], as a signal CD2 of Hi level, to the two-input AND circuit AD5, the signal CD depends on the signal change of the signal CD1 from the second D-flip-flop circuit F2a. As a result, on receipt of the Low of the signal [CD1] and the Hi of the signal [CD2], the two-input AND circuit AD5 negates and outputs the signal [CD] as Low. Since this signal [CD] continues to output Low, disconnection or short occurs on the signal line and it is judged to be abnormal.

If both of a non-inverting clock signal and an inverting clock signal are damped, the signals YI and YR, which are in opposite phases, repeat transition between states of Hi and Low, as shown in FIG. 53. Whereas in the signals YBI and YBR, the amplitudes of the non-inverting clock signal and the inverting clock signal do not reach the level of Vref1 and the level of Vref2, so that Low appears in the signal YBI and Hi appears in the signal YBR.

In this case, the signals [A], [B] and [CD1] change similarly to the case of FIG. 51, whereas the signal [F] outputted from the two-input NOR circuit NR2 remains Hi. When the signal [F] becomes Hi, Low level is transmitted via the inverter IV9 to the gate of the PMOS transistor P1. Upon this, the PMOS transistor P1 is ON, and charge is accumulated in the capacitance C, so that a signal [G] at the one end of the capacitance C tends to rise.

Since the Hi level of the signal [F] is permanent in FIG. 53, the signal [G] continues to rise until a predetermined amount of charge is accumulated in the capacitance C. The inverter IV10 reverses and inputs the signal [G] that has ceased rising, as a signal CD2 of Low level, to the two-input AND circuit AD5. As a result, on receipt of the Low of the signal [CD1] and the Hi of the signal [CD2], the two-input AND circuit AD5 negates and outputs the signal [CD] as Low. Since this signal [CD] continues to output Low, damping occurs on the signal line and it is judged to be abnormal.

If short to a grounding potential VSS occurs on the signal line of an inverting clock signal, Low corresponding to the grounding potential VSS appears at the second clock input end PADR. Thereby, Low appears in the signals YR and YBR, as shown in FIG. 54.

The signal [A] outputted from the two-input EXNOR circuit ER1 repeats transition between states of Hi and Low, because the signal YR is Low and the signal YI transits between states Hi and Low. Thereby, a long pulse shape Low appears in the signal [B], so that reset is performed at the second D-flip-flop circuit F2a. Accordingly, upon receipt of a signal [D], the second D-flip-flop circuit F2a does not assert the output, and the signal [CD1] continues to output Low.

On the other hand, the signal [F] outputted from the two-input NOR circuit NR2 becomes Hi when the signal YBI is Low and the signal YBR is Hi, and becomes Low in other instances. In FIG. 54, since the signal YBR remains Low, the signal [F] remains Low.

Since the signal [F] is of Low level, Hi level is transmitted via the inverter IV9 to the gate of the NMOS transistor N1. Upon this, the NMOS transistor N1 is ON, and the charge of the capacitance C is in its discharge state. Thus, no rise appears in the signal [G] at the one end of the capacitance C.

Since the inverter IV10 reverses and inputs the signal [G], as a signal CD2 of Hi level, to the two-input AND circuit AD5, the signal CD depends on the signal change of the signal CD1 from the second D-flip-flop circuit F2a. Thus, on receipt of the Low of the signal [CD1] and the Hi of the signal [CD2], the two-input AND circuit AD5 negates and outputs the signal [CD] as Low. Since this signal [CD] continues to output Low, disconnection or short occurs on the signal line and it is judged to be abnormal.

In accordance with the disconnection and short detecting circuit of the fourteenth preferred embodiment, in the cases other than that the logical value outputted from the fourth comparator C4 is Low and the logical value outputted from the fifth comparator C5 is Hi, the two-input NOR circuit NR1 asserts a signal [F], and the asserted signal [F] is transmitted via the inverter IV9 to the PMOS transistor P1. Upon this, the PMOS transistor P1 is ON, so that charge is accumulated via the resistor R in the capacitance C. If the amplitudes of a non-inverting clock signal and an inverting signal are damped, charge is accumulated in the capacitance C, so that the output of the two-input AND circuit AD5 is negated. It is therefore able to judge that the amplitudes of the non-inverting clock signal and the inverting clock signal are damped. This enables not only the detection of disconnection and short of the signal line of a differential clock signal, but also the detection of damping in the amplitude of the non-inverting clock signal or the inverting clock signal.

While the invention has been shown and described in detail, the foregoing description is in all aspects illustrative and not restrictive. It is therefore understood that numerous modifications and variations can be devised without departing from the scope of the invention.

What is claimed is:

1. A disconnection and short detecting circuit comprising:
    a first clock input end to which a non-inverting clock signal is inputted;
    a second clock input end to which inputted is an inverting clock signal, the phase of which is the reverse of that of said non-inverting clock;
    a first terminating resistor having one end connected to said first clock input end, and the other end to which a first potential is applied;
    a second terminating resistor having one end connected to said second clock input end, and the other end to which said first potential is applied;
    a first comparator having a first signal input end connected to said first clock input end, and a second signal input end connected to said second clock input end, and comparing potentials at said first and said second signal input ends and, based on the comparison result, outputting a first logical value or a second logical value different from said first logical value;
    a second comparator having a first signal input end connected to said first clock input end, and a second signal input end to which a second potential is applied, and comparing potentials at said first and said second signal input ends and, based on the comparison result, outputting said first or said second logical value;
    a third comparator having a first signal input end connected to said second clock input end, and a second signal input end to which a third potential is applied, and comparing potentials at said first and said second signal input ends and, based on the comparison result, outputting said first or said second logical value;
    a first signal output circuit for outputting a first signal if logical values outputted from said second and said third comparators are equal for a predetermined period of time or more; and
    a first flip-flop circuit having a clock input end for receiving an output of said first comparator, an input end to which applied is a voltage signal corresponding to said first or said second logical value, another input end for receiving said first signal, and an output end for outputting an output signal, said first flip-flop circuit outputting, as said output signal, a signal corresponding to said voltage signal if transition in a predetermined direction occurs in an output of said first comparator received at said clock input end, and negating said output signal if received said first signal.

2. The disconnection and short detecting circuit according to claim 1 wherein
    said first signal output circuit includes, as a logical gate circuit, at least one of a two-input NOR circuit, a two-input AND circuit and a two-input EXNOR circuit, each of which receives outputs of said second and said third comparators.

3. The disconnection and short detecting circuit according to claim 2 wherein
    said first signal output circuit further includes a delay circuit for receiving and outputting an output of said logical gate circuit with delay for said predetermined period of time, and a two-input NAND circuit for receiving an output of said delay circuit and an output of said logical gate circuit.

4. The disconnection and short detecting circuit according to claim 3 wherein
    said delay circuit includes a plurality of delay stages, and
    said first signal output circuit further includes a selector circuit that can select and output, as an output of said delay circuit, one of respective outputs of said plurality of delay stages to said two-input NAND circuit.

5. The disconnection and short detecting circuit according to claim 3, further comprising:
    a phase locked loop (PLL) circuit having an oscillator for generating and outputting a signal synchronized with the cycle of an output of said first comparator by applying a delay control signal to said oscillator, wherein
    said delay circuit includes at least one variable delay stage capable of changing the delay amount, and
    the delay amount at said variable delay stage is controlled by said delay control signal generated on said PLL circuit.

6. The disconnection and short detecting circuit according to claim 1 wherein
    said first flip-flop circuit includes first and second D-flip-flop circuits and a delay circuit,
    said voltage signal is inputted to said first D-flip-flop circuit, and said first D-flip-flop circuit outputs said voltage signal if transition in said predetermined direction occurs in an output of said first comparator received at said clock input end,
    an output of said first D-flip-flop circuit is delayed via said delay circuit and inputted to said second D-flip-flop circuit, and said second D-flip-flop circuit outputs, as said output signal, a signal corresponding to an output of said first D-flip-flop circuit if transition in said predetermined direction occurs in an output of said first comparator received at said clock input end, and
    if received said first signal, said first and said second D-flip-flop circuits negate their outputs.

7. The disconnection and short detecting circuit according to claim 1 wherein
    said first flip-flop circuit includes first and second D-flip-flop circuits and delay circuit,
    said voltage signal is inputted to said first D-flip-flop circuit, and said first D-flip-flop circuit outputs said voltage signal if transition in said predetermined direction occurs in an output of said first comparator received at said clock input end,
    an output of said first D-flip-flop circuit is inputted to said second D-flip-flop circuit, and said second D-flip-flop circuit outputs, as said output signal, a signal corresponding to an output of said first D-flip-flop circuit if transition, the direction of which is the reverse of that of said predetermined direction, occurs in an output of said first comparator received at said clock input end, and
    if received said first signal, said first and said second D-flip-flop circuits negate their outputs.

8. The disconnection and short detecting circuit according to claim 1 wherein
said first flip-flop circuit includes a D-flip-flop circuit and a plurality of latch circuits,
said voltage signal is inputted to said D-flip-flop circuit, and said D-flip-flop circuit outputs, as said output signal, a signal corresponding to said voltage signal if transition in said predetermined direction occurs in an output of said first comparator received at said clock input end,
an output of said first comparator and said first signal are inputted to said plurality of latch circuits, respectively, and
said D-flip-flop circuit negates the output of said output signal if one of said plurality of latch circuits outputs an activated signal.

9. The disconnection and short detecting circuit according to claim 1 wherein
the value of said first potential is different from the values of said second and said third potentials.

10. The disconnection and short detecting circuit according to claim 1, further comprising:
an initial rest circuit for applying said first signal to said first flip-flop circuit even if said first signal output circuit does not output said first signal at the time of turning on power and in the vicinity thereof.

11. The disconnection and short detecting circuit according to claim 10 wherein
said initial reset circuit comprises a resistor, a capacitor and a two-input AND circuit,
a fourth potential is applied to one end of said resistor,
the other end of said resistor is connected to one end of said capacitance,
a fifth potential is applied to the other end of said capacitance, and
said first signal is applied to one input end of said two-input AND circuit, said one end of said capacitance is connected to the other input end of said two-input AND circuit, and an output of said two-input AND circuit, instead of said first signal, is applied to said first flip-flop circuit.

12. The disconnection and short detecting circuit according to claim 1, further comprising:
a fourth comparator having a first signal input end connected to said first clock input end, and a second signal input end to which a sixth potential is applied, and comparing potentials at said first and said second signal input ends and, based on the comparison result, outputting said first or said second logical value;
a fifth comparator having a first signal input end connected to said second clock input end, and a second signal input end to which a seventh potential is applied, and comparing potentials at said first and said second signal input ends and, based on the comparison result, outputting said first or said second logical value;
a second signal output circuit for outputting a second signal, in the cases other than that a logical value outputted from said fourth comparator is said second logical value and a logical value outputted from said fifth comparator is said first logical value;
a second flip-flop circuit having a clock input end for receiving said first or said second logical value outputted from said first comparator, an input end to which applied is a voltage signal corresponding to said first or said second logical value, another input end for receiving said second signal, and an output end for outputting an output signal, said second flip-flop circuit outputting said voltage signal, as said output signal, if transition in a predetermined direction occurs in an output of said first comparator received at said clock input end, and activating said output signal if received said second signal; and
a two-input AND circuit having an input end to which outputs from said first and said second flip-flop circuits are applied.

13. The disconnection and short detecting circuit according to claim 12 wherein
said second flip-flop circuit includes third and fourth D-flip-flop circuits and a delay circuit,
said voltage signal is inputted to said third D-flip-flop circuit, and said third D-flip-flop circuit outputs said voltage signal if transition in said predetermined direction occurs in an output of said first comparator received at said clock input end,
an output of said third D-flip-flop circuit is delayed via said delay circuit and inputted to said fourth D-flip-flop circuit, and said fourth D-flip-flop circuit outputs, as said output signal, an output of said third D-flip-flop circuit if transition in said predetermined direction occurs in an output of said first comparator received at said clock input end, and
if received said second signal, said third and said fourth D-flip-flop circuits activate their outputs.

14. The disconnection and short detecting circuit according to claim 12 wherein
said second signal output circuit includes a third inverter for receiving an output of said fifth comparator, and a two-input NOR circuit, as a logical gate circuit, for receiving an output of said fourth comparator and an output of said third inverter.

15. The disconnection and short detecting circuit according to claim 1, further comprising:
a fourth comparator having a first signal input end connected to said first clock input end, and a second signal input end to which a sixth potential is applied, and comparing potentials at said first and said second signal input ends and, based on the comparison result, outputting said first or said second logical value;
a fifth comparator having a first signal input end connected to said second clock input end, and a second signal input end to which a seventh potential is applied, and comparing potentials at said first and said second signal input ends and, based on the comparison result, outputting said first or said second logical value;
a second signal output circuit for outputting a second signal in the cases other than that a logical value outputted from said fourth comparator is said second logical value and a logical value outputted from said fifth comparator is said first logical value;
a first inverter for inverting said second signal;
a first transistor having a first current electrode to which an eighth potential is applied, a control electrode to which an output of said first inverter is applied, and a second current electrode;
a resistor having one end connected to said second current electrode of said first transistor, and the other end;
a second transistor having a first current electrode to which a ninth potential is applied, a control electrode to which an output of said first inverter is applied, and a second current electrode connected to said the other end of said resistor;
a capacitance having one end connected to said second current electrode of said second transistor, and the other end to which a tenth potential is applied;

a second inverter to which a potential at said one end of said capacitance is inputted; and a two-input AND circuit having an input end to which an output from said first flip-flop circuit and an output from said second inverter are applied.

16. The disconnection and short detecting circuit according to claim 15 wherein said second signal output circuit includes a third inverter for receiving an output of said fifth comparator, and a two-input NOR circuit, as a logical gate circuit, for receiving an output of said fourth comparator and an output of said third inverter.

* * * * *